United States Patent
Hayashi et al.

(10) Patent No.: US 12,421,426 B2
(45) Date of Patent: *Sep. 23, 2025

(54) COMPOSITION, THERMALLY CONDUCTIVE SHEET, AND DEVICE WITH THERMALLY CONDUCTIVE LAYER

(71) Applicant: FUJIFILM Corporation, Tokyo (JP)

(72) Inventors: Daisuke Hayashi, Ashigarakami-gun (JP); Seiichi Hitomi, Ashigarakami-gun (JP); Teruki Niori, Ashigarakami-gun (JP); Keita Takahashi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 907 days.

This patent is subject to a terminal disclaimer.

(21) Appl. No.: 17/344,176

(22) Filed: Jun. 10, 2021

(65) Prior Publication Data

US 2021/0301180 A1 Sep. 30, 2021

Related U.S. Application Data

(63) Continuation of application No. PCT/JP2020/001179, filed on Jan. 16, 2020.

(30) Foreign Application Priority Data

Jan. 23, 2019 (JP) .................. 2019-009645
Dec. 13, 2019 (JP) .................. 2019-225551

(51) Int. Cl.
| | | |
|---|---|---|
| C01B 21/064 | (2006.01) | |
| C08K 9/04 | (2006.01) | |
| C09C 3/06 | (2006.01) | |
| C09C 3/08 | (2006.01) | |
| C09J 7/25 | (2018.01) | |
| C09J 7/38 | (2018.01) | |
| C09J 11/04 | (2006.01) | |
| C09K 5/14 | (2006.01) | |
| H01L 23/373 | (2006.01) | |
| C08K 3/38 | (2006.01) | |

(52) U.S. Cl.
CPC .................. C09J 7/25 (2018.01); C08K 9/04 (2013.01); C09C 3/08 (2013.01); C09J 7/38 (2018.01); C09J 11/04 (2013.01); C09K 5/14 (2013.01); H01L 23/3737 (2013.01); C01P 2006/32 (2013.01); C08K 2003/385 (2013.01); C08K 2201/001 (2013.01); C09J 2203/326 (2013.01); C09J 2301/124 (2020.08); C09J 2301/314 (2020.08); C09J 2301/41 (2020.08); C09J 2463/006 (2013.01)

(58) Field of Classification Search
None
See application file for complete search history.

(56) References Cited

U.S. PATENT DOCUMENTS

| | | |
|---|---|---|
| 4,855,427 A | 8/1989 | Peter et al. |
| 12,030,774 B2 | 7/2024 | Hitomi et al. |
| 2004/0000712 A1 | 1/2004 | Wilson et al. |
| 2006/0275608 A1 | 12/2006 | Tonapi et al. |
| 2010/0288968 A1 | 11/2010 | Lin et al. |
| 2010/0292508 A1 | 11/2010 | Rajendran |
| 2013/0266812 A1 | 10/2013 | Zeng et al. |
| 2014/0015000 A1 | 1/2014 | Nishiyama et al. |
| 2014/0187715 A1 | 7/2014 | Hiwatari et al. |
| 2015/0183923 A1 | 7/2015 | Potisek et al. |
| 2015/0323867 A1* | 11/2015 | Iwashita ............... H05K 3/287 430/280.1 |
| 2016/0122604 A1 | 5/2016 | Yoshimoto et al. |
| 2017/0190885 A1 | 7/2017 | Dadvand et al. |
| 2017/0247546 A1 | 8/2017 | Takahashi |
| 2018/0134926 A1 | 5/2018 | Lei et al. |
| 2019/0085229 A1 | 3/2019 | Takahashi |
| 2020/0090831 A1 | 3/2020 | Sugimoto et al. |
| 2020/0180957 A1 | 6/2020 | Hitomi et al. |
| 2021/0355364 A1 | 11/2021 | Hayashi et al. |

(Continued)

FOREIGN PATENT DOCUMENTS

| | | |
|---|---|---|
| CN | 102421841 A | 4/2012 |
| CN | 102633990 A | 8/2012 |
| CN | 102634164 A | 8/2012 |

(Continued)

OTHER PUBLICATIONS

International Search Report dated Mar. 24, 2020 in International Application No. PCT/JP2020/001179.

(Continued)

*Primary Examiner* — Yun Qian
(74) *Attorney, Agent, or Firm* — Sughrue Mion, PLLC

(57) ABSTRACT

A composition contains an inorganic nitride, and a compound represented by General Formula (1).

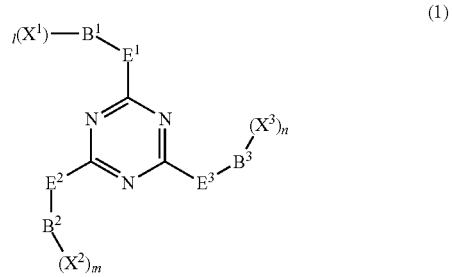

(1)

12 Claims, No Drawings

(56) References Cited

U.S. PATENT DOCUMENTS

2021/0403786 A1   12/2021   Hayashi et al.

FOREIGN PATENT DOCUMENTS

| | | | |
|---|---|---|---|
| CN | 104559067 | A | 4/2015 |
| CN | 109153567 | A | 1/2019 |
| EP | 2 832 792 | A1 | 2/2015 |
| JP | 64-33116 | A | 2/1989 |
| JP | 2004-156001 | A | 6/2004 |
| JP | 2005-531667 | A | 10/2005 |
| JP | 2008-545869 | A | 12/2008 |
| JP | 2009-221039 | A | 10/2009 |
| JP | 2011-236376 | A | 11/2011 |
| JP | 2014-94937 | A | 5/2014 |
| JP | 2014-177581 | A | 9/2014 |
| JP | 2015-007214 | A | 1/2015 |
| JP | 2015-218192 | A | 12/2015 |
| JP | 2015-535308 | A | 12/2015 |
| JP | 2017-128637 | A | 7/2017 |
| JP | 2019-196433 | A | 11/2019 |
| KR | 20020036933 | A | 5/2002 |
| TW | 201641635 | A | 12/2016 |
| TW | 201901885 | A | 1/2019 |
| WO | 2015/002071 | A1 | 1/2015 |
| WO | 2016/010067 | A1 | 1/2016 |
| WO | 2016/084873 | A1 | 6/2016 |
| WO | 2016/104136 | A1 | 6/2016 |
| WO | 2019/013261 | A1 | 1/2019 |
| WO | 2019/240079 | A1 | 12/2019 |
| WO | 2020/070252 | A1 | 4/2020 |
| WO | 2020/195496 | A1 | 10/2020 |

OTHER PUBLICATIONS

International Preliminary Report on Patentability issued Jul. 27, 2021 in International Application No. PCT/JP2020/001179.
Written Opinion of the International Searching Authority issued Mar. 24, 2020 in International Application No. PCT/JP2020/001179.
Extended European Search Report dated Feb. 17, 2022 in European Application No. 20744515.6.
Hong Jun Ahn et al., "Effects of amphiphilic agent on thermal conductivity of boron nitride/poly(vinyl butyral) composites", Thermochimica Acta, Jul. 2014, vol. 591, pp. 96-100 (5 pages total).
Office Action dated Mar. 20, 2023 from the Taiwanese Patent Office in Application No. 109102199.
Office Action issued Jan. 4, 2023 in Korean Application No. 10-2021-7017907.
Office Action Dated Apr. 12, 2022 issued by the Japanese Patent Office in Japanese Application No. 2020-568089.
Taiwanese Office Action issued Dec. 26, 2023 in Application No. 109102199.
Chinese Office Action and Search Report issued Jan. 6, 2024 in Application No. 202080007122.7.
Office Action issued Jun. 12, 2024 in U.S. Appl. No. 17/385,092.
Taiwanese Office Action dated Mar. 31, 2023 in Taiwanese Application No. 108148435.
Extended European Search Report issued Jan. 18, 2022 in European Application No. 19912415.7.
CVC Thermoset Specialties: "ERISYS GE-60 datasheet", 2017, http://www.cvc.emeraldmaterials.com/cms/cvc/fis_ftp.downloadPublicDoc?p_filename=GE60_TDS_ENG.pdf&p_doc_type=TDS (2 pages total).
BASF, "Tinuvin® 479", Technical Information, Feb. 2011, pp. 1-3 (3 pages total).
Office Action issued Jul. 5, 2022 in Japanese Application No. 2020-569449.
Notification of Reasons for Refusal dated Feb. 6, 2023 from the Chinese Patent Office in Application No. 201980090123.X.
International Search Report dated Mar. 17, 2020 in International Application No. PCT/JP2019/050619.
International Preliminary Report on Patentability dated Jul. 27, 2021 in International Application No. PCT/JP2019/050619.
Written Opinion of the International Searching Authority dated Mar. 17, 2020 in International Application No. PCT/JP2019/050619.
Office Action issued Oct. 26, 2023 in U.S. Appl. No. 16/740,786.
Office Action issued Sep. 26, 2022 in Chinese Application No. 201880043394.5.
International Search Report dated Oct. 16, 2018 from the International Searching Authority in International Application No. PCT/JP2018/026217.
Written Opinion dated Oct. 16, 2018 from the International Bureau in International Application No. PCT/JP2018/026217.
International Preliminary Report on Patentability dated Jan. 14, 2020 from the International Bureau in International Application No. PCT/JP2018/026217.
Communication dated May 18, 2020, from the European Patent Office in application No. 18831151.8.
Office Action issued Sep. 21, 2024 in Chinese Patent Application No. 202080007122.7.
Final Office Action issued Nov. 7, 2024 in U.S. Appl. No. 17/385,092.
Office Action issued Mar. 7, 2025 in European Application No. 20 744 515.6.
Notice of Allowance issued Mar. 19, 2025, in U.S. Appl. No. 17/385,092.
Notice of Allowance issued Mar. 12, 2024 in U.S. Appl. No. 16/740,786.

* cited by examiner

COMPOSITION, THERMALLY CONDUCTIVE SHEET, AND DEVICE WITH THERMALLY CONDUCTIVE LAYER

CROSS-REFERENCE TO RELATED APPLICATIONS

This application is a Continuation of PCT International Application No. PCT/JP2020/001179 filed on Jan. 16, 2020, which claims priority under 35 U.S.C § 119(a) to Japanese Patent Application No. 2019-009645 filed on Jan. 23, 2019, Japanese Patent Application No. 2019-225551 filed on Dec. 13, 2019. Each of the above application(s) is hereby expressly incorporated by reference, in its entirety, into the present application.

BACKGROUND OF THE INVENTION

1. Field of the Invention

The present invention relates to a composition, a thermally conductive sheet, and a device with a thermally conductive layer.

2. Description of the Related Art

In recent years, a power semiconductor device used in various electrical machines such as a personal computer, a general household electric appliance, and an automobile has been rapidly miniaturized. With the miniaturization, it is difficult to control heat generated from the power semiconductor device having a high density.

In order to deal with such a problem, a thermally conductive material, which promotes heat dissipation from the power semiconductor device, is used.

For example, WO2016/084873A discloses a "surface-modified inorganic substance in which an inorganic nitride or an inorganic oxide is surface-modified with a boronic acid compound ([claim 1])".

SUMMARY OF THE INVENTION

As a result of an examination of a thermally conductive material containing the surface-modified inorganic substance described in WO2016/084873A, the present inventors have found that there is room for improvement in thermally conductive properties.

Therefore, an object of the present invention is to provide a composition from which a thermally conductive material having excellent thermally conductive properties can be obtained.

Moreover, another object of the present invention is to provide a thermally conductive sheet formed of the composition, and a device with a thermally conductive layer.

As a result of a thorough examination conducted to achieve the objects, the present inventors have found that the objects can be achieved by the following configuration.

[1]
A composition comprising:
an inorganic nitride, and
a compound represented by General Formula (1).

[2]
The composition as described in [1], in which Q and $Y^1$ in General Formula (2) each independently represent a group selected from the group consisting of an aldehyde group, a boronic acid group, a hydroxyl group, and a monovalent group having an epoxy group.

[3]
The composition as described in [1] or [2], in which $E^1$ to $E^3$ in General Formula (1) each represent —NH—.

[4]
The composition as described in any one of [1] to [3], further comprising an epoxy compound.

[5]
The composition as described in [4], in which an epoxy group content of the epoxy compound is 4.0 mmol/g or greater.

[6]
The composition as described in any one of [1] to [5], further comprising a phenolic compound.

[7]
The composition as described in [6], in which a hydroxyl group content of the phenolic compound is 8.0 mmol/g or greater.

[8]
The composition as described in any one of [1] to [7], further comprising a curing accelerator.

[9]
The composition as described in any one of [1] to [8], in which the inorganic nitride is boron nitride.

[10]
The composition as described in any one of [1] to [9],
in which the composition further comprises other inorganic substances other than the inorganic nitride, and a total content of the inorganic nitride and the other inorganic substances is 70% to 85% by mass with respect to a total solid content of the composition, or
the composition does not comprise the other inorganic substances, and a content of the inorganic nitride is 70% to 85% by mass with respect to the total solid content of the composition.

[11]
The composition as described in any one of [1] to [10], in which the composition is a composition for forming a thermally conductive material.

[12]
A thermally conductive sheet which is formed by curing the composition as described in any one of [1] to [11].

[13]
A thermally conductive multilayer sheet comprising:
the thermally conductive sheet as described in [12]; and
an adhesive layer or a pressure sensitive adhesive layer which is provided on one surface or both surfaces of the thermally conductive sheet.

[14]
A device with a thermally conductive layer comprising:
a device; and
a thermally conductive layer which is disposed on the device and includes the thermally conductive sheet as described in [12] or the thermally conductive multilayer sheet as described in [13].

According to the present invention, it is possible to provide a composition from which a thermally conductive material having excellent thermally conductive properties can be obtained.

Moreover, according to the present invention, it is possible to provide a thermally conductive sheet formed of the composition, and a device with a thermally conductive layer.

DESCRIPTION OF THE PREFERRED EMBODIMENTS

Hereinafter, a composition, a thermally conductive sheet, and a device with a thermally conductive layer according to an embodiment of the present invention will be described in detail.

The following constituent elements are described based on the representative embodiments of the present invention in some cases, but the present invention is not limited to such an embodiment.

Moreover, in the present specification, the numerical range expressed using "to" means a range including the numerical values listed before and after "to" as a lower limit value and an upper limit value.

Furthermore, in the present specification, an epoxy group is a functional group which is also referred to as an oxiranyl group, and for example, a group, in which two adjacent carbon atoms of a saturated hydrocarbon ring group are bonded to each other through an oxo group (—O—) to form an oxirane ring, and the like are also included in the epoxy group. The epoxy group may or may not have a substituent (a methyl group or the like), if possible.

Furthermore, in the present specification, the description of "(meth)acryloyl group" means "either or both of an acryloyl group and a methacryloyl group". Moreover, the description of "(meth)acrylamide group" means "either or both of an acrylamide group and a methacrylamide group".

In the present specification, an acid anhydride group may be a monovalent group or a divalent group, unless otherwise specified. In a case where the acid anhydride group represents a monovalent group, examples of the monovalent group include a substituent obtained by removing any hydrogen atom from an acid anhydride such as maleic acid anhydride, phthalic acid anhydride, pyromellitic acid anhydride, and trimellitic acid anhydride. Moreover, in a case where the acid anhydride group represents a divalent group, the divalent group means a group represented by *—CO—O—CO—* (* represents a bonding position).

In addition, in the present specification, a substituent or the like, which is not specified whether to be substituted or unsubstituted, may have an additional substituent (for example, a substituent group Y which will be described later), if possible, as long as the desired effect is not impaired. For example, the notation of an "alkyl group" means a substituted or unsubstituted alkyl group as long as the desired effect is not impaired.

Moreover, in the present specification, an expression such as "may" means that conditions for "may" may or may not be satisfied. For example, the expression "may have a substituent" also includes "may not have a substituent".

Furthermore, in the present specification, in a case where the description of "may have a substituent" appears, the kind of a substituent, the position of a substituent, and the number of substituents are not particularly limited. Examples of the number of substituents include 1 and 2 or more. Examples of the substituent include a group of monovalent nonmetallic atoms excluding a hydrogen atom, and the substituent can be selected from the following substituent group Y, for example.

In the present specification, examples of a halogen atom include a chlorine atom, a fluorine atom, a bromine atom, and an iodine atom.

Substituent Group Y:

a halogen atom (—F, —Br, —Cl, —I, or the like), a hydroxyl group, an amino group, a carboxylic acid group and a conjugated base group thereof, a carboxylic acid anhydride group, a cyanate ester group, an unsaturated polymerizable group, an epoxy group, an oxetanyl group, an aziridinyl group, a thiol group, an isocyanate group, an thioisocyanate group, an aldehyde group, an alkoxy group, an aryloxy group, an alkylthio group, an arylthio group, an alkyldithio group, an aryldithio group, an N-alkylamino group, an N,N-dialkylamino group, an N-arylamino group, an N,N-diarylamino group, an N-alkyl-N-arylamino group, an acyloxy group, a carbamoloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-aryl-N-alkylureido group, an N',N'-dialkyl-N-alkylureido group, an N',N'-diaryl-N-alkylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsufinyl group, an arylsulfinyl group, an alkylsulfonyl group, an arylsulfonyl group, a sulfo group (—SO$_3$H) and a conjugated base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugated base group thereof, an N-alkylsulfonylsulfamoyl group (—SO$_2$NHSO$_2$(alkyl)) and a conjugated base group thereof, an N-arylsulfonylsulfamoyl group (—SO$_2$NHSO$_2$(aryl)) and a conjugated base group thereof, an N-allylsulfonylcarbamoyl group (—CONHSO$_2$(allyl)) and a conjugated base group thereof, an N-arylsulfonylcarbamoyl group (—CONHSO$_2$(aryl)) and a conjugated base group thereof, an alkoxysilyl group (—Si(Oalkyl)$_3$), an aryloxysilyl group (—Si(Oaryl)$_3$), a hydroxysilyl group (—Si(OH)$_3$) and a conjugated base group thereof, a phosphono group (—PO$_3$H$_2$) and a conjugated base group thereof, a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugated base group thereof, a monoarylphosphono group (—PO$_3$H(aryl)) and a conjugated base group thereof, a phosphonooxy group (—OPO$_3$H$_2$) and a conjugated base group thereof, a dialkylphosphonooxy group (—OPO$_3$(alkyl)), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and a conjugated base group thereof, a monoarylphosphonooxy group (—OPO$_3$H(aryl)) and a conjugated base group thereof, a cyano group, a nitro group, an aryl group, an alkenyl group, an alkynyl group, and an alkyl group.

Moreover, these substituents may or may not form a ring by being bonded to each other, if possible, or by being bonded to a group substituted with the substituent.

[Composition]

The composition according to the embodiment of the present invention contains an inorganic nitride, and a compound (hereinafter, also simply referred to as a specific compound) represented by General Formula (1).

The mechanism by which the objects of the present invention are achieved with the composition according to the embodiment of the present invention, which adopts the constitution described above, is not always clear, but the present inventors estimate as follows.

That is, the specific compound has a structure in which a triazine ring group is bonded to three aromatic ring groups via a single bond or a specific linking group. Such a specific compound has high leveling, strongly interacts with the inorganic nitride, and thus can be adsorbed on the surface of the inorganic nitride. Accordingly, the specific compound modifies the surface of the inorganic nitride to improve the dispersibility of the inorganic nitride or improve thermally conductive properties, and thus is suitable as a surface modifier for an inorganic nitride. Moreover, the specific compound has at least two predetermined groups (specific functional groups). The specific functional group causes an interaction between the specific compounds, between the specific compound and the inorganic nitride, between the specific compound and other components (for example, a phenolic compound and/or an epoxy compound) added if desired, or the like. The present inventors estimate that since a thermal conduction path is formed between the inorganic nitrides and the like by such an interaction via the specific functional group, thermally conductive properties of a thermally conductive material formed of the composition according to the embodiment of the present invention are improved.

Furthermore, a surface state of a thermally conductive sheet formed of the composition according to the embodiment of the present invention is smooth. The present inventors estimate that the reason for this is that a favorable interaction of the specific compound with the inorganic nitride improves the dispersibility of the inorganic nitride in the composition.

Hereinafter, the components contained in the composition will be described in detail.

[Inorganic Nitride]

The composition according to the embodiment of the present invention contains an inorganic nitride.

Examples of the inorganic nitride include boron nitride (BN), carbon nitride ($C_3N_4$), silicon nitride ($Si_3N_4$), gallium nitride (GaN), indium nitride (InN), aluminum nitride (AlN), chromium nitride ($Cr_2N$), copper nitride ($Cu_3N$), iron nitride ($Fe_4N$ or $Fe_3N$), lanthanum nitride (LaN), lithium nitride ($Li_3N$), magnesium nitride ($Mg_3N_2$), molybdenum nitride ($Mo_2N$), niobium nitride (NbN), tantalum nitride (TaN), titanium nitride (TiN), tungsten nitride ($W_2N$, $WN_2$, or % W), yttrium nitride (YN), and zirconium nitride (ZrN).

The inorganic nitride may be used singly, or a plurality thereof may be used in combination.

From the viewpoint that thermally conductive properties of the obtained surface-modified inorganic nitride are superior, the inorganic nitride preferably contains at least one kind selected from the group consisting of a boron atom, an aluminum atom, and a silicon atom. More specifically, the inorganic nitride is preferably boron nitride, aluminum nitride, or silicon nitride, more preferably boron nitride or aluminum nitride, and even more preferably boron nitride.

A shape of the inorganic nitride is not particularly limited, and examples thereof include a granule shape, a film shape, or a plate shape. In a case where the inorganic nitride has a granule shape, examples of the granule shape include a rice grain shape, a spherical shape, a cubical shape, a spindle shape, a scale shape, an aggregation shape, and an amorphous shape.

A size of the inorganic nitride is not particularly limited, but from the viewpoint that the dispersibility of the surface-modified inorganic nitride is superior, an average particle diameter of the inorganic nitrides is preferably 500 μm or less, more preferably 300 μm or less, and even more preferably 200 μm or less. The lower limit thereof is not particularly limited, but is preferably 10 nm or greater and more preferably 100 nm or greater from the viewpoint of handleability.

As a method for measuring the average particle diameter, 100 inorganic nitrides are randomly selected using an electron microscope, particle diameters (major axes) of the respective inorganic nitrides are measured, and the arithmetic mean thereof is determined. Moreover, in a case where a commercial product is used, the value listed in the catalog may be used.

A content of the inorganic nitride in the composition according to the embodiment of the present invention is preferably 10% to 95% by mass, more preferably 20% to 90% by mass, and even more preferably 30% to 85% by mass, with respect to the total solid content of the composition.

In the present specification, the solid content of the composition means all components except for a solvent in a case where the composition contains the solvent, and as long as the component is a component other than the solvent, the component is considered to be a solid content even in a case where the component is a liquid component.

In addition, the composition according to the embodiment of the present invention may contain inorganic substances ("other inorganic substances" which will be described later) other than the inorganic nitride.

In a case where the composition contains the other inorganic substances, a total content of the inorganic nitride and the other inorganic substances is preferably 10% to 95% by mass, more preferably 50% to 90% by mass, and even more preferably 70% to 85% by mass, with respect to the total solid content of the composition.

Moreover, in a case where the composition does not contain the other inorganic substances, the content of the inorganic nitride is preferably 10% to 95% by mass, more preferably 50% to 90% by mass, and even more preferably 70% to 85% by mass, with respect to the total solid content of the composition.

That is, the total content of the inorganic substances (a generic term for the "inorganic nitride" and the "other inorganic substances") in the composition according to the embodiment of the present invention is preferably 10% to 95% by mass, more preferably 50% to 90% by mass, and even more preferably lit % to 85% by mass, with respect to the total solid content of the composition.

In a case where the content of the inorganic substances is within the above range, thermally conductive properties of the obtained thermally conductive material are superior, and smoothness of the obtained thermally conductive sheet is also superior.

Furthermore, in a case where the composition according to the embodiment of the present invention contains the other inorganic substances, the content of the inorganic nitrides with respect to the entire inorganic substance is preferably 10% by mass or greater, more preferably 20% to 70% by mass, and even more preferably 30% to 60% by mass.

One kind of the inorganic nitrides may be used singly, or two or more kinds thereof may be used. In a case where two or more kinds of the inorganic nitrides are used, the total content thereof is preferably within the above range.

From the viewpoint that the thermally conductive properties of the thermally conductive material are superior, the composition preferably contains at least inorganic substances (preferably inorganic nitrides and more preferably boron nitride) having an average particle diameter of 20 μm or greater (preferably 30 μm or greater).

Substantially only inorganic substances (preferably inorganic nitrides and more preferably boron nitride) having an average particle diameter of 20 μm or greater (preferably 30 μm or greater) may be used as the inorganic substances contained in the composition. The expression in which substantially only inorganic substances having an average particle diameter of 20 μm or greater are used as the inorganic substances means that a content of the inorganic substances having an average particle diameter of 20 μm or greater is greater than 99% by mass with respect to a total mass of the inorganic substances.

Furthermore, the inorganic substances may include respective inorganic substances having different average particle diameters, and for example, can also include both inorganic substances X, which are inorganic substances having an average particle diameter of 20 μm or greater, and inorganic substances Y, which are inorganic substances having an average particle diameter of less than 20 μm.

An average particle diameter of the inorganic substances X is preferably 20 to 300 μm and more preferably 30 to 200 μm. An average particle diameter of the inorganic substances Y is preferably 10 nm or greater and less than 20 μm and more preferably 100 nm to 15 μm.

The inorganic substances X are preferably inorganic nitrides or inorganic oxides, more preferably inorganic nitrides, and even more preferably boron nitride.

The inorganic substances Y are preferably inorganic nitrides or inorganic oxides and more preferably boron nitride or aluminum oxide.

One kind of each of the inorganic substances X and the inorganic substances Y may be used singly, or two or more kinds thereof may be used.

In a case where, among the inorganic substances, the average particle diameter of the inorganic substances X is 20 to 300 μm, and the average particle diameter of the inorganic substances Y is 10 nm or greater and less than 20 μm, a mass ratio (content of inorganic substances X/content of inorganic substances Y) of the content of the inorganic substances X to the content of the inorganic substances Y is preferably 40/60 to 99/1, more preferably 50/50 to 99/1, and even more preferably 60/40 to 97/3.

[Specific Compound]

The composition according to the embodiment of the present invention contains a specific compound.

The specific compound is a compound represented by General Formula (1).

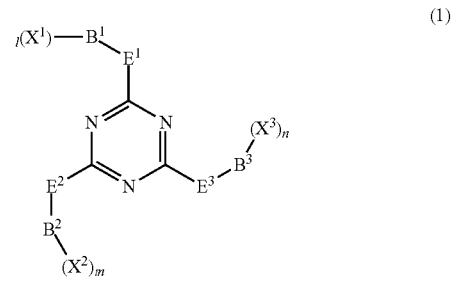

In General Formula (1), $E^1$ to $E^3$ each independently represent a single bond, —NH—, or —NR—.

R represents a substituent (preferably a linear or branched alkyl group having 1 to 5 carbon atoms). In a case where there are a plurality of —NR-'s among $E^1$ to $E^3$, the plurality of R's may be the same as or different from each other.

Among them, from the viewpoint that the thermally conductive properties of the obtained thermally conductive material are superior, $E^1$ to $E^3$ are each independently preferably a single bond or —NH—. The reason for this is considered to be that in a case where $E^1$ to $E^3$ are each the aforementioned group, an interaction between the specific compound and the inorganic nitride is further enhanced.

In General Formula (1), $B^1$ to $B^3$ each independently represent an aromatic ring group which may have a substituent and has 6 or more carbon atoms as ring member atoms.

Moreover, $B^1$ to $B^3$ are bonded to $E^1$ to $E^3$ and $X^1$ to $X^3$, respectively, via the ring member atom of the aromatic ring group.

The aromatic ring group may be a monocyclic aromatic ring group or a polycyclic aromatic ring group.

The number of membered rings in the monocyclic aromatic ring group is preferably 6 to 10.

The number of rings constituting the polycyclic aromatic ring group is preferably 2 to 4 and more preferably 2. The numbers of membered rings in the rings constituting the polycyclic aromatic ring group are each independently preferably 5 to 10.

The aromatic ring group may be an aromatic hydrocarbon ring group or an aromatic heterocyclic group.

The number of heteroatoms contained in the aromatic heterocyclic group is preferably 1 to 5. Examples of the heteroatom include a nitrogen atom, a sulfur atom, an oxygen atom, a selenium atom, a tellurium atom, a phosphorus atom, a silicon atom, and a boron atom. Among them, a nitrogen atom, a sulfur atom, or an oxygen atom is preferable.

A substituent that the aromatic ring groups represented by $B^1$ to $B^3$ may have is preferably a substituent other than a substituent represented by General Formula (2). Here, in a case where an atom in $B^1$ present adjacent to an atom in $B^1$ to which $E^1$ is directly bonded has a substituent, the substituent may be a hydroxyl group. In a case where an atom in $B^2$ present adjacent to an atom in $B^2$ to which $E^2$ is directly bonded has a substituent, the substituent may be a hydroxyl group. In a case where an atom in $B^3$ present adjacent to an atom in $B^3$ to which $E^3$ is directly bonded has a substituent, the substituent may be a hydroxyl group.

In a case where the aromatic ring groups represented by $B^1$ to $B^3$ each have a plurality of substituents, the plurality of substituents may be bonded to each other to form a non-aromatic ring.

The number of carbon atoms, which are ring member atoms, in each of the aromatic ring groups represented by $B^1$ to $B^3$ is 6 or more (preferably 6 to 12). The number of carbon atoms, which are ring member atoms, means the number of carbon atoms which are ring member atoms constituting an aromatic ring.

Moreover, in a case where the aromatic ring group has a plurality of substituents, and the plurality of substituents may be bonded to each other to form a non-aromatic ring, the number of carbon atoms contained only in the non-aromatic ring is not counted in the number of carbon atoms which are ring member atoms. Furthermore, carbon atoms shared by the aromatic ring and the non-aromatic ring in the aromatic ring group are counted as the number of carbon atoms which are ring member atoms.

Examples of $B^1$ to $B^3$ include a benzene ring group, a naphthalene ring group, an anthracene ring group, a benzothiazole ring group, a carbazole ring group, and an indole ring group.

Among them, $B^1$ to $B^3$ are each independently preferably a benzene ring group or a naphthalene ring group.

In General Formula (1), l, m, and n each independently represent an integer of 0 or greater.

l, m, and n are each independently preferably 0 to 5 and more preferably 1 or 2.

Moreover, in a case where l is 0, $B^1$ does not have $X^1$. In a case where m is 0, $B^2$ does not have $X^2$.

In a case where n is 0, $B^3$ does not have $X^3$.

For example, in a case where m is 0, the specific compound is a compound represented by the following general formula.

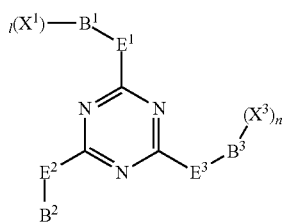

In a case where l is 2 or greater (that is, in a case where there are a plurality of $X^1$'s), the plurality (l pieces) of $X^1$'s may be the same as or different from each other. In a case where m is 2 or greater (that is, in a case where there are a plurality of $X^2$'s), the plurality (m pieces) of $X^2$'s may be the same as or different from each other. In a case where n is 2 or greater (that is, in a case where there are a plurality of $X^3$'s), the plurality (n pieces) of $X^3$'s may be the same as or different from each other.

In General Formula (1), $X^1$ to $X^3$ each independently represent a group represented by General Formula (2).

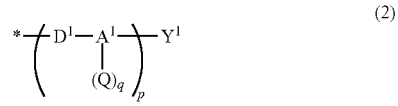
(2)

In General Formula (2), * represents a position bonded to any one of $B^1$, ..., or $B^3$.

In General Formula (2), $D^1$ represents a single bond or a divalent linking group.

Examples of the divalent linking group include —O—, —S—, —CO—, —NR$^N$—, —SO$_2$—, an alkylene group, and a group consisting of a combination thereof. $R^N$ in —NR$^N$— represents a hydrogen atom or a substituent. The alkylene group is preferably a linear or branched alkylene group having 1 to 8 carbon atoms.

Among them, $D^1$ is preferably a "single bond" or a "group consisting of a combination selected from the group consisting of —O—, —CO—, and an alkylene group", and more preferably a single bond, *$^A$-allylene group-O—CO—*$^B$*, *$^A$-CO—O-allylene group-*$^B$, *$^A$-O-alkylene group-O—*$^a$, *$^A$—CO—O-alkylene group-O—CO—*$^B$, *$^A$—CO—O-alkylene group-O—*$^B$, or *$^A$-O-alkylene group-O—CO—*$^B$.

*$^A$ is a bonding position on a side opposite to $A^1$, and *$^B$ is a position bonded to $A^1$.

In General Formula (2), $A^1$ represents an aromatic ring group which may have a substituent and has 6 or more carbon atoms as ring member atoms, or a cycloalkane ring group which may have a substituent and has 6 or more carbon atoms as ring member atoms.

Moreover. $A^1$ is bonded to $D^1$, $Y^1$, and Q via the ring member atom of the aromatic ring group or the cycloalkane ring group.

The aromatic ring group, which may have a substituent and has 6 or more carbon atoms as ring member atoms, in $A^1$ is the same as the aromatic ring group, which may have a substituent and has 6 or more carbon atoms as ring member atoms, in $B^1$ to B.

In the cycloalkane ring group, which may have a substituent and has 6 or more carbon atoms as ring member atoms, in $A^1$, the cycloalkane ring group may be monocyclic or polycyclic.

The number of membered rings in the monocyclic cycloalkane ring group is preferably 6 to 10.

The number of rings constituting the polycyclic cycloalkane ring group is preferably 2 to 4 and more preferably 2. The numbers of membered rings in the rings constituting the polycyclic cycloalkane ring group are each independently preferably 5 to 10.

In a case where the cycloalkane ring group has a plurality of substituents, the plurality of substituents may be bonded to each other to form a ring other than the cycloalkane ring.

The number of carbon atoms, which are ring member atoms, in the cycloalkane ring group is 6 or more (preferably 6 to 12). The number of carbon atoms, which are ring member atoms, means the number of carbon atoms which are ring member atoms constituting a cycloalkane ring.

In a case where the cycloalkane ring group has a plurality of substituents, and the plurality of substituents may be bonded to each other to form a ring other than the cycloalkane ring, the number of carbon atoms contained only in the ring other than the cycloalkane ring is not counted in the number of carbon atoms which are ring member atoms. Moreover, carbon atoms shared by the cycloalkane ring and the ring other than the cycloalkane ring in the cycloalkane ring group are counted as the number of carbon atoms which are ring member atoms.

Examples of the cycloalkane ring group, which may have a substituent and has 6 or more carbon atoms as ring member atoms, in $A^1$ include a cyclohexane ring group, a cycloheptane ring group, a norbornane ring group, and an adamantane ring group.

In General Formula (2), Q and $Y^1$ each independently represent a specific functional group selected from the group consisting of an aldehyde group (—CHO), a boronic acid group (—B(OH)$_2$), a hydroxyl group (—OH), a monovalent group having an epoxy group, an amino group, a thiol group (—SH), a carboxylic acid group (—COOH), a monovalent group having a carboxylic acid anhydride group, an isocyanate group (—NCO), and a monovalent group having an oxetanyl group.

That is, the group represented by General Formula (2) is a group having at least one specific functional group. Here, the fact in which the group represented by General Formula (2) is a "group having the specific functional group" means that the group represented by General Formula (2) may be a group having the specific functional group as a part, or the group represented by General Formula (2) may be the specific functional group.

As the monovalent group having an epoxy group as the specific functional group, for example, a group represented by "-$L^{eo}$-epoxy group" is preferable. $L^{eo}$ is a single bond or a divalent linking group, and is preferably an oxygen atom, an alkylene group (preferably a linear or branched alkylene group having 1 to 6 carbon atoms), or a group consisting of a combination thereof.

Among them, the monovalent group having an epoxy group is preferably "—O-alkylene group-epoxy group".

Moreover, as a substituent that the epoxy group may have, a linear or branched alkyl group having 1 to 6 carbon atoms is preferable.

The amino group as the specific functional group is not particularly limited, and may be any one of a primary amino group, a secondary amino group, or a tertiary amino group. Examples thereof include an amino group represented by —N($R^E$)$_2$ ($R^E$'s are each independently represent a hydrogen atom or an alkyl group (which may be linear or branched). The number of carbon atoms in the alkyl group is preferably 1 to 10, more preferably 1 to 6, and even more preferably 1 to 3. Moreover, the alkyl group may further have a substituent.)

As the monovalent group having a carboxylic acid anhydride group as the specific functional group, for example, a group obtained by removing any hydrogen atom from maleic acid anhydride, phthalic acid anhydride, pyromellitic acid anhydride, and trimellitic acid anhydride is preferable.

As the monovalent group having an oxetanyl group as the specific functional group, for example, a group represented by "-$L^{eo}$-oxetanyl group" is preferable. $L^{eo}$ is a single bond or a divalent linking group, and is preferably an oxygen atom, an alkylene group (preferably a linear or branched alkylene group having 1 to 6 carbon atoms), or a group consisting of a combination thereof.

Among them, the monovalent group having an oxetanyl group is preferably "—O-alkylene group-oxetanyl group".

Moreover, as a substituent that the oxetanyl group may have, a linear or branched alkyl group having 1 to 6 carbon atoms is preferable.

Among them, the specific functional group is preferably an aldehyde group, a boronic acid group, a hydroxyl group, or a monovalent group having an epoxy group.

In other words, Q and $Y^1$ are each independently preferably an aldehyde group, a boronic acid group, a hydroxyl group, or a monovalent group having an epoxy group.

In General Formula (2), p represents an integer of 0 or greater.

Among them, p is preferably 0 to 5 and more preferably 0 or 1.

In a case where p is 0, $Y^1$ is directly bonded to any one of $B^1$, . . . or $B^3$. That is, $X^1$ to $X^3$ may be the specific functional group.

In General Formula (2), q represents an integer of 0 to 2. Among them, q is preferably 0 or 1.

Furthermore, in a case where a plurality of groups represented by General Formula (2) are present in the specific compound, the plurality of groups represented by General Formula (2) may be the same as or different from each other.

For example, in General Formula (2), in a case where there are a plurality of $D^1$'s, the plurality of $D^1$'s may be the same as or different from each other. In a case where there are a plurality of $A^1$'s, the plurality of $A^1$'s may be the same as or different from each other. In a case where there are a plurality of Q's, the plurality of Q's may be the same as or different from each other. In a case where there area plurality of $Y^1$'s, the plurality of $Y^1$'s may be the same as or different from each other. In a case where there are a plurality of p's, the plurality of p's may be the same as or different from each other. In a case where there are a plurality of q's, the plurality of q's may be the same as or different from each other.

In General Formula (1), the total number of 1, m, and n is 2 or greater (preferably 2 to 10 and more preferably 3 to 6).

In other words, the total number of $X^1$ to $X^3$, which may each be present in a plurality of numbers, is 2 or greater (preferably 2 to 10 and more preferably 3 to 6).

That is, in General Formula (1), the total number of the number of $X^1$'s which may be present in a plurality of numbers, the number of $X^2$'s which may be present in a plurality of numbers, and the number of $X^3$'s which may be present in a plurality of numbers is 2 or greater, preferably 2 to 10, and more preferably 3 to 6.

For example, 1 is preferably 1 or greater (more preferably 1 or 2), m is preferably 1 or greater (more preferably 1 or 2), and n is preferably 1 or greater (more preferably 1 or 2).

That is, $B^1$ preferably has one or more (more preferably one or two) $X^1$'s, $B^2$ preferably has one or more (preferably one or two) $X^2$'s, and $B^3$ preferably has one or more (preferably one or two) $X^3$'s.

Here, in a case where l is 1 or greater and at least one $X^1$ is a hydroxyl group, an atom in $B^1$ to which $X^1$, which is a hydroxyl group, is directly bonded and an atom in $B^1$ to which $E^1$ is directly bonded are not adjacent to each other.

In a case where m is 1 or greater and at least one $X^2$ is a hydroxyl group, an atom in $B^2$ to which $X^2$, which is a hydroxyl group, is directly bonded and an atom in $B^2$ to which $E^2$ is directly bonded are not adjacent to each other.

In a case where n is 1 or greater and at least one $X^3$ is a hydroxyl group, an atom in $B^3$ to which $X^3$, which is a hydroxyl group, is directly bonded and an atom in $B^3$ to which $E^3$ is directly bonded are not adjacent to each other.

For example, in a case where $B^1$ is a benzene ring group, and the benzene ring group has a hydroxyl group at an ortho position of $E^1$, the hydroxyl group does not correspond to $X^1$, and is not counted in the aforementioned "number of $X^1$'s which may be present in a plurality of numbers".

The present inventors consider that the hydroxyl groups present at positions on $B^1$ to $B^3$ adjacent to $E^1$ to $E^3$ are greatly affected by steric hindrance, and cannot form a favorable thermal conduction path between the inorganic nitrides, and thus an effect of improving the thermally conductive properties of the thermally conductive material formed of the composition according to the embodiment of the present invention is insufficient.

For example, the atom in $B^1$ to which $E^1$ is directly bonded, and an atom (preferably a carbon atom) in $B^1$ present adjacent to the atom are preferably unsubstituted. The atom in $B^2$ to which $E^2$ is directly bonded, and an atom (preferably a carbon atom) in $B^2$ present adjacent to the atom are preferably unsubstituted. The atom in $B^3$ to which $E^3$ is directly bonded, and an atom (preferably a carbon atom) in $B^3$ present adjacent to the atom are preferably unsubstituted.

The specific compound may have one kind of the groups represented by General Formula (2) singly, and may have two or more kinds thereof.

Among them, the specific compound is preferably a "compound having only a hydroxyl group as the specific functional group", a "compound having only a monovalent group having an epoxy group as the specific functional group", or a "compound having, as the specific functional group, a group (preferably a hydroxyl group) which is neither an aldehyde group nor a boronic acid group, and an aldehyde group and/or a boronic acid group".

Furthermore, as the "compound having, as the specific functional group, both a group which is neither an aldehyde group nor a boronic acid group, and an aldehyde group and/or a boronic acid group", for example, a compound in which in the specific compound, a total of one or more among l pieces of $X^1$'s, m pieces of $X^2$'s, and n pieces of $X^3$'s (that is, among (l+m+n) pieces of groups represented by General Formula (2)) each are a group having at least one specific functional group of an aldehyde group or a boronic acid group, and a total of one or more (preferably one to four) among l pieces of $X^1$'s, m pieces of $X^2$'s, and n pieces of $X^3$'s (that is, among (l+m+n) pieces of groups represented by General Formula (2)) each are a group having a specific functional group which is neither an aldehyde group nor a boronic acid group is preferable.

It is preferable that the "group having at least one specific functional group of an aldehyde group or a boronic acid group", and the "group having a specific functional group which is neither an aldehyde group nor a boronic acid group" are present as separate groups.

As the "specific functional group which is neither an aldehyde group nor a boronic acid group", a hydroxyl group or a monovalent group having an epoxy group is preferable, and a hydroxyl group is more preferable.

It is also preferable that the "group having at least one specific functional group of an aldehyde group or a boronic acid group" does not have any "specific functional group which is neither an aldehyde group nor a boronic acid group".

Moreover, it is also preferable that the "group having a specific functional group which is neither an aldehyde group nor a boronic acid group" has neither an aldehyde group nor a boronic acid group.

By satisfying such conditions, the thermally conductive properties of the obtained thermally conductive material are superior. As a mechanism thereof, the present inventors estimate as follows.

That is, in a case where the specific compound has an aldehyde group and/or a boronic acid group as the specific functional group, the aldehyde group and/or the boronic acid group particularly favorably interacts with the inorganic nitride (in particular, boron nitride).

In a case where the specific compound further has other specific functional groups in addition to the aldehyde group and/or the boronic acid group, the aldehyde group and/or the boronic acid group interacts mainly with the inorganic nitride, while the other specific functional groups form a thermal conduction path by an interaction with a substance other than the inorganic nitride (for example, between the specific compounds), and thus the thermally conductive properties of the obtained thermally conductive material are superior. Moreover, it is estimated that in a case where the composition contains a phenolic compound and/or an epoxy compound, which will be described later, the other specific functional groups may form an interaction with a resin consisting of a phenolic compound and/or an epoxy compound through a chemical bond, and in this case, the thermally conductive properties of the obtained thermally conductive material are superior.

Among them, the specific compound is preferably a compound represented by General Formula (1-2) or General Formula (1-3).

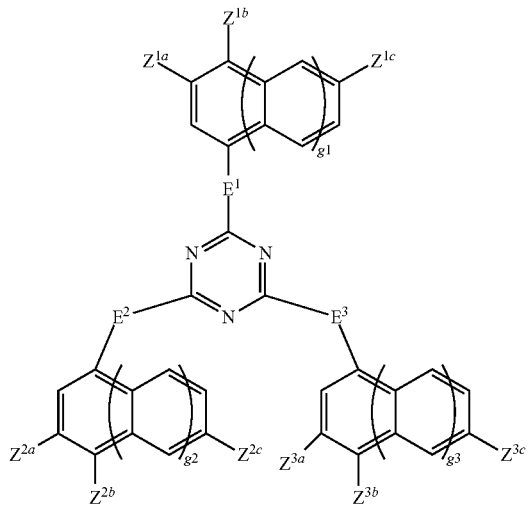

(1-2)

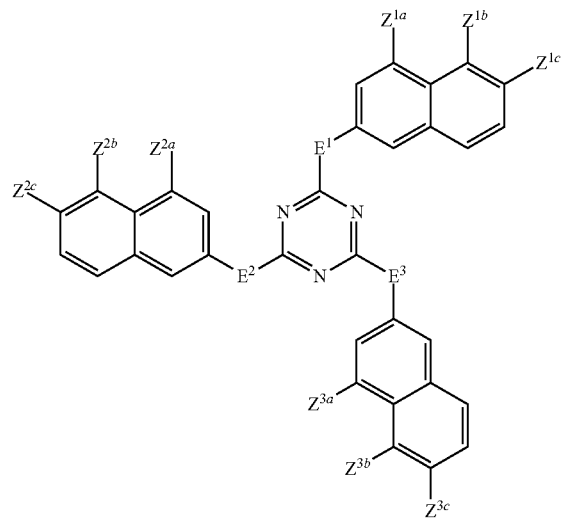

(1-3)

In General Formula (1-2) and General Formula (1-3). $E^1$ to $E^3$ each independently represent a single bond, —NH—, or —NR—. R represents a substituent.

$E^1$ to $E^3$ in General Formula (1-2) and General Formula (1-3) are the same as $E^1$ to $E^3$ in General Formula (1), respectively.

In General Formula (1-2), $g^1$ to $g^3$ each independently represent an integer of 0 or 1.

In General Formula (1-2) and General Formula (1-3), $Z^{1a}$ to $Z^{1c}$, $Z^{2a}$ to $Z^{3a}$, and $Z^{3a}$ to $Z^{3c}$ each independently represent a hydrogen atom or the group represented by General Formula (2).

Here, a total of two or more (preferably two to nine and more preferably three to six) among $Z^{1a}$ to $Z^{1c}$, $Z^{2a}$ to $Z^{2c}$, and $Z^{3a}$ to $Z^{3c}$ are the groups represented by General Formula (2).

The groups represented by General Formula (2) are as described above.

It is preferable that one or more (preferably one or two) among $Z^{1a}$ to $Z^{1c}$ are the groups represented by General Formula (2), one or more (preferably one or two) among $Z^{2a}$ to $Z^{2c}$ are the groups represented by General Formula (2), and one or more (preferably one or two) among $Z^{3a}$ to $Z^{3c}$ are the groups represented by General Formula (2).

Among them, it is preferable that $Z^{1a}$ to $Z^{1c}$, $Z^{2a}$ to $Z^{2c}$, and $Z^{3a}$ to $Z^{3c}$ are each independently a "group selected from the group consisting of a hydrogen atom and a group represented by General Formula (2) in which the specific functional group is a hydroxyl group", or a "group selected from the group consisting of a hydrogen atom and a group represented by General Formula (2) in which the specific functional group is a monovalent group having an epoxy group".

In addition, one or more (preferably one or two) among $Z^{1a}$ to $Z^{1c}$, $Z^{2a}$ to $Z^{2c}$, and $Z^{3a}$ to $Z^{3c}$ each are a group which is represented by General Formula (2) and has at least one specific functional group of an aldehyde group or a boronic acid group, and it is also preferable that one or more (preferably one to four) among $Z^{1a}$ to $Z^{1c}$, $Z^{2a}$ to $Z^{2c}$, and $Z^{3a}$ to $Z^{3c}$ each are a group which is represented by General Formula (2) and has a specific functional group that is neither an aldehyde group nor a boronic acid group.

Among them, it is more preferable that one or more (preferably one or two) among $Z^{1a}$ to $Z^{1c}$ each are a group which is represented by General Formula (2) and has at least one specific functional group of an aldehyde group or a boronic acid group, one or more (preferably one or two) among $Z^{2a}$ to $Z^{2c}$ each are a group which is represented by General Formula (2) and has a specific functional group that is neither an aldehyde group nor a boronic acid group, and one or more (preferably one or two) among $Z^{3a}$ to $Z^{3c}$ each are a group which is represented by General Formula (2) and has a specific functional group that is neither an aldehyde group nor a boronic acid group.

As the "specific functional group which is neither an aldehyde group nor a boronic acid group", a hydroxyl group or a monovalent group having an epoxy group is preferable, and a hydroxyl group is more preferable.

It is also preferable that the "group which is represented by General Formula (2) and has a specific functional group that is neither an aldehyde group nor a boronic acid group" does not have any "specific functional group which is neither an aldehyde group nor a boronic acid group".

Moreover, it is also preferable that the "group which is represented by General Formula (2) and has a specific functional group that is neither an aldehyde group nor a boronic acid group" has neither an aldehyde group nor a boronic acid group.

From the viewpoint that an affinity with the inorganic nitride is excellent, a Hansen solubility parameter value (HSP value) of the specific compound is preferably 28 $MPa^{0.5}$ or less and more preferably 24 $MPa^{0.5}$ or less. The lower limit of the HSP value of the specific compound is not limited, and for example, 10 $MPa^{0.5}$ or greater is preferable.

The HSP value of the specific compound can be calculated from the following expression.

$$\text{HSP value} = (HSP_d^2 + HSP_p^2 + HSP_h^2)^{0.5}$$

$HSP_d$, $HSP_p$, and $HSP_h$ represent a dispersion element, a polarity element, and a hydrogen bond element of the HSP value, respectively (units are each $MPa^{0.5}$).

$HSP_d$, $HSP_p$, and $HSP_h$ are determined using Hansen Solubility Parameters in Practice (Ver. 4.1.07) (HSPiP).

The lower limit of the content of the specific compound in the composition according to the embodiment of the present invention is preferably 0.01% by mass or greater, more preferably 0.05% by mass or greater, and even more preferably 0.5% by mass or greater, with respect to the total solid content of the composition. The upper limit thereof is preferably 30% by mass or less and more preferably 20% by mass or less.

In particular, in a case where the composition according to the embodiment of the present invention contains both the phenolic compound, which will be described later, and the epoxy compound, which will be described later, the upper limit of the content of the specific compound in the composition according to the embodiment of the present invention is preferably 8% by mass or less and more preferably 5% by mass or less, with respect to the total solid content of the composition.

In a case where the composition according to the embodiment of the present invention contains both the phenolic compound, which will be described later, and the epoxy compound, which will be described later, the specific compound is preferably the "compound having, as the specific functional group, both a group which is neither an aldehyde group nor a boronic acid group, and an aldehyde group and/or a boronic acid group".

Similarly, in a case where the composition according to the embodiment of the present invention contains only the phenolic compound (that is, in a case where the epoxy compound, which will be described later, is not substantially contained) among the phenolic compound, which will be described later, and the epoxy compound, which will be described later, the lower limit of the content of the specific compound in the composition according to the embodiment of the present invention is preferably 5% by mass or greater and more preferably 12% by mass or greater, with respect to the total solid content of the composition.

In a case where the composition according to the embodiment of the present invention contains only the phenolic compound (that is, in a case where the epoxy compound, which will be described later, is not substantially contained) among the phenolic compound, which will be described later, and the epoxy compound, which will be described later, the specific compound is preferably the "compound having only a monovalent group having an epoxy group as the specific functional group".

Moreover, in the present specification, the fact in which the composition does not substantially contain the epoxy compound means that the content of the epoxy compound is less than 1.0% by mass (preferably 0% to 0.5% by mass and more preferably 0% to 0.1% by mass) with respect to the total solid content of the composition.

Furthermore, similarly, in a case where the composition according to the embodiment of the present invention contains only the epoxy compound (that is, in a case where the phenolic compound, which will be described later, is not substantially contained) among the phenolic compound, which will be described later, and the epoxy compound, which will be described later, the lower limit of the content of the specific compound in the composition according to the embodiment of the present invention is preferably 5% by mass or greater and more preferably 6% by mass or greater, with respect to the total solid content of the composition. The upper limit thereof is preferably 15% by mass or less.

In a case where the composition according to the embodiment of the present invention contains only the epoxy compound (that is, in a case where the phenolic compound, which will be described later, is not substantially contained) among the phenolic compound, which will be described later, and the epoxy compound, which will be described later, the specific compound is preferably the "compound having only a hydroxyl group as the specific functional group".

Moreover, in the present specification, the fact in which the composition does not substantially contain the phenolic compound means that the content of the phenolic compound is less than 1.0% by mass (preferably 0% to 0.5% by mass and more preferably 0% to 0.1% by mass) with respect to the total solid content of the composition.

In addition, the content of the specific compound in the composition according to the embodiment of the present invention is preferably 0.01% to 30% by mass, more preferably 0.05% to 28% by mass, and even more preferably 0.5% to 25% by mass, with respect to the mass of the inorganic nitride.

One kind of the specific compounds may be used singly, or two or more kinds thereof may be used.

[Phenolic Compound]

The composition according to the embodiment of the present invention may further contain the phenolic compound.

Moreover, the phenolic compound is a compound other than the specific compound. For example, even in a case where the specific compound has a phenolic hydroxyl group, the specific compound does not correspond to the phenolic compound.

From the viewpoint that the thermally conductive properties of the obtained thermally conductive material are superior, the phenolic compound is preferably one or more kinds selected from the group consisting of compounds represented by General Formula (P1) or compounds represented by General Formula (P2).

<Compound Represented by General Formula (P1)>

General Formula (P1) will be shown below.

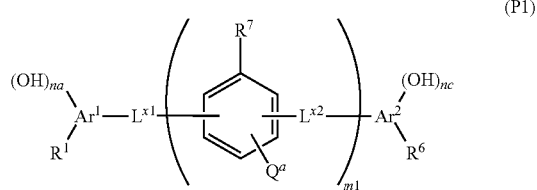

(P1)

In General Formula (P1), m1 represents an integer of 0 or greater.

m1 is preferably 0 to 10, more preferably 0 to 3, even more preferably 0 or 1, and particularly preferably 1.

In General Formula (P1), na and nc each independently represent an integer of 1 or greater.

na and nc are each independently preferably 1 to 4.

In General Formula (P1), $R^1$ and $R^5$ each independently represent a hydrogen atom, a halogen atom, a carboxylic acid group, a boronic acid group, an aldehyde group, an alkyl group, an alkoxy group, or an alkoxycarbonyl group.

The alkyl group may be linear or branched. The number of carbon atoms in the alkyl group is preferably 1 to 10. The alkyl group may or may not have a substituent.

An alkyl group moiety in the alkoxy group and an alkyl group moiety in the alkoxycarbonyl group are the same as the aforementioned alkyl group.

$R^1$ and $R^6$ are each independently preferably a hydrogen atom or a halogen atom, more preferably a hydrogen atom or a chlorine atom, and even more preferably a hydrogen atom.

In General Formula (P1), $R^7$ represents a hydrogen atom or a hydroxyl group.

In a case where there are a plurality of $R^7$'s, the plurality of $R^7$'s may be the same as or different from each other.

In a case where there are the plurality of $R^7$'s, it is also preferable that at least one $R^7$ among the plurality of $R^7$'s represents a hydroxyl group.

In General Formula (P1), $L^{x1}$ represents a single bond, —C($R^2$)($R^3$)—, or —CO—, and is preferably —C($R^2$)($R^3$)— or —CO—.

$L^{x2}$ represents a single bond, —C($R^4$)($R^5$)—, or —CO—, and is preferably —C($R^4$)($R^5$)— or —CO—.

$R^2$ to $R^5$ each independently represent a hydrogen atom or a substituent.

The substituents are each independently preferably a hydroxyl group, a phenyl group, a halogen atom, a carboxylic acid group, a boronic acid group, an aldehyde group, an alkyl group, an alkoxy group, or an alkoxycarbonyl group, and more preferably a hydroxyl group, a halogen atom, a carboxylic acid group, a boronic acid group, an aldehyde group, an alkyl group, an alkoxy group, or an alkoxycarbonyl group.

The alkyl group may be linear or branched. The number of carbon atoms in the alkyl group is preferably 1 to 10. The alkyl group may or may not have a substituent.

An alkyl group moiety in the alkoxy group and an alkyl group moiety in the alkoxycarbonyl group are the same as the aforementioned alkyl group.

The phenyl group may or may not have a substituent, and in a case where the phenyl group has a substituent, it is more preferable to have one to three hydroxyl groups.

$R^2$ to $R^5$ are each independently preferably a hydrogen atom or a hydroxyl group and more preferably a hydrogen atom.

$L^{x1}$ and $L^{x2}$ are each independently preferably —$CH_2$—, —CH(OH)—, —CO—, or —CH(Ph)-.

Ph represents a phenyl group which may have a substituent.

Furthermore, in General Formula (P1), in a case where there are a plurality of $R^4$'s, the plurality of $R^4$'s may be the same as or different from each other. In a case where there are a plurality of $R^5$'s, the plurality of $R^5$'s may be the same as or different from each other.

In General Formula (Pt), $Ar^1$ and $Ar^2$ each independently represent a benzene ring group or a naphthalene ring group.

$Ar^1$ and $Ar^2$ are each independently preferably a benzene ring group.

In General Formula (P1), $Q^a$ represents a hydrogen atom, an alkyl group, a phenyl group, a halogen atom, a carboxylic acid group, a boronic acid group, an aldehyde group, an alkoxy group, or an alkoxycarbonyl group.

The alkyl group may be linear or branched. The number of carbon atoms in the alkyl group is preferably 1 to 10. The alkyl group may or may not have a substituent.

An alkyl group moiety in the alkoxy group and an alkyl group moiety in the alkoxycarbonyl group are the same as the aforementioned alkyl group.

The phenyl group may or may not have a substituent.

$Q^a$ is preferably bonded to a para position with respect to a hydroxyl group that a benzene ring group, to which $Q^a$ is bonded, may have.

$Q^a$ is preferably a hydrogen atom or an alkyl group. The alkyl group is preferably a methyl group.

Furthermore, in General Formula (P1), in a case where there are a plurality of $R^7$'s, $L^{x2}$'s and/or $Q^a$'s, the plurality of $R^7$'s may be the same as or different from each other, the plurality of $L^{x2}$'s may be the same as or different from each other, and/or the plurality of $Q^a$'s may be the same as or different from each other.

(Compound Represented by General Formula (P2))

General Formula (P2) will be shown below.

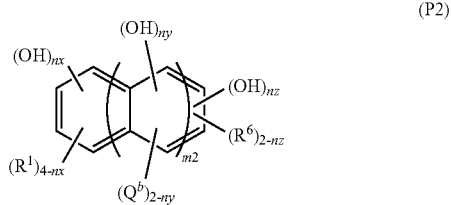

In General Formula (P2), m2 represents an integer of 0 or greater.

m2 is preferably 0 to 10 and more preferably 0 to 4.

In General Formula (P2), nx represents an integer of 0 to 4.

nx is preferably 1 to 2 and more preferably 2.

In General Formula (P2), ny represents an integer of 0 to 2.

In a case where there are a plurality of ny's, the plurality of ny's may be the same as or different from each other.

It is preferable that at least one ny among ny's, which may be present in a plurality of numbers, represents 1. For example, in a case where m2 represents 1, it is preferable that one ny represents 1. In a case where m2 represents 4, it is preferable that at least one ny among four ny's represents 1, and more preferable that two ny's each represent 1.

In General Formula (P2), nz represents an integer of 0 to 2.

nz is preferably 1.

In General Formula (P2), the total number of nx, ny's which can be present in a plurality of numbers, and nz is preferably 2 or greater and more preferably 2 to 10.

In General Formula (P2). $R^1$ and $R^6$ each independently represent a hydrogen atom, a halogen atom, a carboxylic acid group, a boronic acid group, an aldehyde group, an alkyl group, an alkoxy group, or an alkoxycarbonyl group.

$R^1$ and $R^6$ in General Formula (P2) are the same as $R^1$ and $R^6$ in General Formula (P1), respectively.

In a case where there are a plurality of $R^1$'s, the plurality of $R^1$'s may be the same as or different from each other. In a case where there are a plurality of $R^6$'s, the plurality of $R^6$'s may be the same as or different from each other.

In General Formula (P2). $Q^b$ represents a hydrogen atom, an alkyl group, a phenyl group, a halogen atom a carboxylic acid group, a boronic acid group, an aldehyde group, an alkoxy group, or an alkoxycarbonyl group.

The alkyl group may be linear or branched. The number of carbon atoms in the alkyl group is preferably 1 to 10. The alkyl group may or may not have a substituent.

An alkyl group moiety in the alkoxy group and an alkyl group moiety in the alkoxycarbonyl group are the same as the aforementioned alkyl group.

The phenyl group may or may not have a substituent.

$Q^b$ is preferably a hydrogen atom.

In a case where there are a plurality of $Q^b$'s, the plurality of $Q^b$'s may be the same as or different from each other.

Specific examples of the compound represented by General Formula (P2) include benzenetriol (preferably 1,3,5-benzenetriol).

As other phenolic compounds, for example, a biphenyl aralkyl-type phenolic resin, a phenol novolac resin, a cresol novolac resin, an aromatic hydrocarbon formaldehyde resin-modified phenolic resin, a dicyclopentadiene phenol addition-type resin, a phenol aralkyl resin, a polyhydric phenol novolac resin synthesized from a polyhydric hydroxy compound and formaldehyde, a naphthol aralkyl resin, a trimethylolmethane resin, a tetraphenylolethane resin, a naphthol novolac resin, a naphthol phenol co-condensed novolac resin, a naphthol cresol co-condensed novolac resin, a biphenyl-modified phenolic resin, a biphenyl-modified naphthol resin, an aminotriazine-modified phenolic resin, an alkoxy group-containing aromatic ring-modified novolac resin, and the like are preferable.

The lower limit value of the hydroxyl group content of the phenolic compound is preferably 3.0 mmol/g or greater, more preferably 8.0 mmol/g or greater, even more preferably 11.0 mmol/g or greater, particularly preferably 12.0 mmol/g or greater, and most preferably 13.0 mmol/g or greater. The upper limit value thereof is preferably 25.0 mmol/g or less and more preferably 23.0 mmol/g or less.

Moreover, the hydroxyl group content means the number of hydroxyl groups (preferably, phenolic hydroxyl groups) contained in 1 g of the phenolic compound.

Furthermore, the phenolic compound may or may not have an active hydrogen-containing group (carboxylic acid group or the like) capable of a polymerization reaction with an epoxy compound, in addition to the hydroxyl group. The lower limit value of the content (total content of hydrogen atoms in a hydroxyl group, a carboxylic acid group, and the like) of an active hydrogen in the phenolic compound is preferably 8.0 mmol/g or greater, more preferably 10.5 mmol/g or greater, even more preferably 11.0 mmol/g or greater, particularly preferably 12.0 mmol/g or greater, and most preferably 13.0 mmol/g or greater. The upper limit value thereof is preferably 25.0 mmol/g or less and more preferably 23.0 mmol/g or less.

The upper limit value of the molecular weight of the phenolic compound is preferably 600 or less, more preferably 500 or less, even more preferably 450 or less, and particularly preferably 400 or less. The lower limit value thereof is preferably 110 or greater and more preferably 300 or greater.

One kind of the phenolic compounds may be used singly, or two or more kinds thereof may be used.

In a case where the composition according to the embodiment of the present invention contains the phenolic compound, the content of the phenolic compound is preferably 1.0% to 25.0% by mass and more preferably 3.0% to 20.0% by mass, with respect to the total solid content of the composition.

Furthermore, the composition according to the embodiment of the present invention may contain compounds (also referred to as "other active hydrogen-containing compounds") having a group capable of reacting with the epoxy compound, which will be described later, as compounds other than the phenolic compound and the specific compound.

In a case where the composition according to the embodiment of the present invention contains the phenolic compound and also contains the other active hydrogen-containing compounds, a mass ratio (content of other active hydrogen-containing compounds/content of phenolic compound) of a content of the other active hydrogen-containing compounds to the content of the phenolic compound in the composition according to the embodiment of the present invention is preferably 0 to 1, more preferably 0 to 0.1, and even more preferably 0 to 0.05.

[Epoxy Compound]

The composition according to the embodiment of the present invention may further contain the epoxy compound.

Moreover, the epoxy compound is a compound other than the specific compound. For example, even in a case where the specific compound has an epoxy group, the specific compound does not correspond to the epoxy compound.

The epoxy compound is a compound having at least one epoxy group (oxiranyl group) in one molecule. The epoxy group may or may not have a substituent, if possible.

The number of epoxy groups contained in the epoxy compound is preferably 2 or greater, more preferably 2 to 40, even more preferably 2 to 10, and particularly preferably 2, in one molecule.

A molecular weight of the epoxy compound is preferably 150 to 10,000, more preferably 150 to 2,000, and even more preferably 250 to 400.

The lower limit value of the epoxy group content of the epoxy compound is preferably 2.0 mmol/g or greater, more preferably 4.0 mmol/g or greater, and even more preferably 5.0 mmol/g or greater. The upper limit value thereof is preferably 20.0 mmol/g or less and more preferably 15.0 mmol/g or less.

Moreover, the epoxy group content means the number of epoxy groups contained in 1 g of the epoxy compound.

The epoxy compound is preferably a liquid at room temperature (23° C.).

The epoxy compound may or may not exhibit liquid crystallinity.

That is, the epoxy compound may be a liquid crystal compound. In other words, a liquid crystal compound having an epoxy group can also be used as the epoxy compound.

Examples of the epoxy compound (which may be a liquid crystalline epoxy compound) include a compound (rod-like compound) which has a rod-like structure in at least a portion thereof, and a compound (disk-like compound) which has a disk-like structure in at least a portion thereof.

Among them, a rod-like compound is preferable from the viewpoint that the thermally conductive properties of the obtained thermally conductive material are superior.

Hereinafter, the rod-like compound and the disk-like compound will be described in detail.

(Rod-Like Compound)

Examples of the epoxy compound, which is a rod-like compound, include azomethines, azoxies, cyanobiphenyls, cyanophenyl esters, benzoic acid esters, cyclohexane carboxylic acid phenyl esters, cyanophenyl cyclohexanes, cyano-substituted phenylpyrimidines, alkoxy-substituted phenylpyrimidines, phenyldioxanes, tolans, and alkenylcyclohexyl benzonitriles. In addition to these low-molecular-weight compounds described above, high-molecular-weight compounds can also be used. The aforementioned high-molecular-weight compounds are high-molecular-weight compounds obtained by polymerizing rod-like compounds having a low-molecular-weight reactive group.

Examples of a preferred rod-like compound include a rod-like compound represented by General Formula (XXI).

$Q^1$-$L^{111}$-$A^{111}$-$L^{113}$-M-$L^{114}$-$A^{112}$-$L^{112}$-$Q^2$  General Formula (XXI):

In General Formula (XXI): $Q^1$ and $Q^2$ are each independently an epoxy group, and $L^{111}$, $L^{112}$, $L^{113}$, and $L^{114}$ each independently represent a single bond or a divalent linking group. $A^{111}$ and $A^{112}$ each independently represent a divalent linking group (spacer group) having 1 to 20 carbon atoms. M represents a mesogenic group.

The epoxy groups represented by $Q^1$ and $Q^2$ may or may not have a substituent.

In General Formula (XXI), $L^{111}$, $L^{112}$, $L^{113}$, and $L^{114}$ each independently represent a single bond or a divalent linking group.

The divalent linking groups represented by $L^{111}$, $L^{112}$, $L^{113}$, and $L^{114}$ are each independently preferably a divalent linking group selected from the group consisting of —O—, —S—, —CO—, —NR$^{112}$—, —CO—O—, —O—CO—O—, —CO—NR$^{112}$—, —NR$^{112}$—CO—, —O—CO—, —CH$_2$—O—, —O—CH$_2$—, —O—CO—NR$^{112}$—, —NR$^{112}$—CO—O—, and —NR$^{112}$—CO—NR$^{112}$—. $R^{112}$ is an alkyl group having 1 to 7 carbon atoms or a hydrogen atom.

Among them, $L^{113}$ and $L^{114}$ are each independently preferably —O—.

$L^{111}$ and $L^{112}$ are each independently preferably a single bond.

In General Formula (XXI), $A^{111}$ and $A^{112}$ each independently represent a divalent linking group having 1 to 20 carbon atoms.

The divalent linking group may contain heteroatoms, such as oxygen atoms and sulfur atoms, which are not adjacent to each other. Among them, an alkylene group, an alkenylene group, or an alkynylene group, which has 1 to 12 carbon atoms, is preferable. The aforementioned alkylene group, alkenylene group, or alkynylene group may or may not have an ester group.

The divalent linking group is preferably linear, and the divalent linking group may or may not have a substituent. Examples of the substituent include a halogen atom (a fluorine atom, a chlorine atom, and a bromine atom), a cyan group, a methyl group, and an ethyl group.

Among them, $A^{111}$ and $A^{112}$ are each independently preferably an alkylene group having 1 to 12 carbon atoms and more preferably a methylene group.

In General Formula (XXI), M represents a mesogenic group, and examples of the mesogenic group include known mesogenic groups. Among them, a group represented by General Formula (XXII) is preferable.

—($W^1$-$L^{115}$)$_n$-$W^2$—  General Formula (XXII):

In General Formula (XXII), $W^1$ and $W^2$ each independently represent a divalent cyclic alkylene group, a divalent cyclic alkenylene group, an arylene group, or a divalent heterocyclic group. $L^{115}$ represents a single bond or a divalent linking group. n represents an integer 1 to 4.

Examples of $W^1$ and $W^2$ include 1,4-cyclohexenediyl, 1,4-cyclohexanediyl, 1,4-phenylene, pyrimidine-2,5-diyl, pyridine-2,5-diyl, 1,3,4-thiadiazole-2,5-diyl, 1,3,4-oxadiazole-2,5-diyl, naphthalene-2,6-diyl, naphthalene-1,5-diyl, thiophene-2,5-diyl, and pyridazine-3,6-diyl. In a case of the 1,4-cyclohexanediyl, the compound may be any one isomer of structural isomers of a trans-isomer and a cis-isomer, or a mixture in which the isomers are mixed at any ratio. Among them, a trans-isomer is preferable.

Each of $W^1$ and $W^2$ may have a substituent. Examples of the substituent include the groups exemplified in the aforementioned substituent group Y, and more specifically, examples of the substituent include a halogen atom (a fluorine atom, a chlorine atom, a bromine atom, and an iodine atom), a cyano group, an alkyl group having 1 to 10 carbon atoms (for example, a methyl group, an ethyl group, a propyl group, and the like), an alkoxy group having 1 to 10 carbon atoms (for example, a methoxy group, an ethoxy group, and the like), an acyl group having 1 to 10 carbon atoms (for example, a formyl group, an acetyl group, and the like), an alkoxycarbonyl group having 1 to 10 carbon atoms (for example, a methoxycarbonyl group, an ethoxycarbonyl group, and the like), an acyloxy group having 1 to 10 carbon atoms (for example, an acetyloxy group, a propionyloxy group, and the like), a nitro group, a trifluoromethyl group, and a difluoromethyl group.

In a case where there are a plurality of $W^1$'s, the plurality of $W^1$'s may be the same as or different from each other.

In General Formula (XXII), $L^{115}$ represents a single bond or a divalent linking group. Examples of the divalent linking group represented by $L^{115}$ include the specific examples of the divalent linking groups represented by $L^{111}$ to $L^{114}$, such as —CO—O—, —O—CO—. —CH$_2$—O—, and —O—CH$_2$—.

In a case where there are a plurality of $L^{115}$'s, the plurality of $L^{115}$'s may be the same as or different from each other.

Examples of a skeleton preferable as the basic skeleton of the mesogenic group represented by General Formula (XXII) will be shown below. Substituents may be substituted in these skeletons of the mesogenic group.

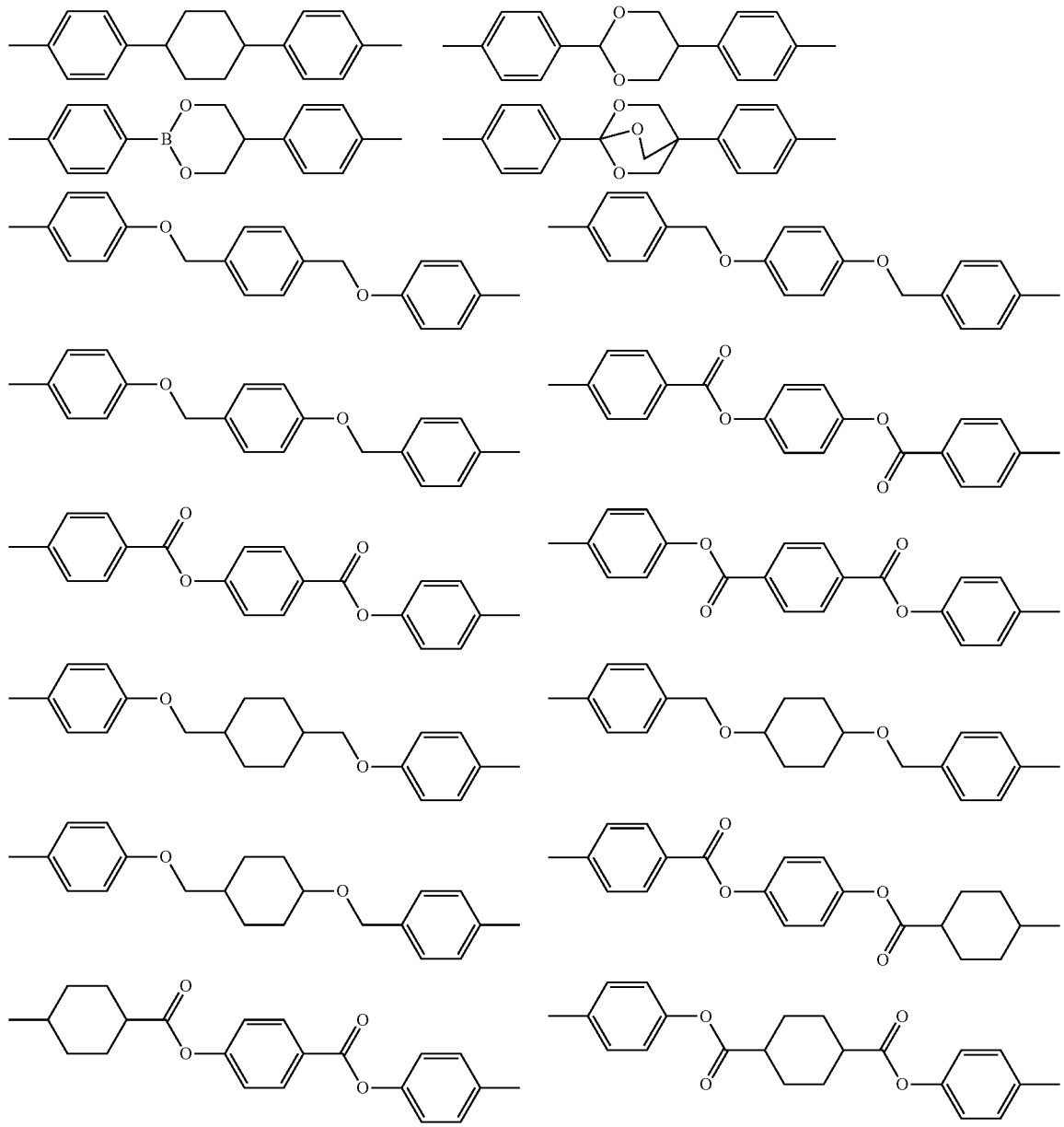

-continued

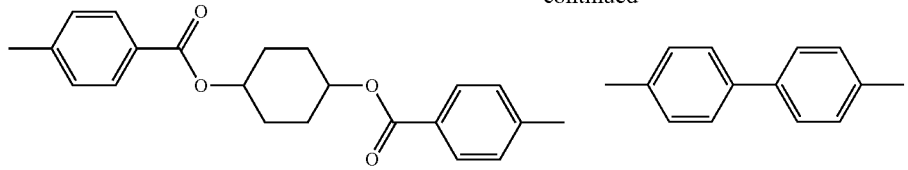

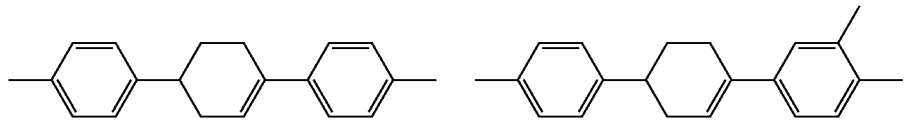

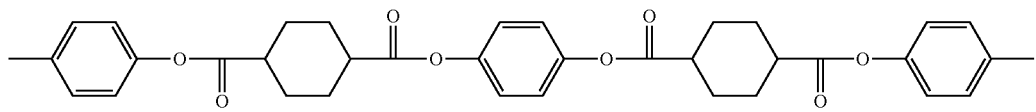

Among the skeletons, a biphenyl skeleton is preferable from the viewpoint that the thermally conductive properties of the obtained thermally conductive sheet are superior.

Moreover, the compound represented by General Formula (XXI) can be synthesized with reference to the method described in JP 199-513019A (JP-H11-513019A) (WO97/00600A).

The rod-like compound may be a monomer having the mesogenic group described in 21999-323162A (JP-H11-323162A) and JP4118691B.

Among them, the rod-like compound is preferably a compound represented by General Formula (E1).

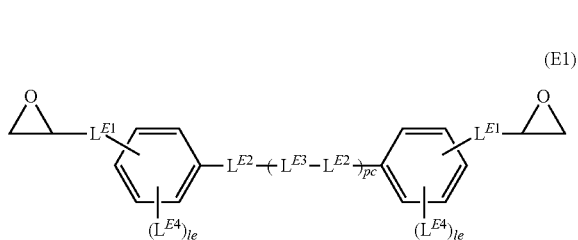

(E1)

In General Formula (E1), $L^{E1}$'s each independently represent a single bond or a divalent linking group.

Among them, $L^{E1}$ is preferably a divalent linking group.

The divalent linking group is preferably —O—, —S—, —CO—, —NH—, —CH=CH—, —C≡C—, —CH=N—, —N=CH—, —N=N—, an alkylene group which may have a substituent, or a group consisting of a combination of two or more thereof, and more preferably —O-alkylene group- or -alkylene group-O—.

Moreover, the alkylene group may be any one of linear, branched, or cyclic, but is preferably a linear alkylene group having 1 or 2 carbon atoms.

The plurality of $L^{E1}$'s may be the same as or different from each other.

In General Formula (E1), $L^{E2}$'s each independently represent a single bond, —CH=CH—, —CO—O—, —O—CO—, —C(—CH$_3$)=CH—, —CH=C(—CH$_3$)—, —CH=N—, —N=CH—, —N=N—, —C≡C—, —N=N$^+$(—O$^-$)—, —N$^+$(—O$^-$)=N—, —CH=N$^+$(—O$^-$)—, —N$^+$(—O$^-$)=CH—, —CH=CH—CO—, —CO—CH=CH—, —CH=C(—CN)—, or —C(—CN)=CH—.

Among them, $L^{E2}$'s are each independently preferably a single bond, —CO—O—, or —O—CO—.

In a case where there are a plurality of $L^{E2}$'s, the plurality of $L^{E2}$'s may be the same as or different from each other.

In General Formula (E1), $L^{E3}$'s each independently represent a single bond, a 5-membered or 6-membered aromatic ring group or a 5-membered or 6-membered non-aromatic ring group, which may have a substituent, or a polycyclic group consisting of these rings.

Examples of the aromatic ring group and non-aromatic ring group represented by $L^{E3}$ include a 1,4-cyclohexanediyl group, a 1,4-cyclohexenediyl group, a 1,4-phenylene group, a pyrimidine-2,5-diyl group, a pyridine-2,5-diyl group, a 1,3,4-thiadiazole-2,5-diyl group, a 1,3,4-oxadiazole-2,5-diyl group, a naphthalene-2,6-diyl group, a naphthalene-1,5-diyl group, a thiophene-2,5-diyl group, and a pyridazine-3,6-diyl group, each of which may have a substituent. In a case of the 1,4-cyclohexanediyl group, the group may be any one isomer of structural isomers of a trans-isomer and a cis-isomer, or a mixture in which the isomers are mixed at any ratio. Among them, a trans-isomer is preferable.

In particular, $L^{E3}$ is preferably a single bond, a 1,4-phenylene group, or a 1,4-cyclohexenediyl group.

The substituents contained in the groups represented by $L^{E3}$ are each independently preferably an alkyl group, an alkoxy group, a halogen atom, a cyano group, a nitro group, or an acetyl group, and more preferably an alkyl group (preferably having one carbon atom).

Furthermore, in a case where there are a plurality of substituents, these substituents may be the same as or different from each other.

In a case where there are a plurality of $L^{E3}$'s, the plurality of $L^{a}$'s may be the same as or different from each other.

In General Formula (E1), pe represents an integer of 0 or greater.

In a case where pe is an integer of 2 or greater, a plurality of $(-L^{E3}-L^{E2}-)$'s may be the same as or different from each other.

Among them, pe is preferably 0 to 2, more preferably 0 or 1, and even more preferably 0.

In General Formula (E1), $L^{E4}$'s each independently represent a substituent.

The substituents are each independently preferably an alkyl group, an alkoxy group, a halogen atom, a cyano group, a nitro group, or an acetyl group, and more preferably an alkyl group (preferably having one carbon atom).

The plurality of $L^{E4}$'s may be the same as or different from each other. Moreover, in a case where le described below is an integer of 2 or greater, the plurality of $L^{E4}$'s in the same $(L^{E4})_{le}$ may also be the same as or different from each other.

In General Formula (E1), 1e's each independently represent an integer of 0 to 4.

Among them, 1e's are each independently preferably 0 to 2.

The plurality of 1e's may be the same as or different from each other.

The rod-like compound preferably has a biphenyl skeleton.

In other words, it is preferable that the epoxy compound has a biphenyl skeleton and more preferable that the epoxy compound in this case is a rod-like compound.

(Disk-Like Compound)

The epoxy compound, which is a disk-like compound, has a disk-like structure in at least a portion thereof.

The disk-like structure has at least an alicyclic ring or an aromatic ring. In particular, in a case where the disk-like structure has an aromatic ring, the disk-like compound can form a columnar structure by forming a stacking structure based on the intermolecular π-π interaction.

Specific examples of the disk-like structure include the triphenylene structure described in Angew. Chem. Int. Ed. 2012, 51, 7990 to 7993, or JP 1995-306317A (JP-H07-306317A), and the trisubstituted benzene structures described in JP2007-002220A and JP2010-244038A.

The disk-like compound preferably has three or more epoxy groups. The cured substance of the epoxy compound, which contains the disk-like compound having three or more epoxy groups, tends to have a high glass transition temperature and high heat resistance.

The number of epoxy groups contained in the disk-like compound is preferably 8 or less and more preferably 6 or less.

Specific examples of the disk-like compound include compounds which have an epoxy group at at least one (preferably, three or more) of terminals in the compounds or the like described in C. Destrade et al., Mol. Crysr. Liq. Crust., vol. 71, page 111 (1981); edited by The Chemical Society of Japan, Quarterly Review of Chemistry. No. 22, Chemistry of liquid crystal, Chapter 5, Chapter 10, Section 2 (1994); B. Kohne et al., Angew. Chem. Soc. Chem. Comm., page 1794(1985); J. Zhang et al., J. Am. Chem. Soc., vol. 116, page 2655 (1994); and JP4592225B.

Examples of the disk-like compound include compounds which have an epoxy group at at least one (preferably, three or more) of terminals in the triphenylene structure described in Angew. Chem. Int. Ed. 2012, 51, 7990 to 7993 and JP1995-306317A (JP-H07-306317A) and the trisubstituted benzene structures described in JP2007-002220A and JP2010-244038A.

(Other Epoxy Compounds)

Examples of other epoxy compounds other than the aforementioned epoxy compound include an epoxy compound represented by General Formula (DN).

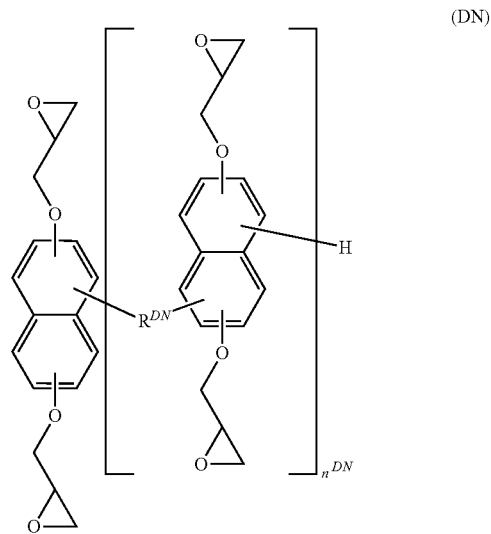

(DN)

In General Formula (DN), $n^{DN}$ represents an integer of 0 or greater, and is preferably 0 to 5 and more preferably 1.

$R^{DN}$ represents a single bond or a divalent linking group. The divalent linking group is preferably —O—, —O—CO—, —CO—O—, —S—, an alkylene group (the number of carbon atoms is preferably 1 to 10), an arylene group (the number of carbon atoms is preferably 6 to 20), or a group consisting of a combination thereof, more preferably an alkylene group, and even more preferably a methylene group.

As the other epoxy compounds, a compound in which an epoxy group is fused is also mentioned.

Examples of such a compound include 3,4:8,9-diepoxybi-cyclo[4.3.0]nonane.

Examples of the other epoxy compounds include, in addition to the aforementioned epoxy compounds, a bisphenol A-type epoxy compound, a bisphenol F-type epoxy compound, a bisphenol S-type epoxy compound, a bisphenol AD-type epoxy compound, and the like, which are glycidyl ethers of bisphenol A, F, S. and AD, and the like; a hydrogenated bisphenol A-type epoxy compound, a hydrogenated bisphenol AD-type epoxy compound, and the like; a phenol novolac-type glycidyl ether (phenol novolac-type epoxy compound), a cresol novolac-type glycidyl ether (cresol novolac-type epoxy compound), a bisphenol A novolac-type glycidyl ether, and the like; a dicyclopentadiene-type glycidyl ether (dicyclopentadiene-type epoxy compound); a dihydroxypentadiene-type glycidyl ether (dihydroxypentadiene-type epoxy compound): a polyhydroxybenzene-type glycidyl ether (polyhydroxybenzene-type epoxy compound), a benzene polycarboxylic acid-type glycidyl ester (benzene polycarboxylic acid-type epoxy compound); and a trisphenol methane-type epoxy compound.

One kind of the epoxy compounds may be used singly, or two or more kinds thereof may be used.

In a case where the composition according to the embodiment of the present invention contains the epoxy compound, the content of the epoxy compound is preferably 1.0% to 25.0% by mass and more preferably 3.0% to 20.0% by mass, with respect to the total solid content of the composition.

The composition according to the embodiment of the present invention preferably contains at least one of the aforementioned phenolic compound or the aforementioned epoxy compound.

In this case, as described above, the composition may contain only the phenolic compound (the epoxy compound may be not substantially contained), may contain only the epoxy compound (the phenolic compound may be not substantially contained), or may contain the both compounds, among the phenolic compound and the epoxy compound.

In a case where the composition according to the embodiment of the present invention contains both the epoxy compound and the phenolic compound, a ratio of the content of the epoxy compound to the content of the phenolic compound in the composition is preferably such that an equivalent ratio (the number of epoxy groups/the number of hydroxyl groups) of the epoxy group of the epoxy compound to the hydroxyl group of the phenolic compound is 30/70 to 70/30, and more preferably such that the equivalent ratio is 35/65 to 65/35.

Moreover, in a case where the composition according to the embodiment of the present invention contains both the epoxy compound and the phenolic compound, the ratio of the content of the epoxy compound to the content of the phenolic compound in the composition is preferably such that an equivalent ratio (the number of epoxy groups/the number of active hydrogens) of the epoxy group of the epoxy compound to the active hydrogen (hydrogen atom in a hydroxyl group or the like) of the phenolic compound is 30/70 to 70/30, and more preferably such that the equivalent ratio is 35/65 to 65/35.

Furthermore, a ratio (the number of epoxy groups/the number of hydroxyl groups) of the total number of epoxy groups, which is a sum of the number of epoxy groups contained in the epoxy compound and the number of epoxy groups contained in the specific compound, to the total number of hydroxyl groups, which is a sum of the number of hydroxyl groups contained in the phenolic compound and the number of hydroxyl groups contained in the specific compound, in the composition is preferably 30/70 to 70/30, more preferably 40/60 to 60/40, and even more preferably 42/58 to 58/42.

In this case, the composition may contain only one of the epoxy compound and the phenolic compound, may contain the both compounds, or may not contain the both compounds.

In addition, in a case where the composition contains the specific compound having an epoxy group, the specific compound having an active hydrogen, and/or the other active hydrogen-containing compounds, a ratio of the total content of the epoxy compound and the specific compound having an epoxy group to the total content of the phenolic compound, the specific compound having an active hydrogen, and the other active hydrogen-containing compounds is preferably such that an equivalent ratio (the number of epoxy groups/the number of active hydrogens) of the epoxy group to the active hydrogen (hydrogen atom in a hydroxyl group or the like) in the system is 30/70 to 70/30, more preferably such that the equivalent ratio is 40/60 to 60/40, and even more preferably such that the equivalent ratio is 42/58 to 58/42.

In a case where the composition according to the embodiment of the present invention contains both the epoxy compound and the phenolic compound, the total content of the phenolic compound and the epoxy compound in the composition is preferably 5% to 90% by mass, more preferably 10% to 50% by mass, and even more preferably 15% to 40% by mass, with respect to a total mass of the solid contents.

[Other Inorganic Substances]

The composition according to the embodiment of the present invention may contain other inorganic substances as inorganic substances other than the inorganic nitride.

As the other inorganic substances, from the viewpoint that the thermally conductive properties and insulating properties of the obtained thermally conductive material are superior, an inorganic oxide is preferable.

Examples of the inorganic oxide include zirconium oxide ($ZrO_2$), titanium oxide ($TiO_2$), silicon oxide ($SiO_2$), aluminum oxide ($Al_2O_3$), iron oxide ($Fe_2O_3$, $FeO$, or $Fe_3O_4$), copper oxide ($CuO$ or $Cu_2O$), zinc oxide ($ZnO$), yttrium oxide ($Y_2O_3$), niobium oxide ($Nb_2O_5$), molybdenum oxide ($MoO_3$), indium oxide ($In_2O_3$ or $In_2O$), tin oxide ($SnO_2$), tantalum oxide ($Ta_2O_5$), tungsten oxide ($WO_3$ or $W_2O_5$), lead oxide ($PbO$ or $PbO_2$), bismuth oxide ($Bi_2O_3$), cerium oxide ($CeO_2$ or $Ce_2O_3$), antimony oxide ($Sb_2O_3$ or $Sb_2O_5$), germanium oxide ($GeO$, or $GeO$), lanthanum oxide ($La_2O_3$), and ruthenium oxide ($RuO_2$).

Only one kind of the inorganic oxides may be used, or two or more kinds thereof may be used.

The inorganic oxide is preferably titanium oxide, aluminum oxide, or zinc oxide, and more preferably aluminum oxide.

The inorganic oxide may be an oxide which is produced by oxidizing a metal prepared as a nonoxide in an environment or the like.

Each shape of the other inorganic substances is not particularly limited, and may be a granule shape, a film shape, or a plate shape. Examples of a shape of the granular inorganic substance include a rice grain shape, a spherical shape, a cubical shape, a spindle shape, a scale shape, an aggregation shape, and an amorphous shape.

Sizes of the other inorganic substances are not particularly limited, but from the viewpoint that the dispersibility of the other inorganic substances is superior, an average particle diameter of the other inorganic substances is preferably 500 μm or less, more preferably 300 μm or less, and even more preferably 200 μm or less. The lower limit thereof is not particularly limited, but is preferably 10 nm or greater and more preferably 100 nm or greater, from the viewpoint of handleability.

For the average particle diameter of the other inorganic substances, in a case where a commercial product is used, the value listed in the catalog is adopted. In a case where a value is not listed in the catalog, as a method for measuring the average particle diameter, 100 inorganic substances are randomly selected using an electron microscope, particle diameters (major axes) of the respective inorganic substances are measured, and the arithmetic mean thereof is determined.

Only one kind of the other inorganic substances may be used, or two or more kinds thereof may be used. In a case where two or more kinds thereof are used, it is also preferable to use two or more kinds of the other inorganic substances having different average particle diameters. For example, it is also preferable to use both other inorganic substances having an average particle diameter of 1 to 200 μm and other inorganic substances having an average particle diameter of 100 nm or greater and less than 1 μm.

In a case where the composition contains the other inorganic substances, the content of the other inorganic substances in the composition is preferably 10% to 95% by mass, more preferably 20% to 60% by mass, and even more preferably 30% to 45% by mass, with respect to the total solid content of the composition.

[Other Surface Modifiers]

In addition, it is also preferable that (preferably in a case where the composition contains the other inorganic substances (an inorganic oxide and the like),) the composition contains an organic silane molecule (preferably, a compound having an alkoxysilyl group) as other surface modifiers (preferably a surface modifier for an inorganic oxide and more preferably a surface modifier for aluminum oxide) other than the specific compound.

Examples of the organic silane molecule which is the other surface modifier include 3-aminopropyl triethoxysilane, 3-(2-aminoethyl)aminopropyl triethoxysilane, 3-aminopropyl trimethoxysilane, 3-(2-aminoethyl)aminopropyl trimethoxysilane, N-phenyl-3-aminopropyl trimethoxysilane, 3-mercapto triethoxysilane, and 3-ureidopropyl triethoxysilane.

One kind of the surface modifiers may be used singly, or two or more kinds thereof may be used.

The content of the organic silane molecule as the surface modifier (preferably, the organic silane molecule which is the other surface modifier) is preferably 0.01% to 10% by mass and more preferably 0.1% to 5% by mass, with respect to the content of the other inorganic substances (preferably an inorganic oxide such as aluminum oxide).

[Curing Accelerator]

The composition may further contain a curing accelerator.

A kind of the curing accelerator is not limited, and examples thereof include triphenylphosphine, 2-ethyl-4-methylimidazole, a boron trifluoride-amine complex, l-benzyl-2-methylimidazole, and the compound described in paragraph 0052 in JP2012-067225 A.

One kind of the curing accelerators may be used singly, or two or more kinds thereof may be used.

In a case where the composition contains a curing accelerator, a content of the curing accelerator is preferably 0.01% to 10% by mass and more preferably 0.1% to 5% by mass, with respect to the total content of the epoxy compound and the specific compound having an epoxy group.

[Dispersant]

The composition may further contain a dispersant.

In a case where the composition contains a dispersant, the dispersibility of the inorganic substance in the composition is improved, and thus superior thermal conductivity and adhesiveness can be achieved.

The dispersant can be appropriately selected from commonly used dispersants. Examples thereof include DISPERBYK-106 (produced by BYK-Chemie GmbH), DISPERBYK-111 (produced by BYK-Chemie GmbH), ED-113 (produced by Kusumoto Chemicals, Ltd.), AJISPER PN-411 (produced by Ajinomoto Fine-Techno Co., Inc.), and REB 122-4 (produced by Hitachi Chemical Company, Ltd.).

One kind of the dispersants may be used singly, or two or more kinds thereof may be used.

In a case where the composition contains a dispersant, a content of the dispersant is preferably 0.01% to 10% by mass and more preferably 0.1% to 5% by mass, with respect to the content of the inorganic substance.

[Solvent]

The composition may further contain a solvent.

A kind of the solvent is not particularly limited, and an organic solvent is preferable. Examples of the organic solvent include cyclopentanone, cyclohexanone, ethyl acetate, methyl ethyl ketone, dichloromethane, and tetrahydrofuran.

In a case where the composition contains a solvent, a content of the solvent is preferably an amount such that the concentration of the solid contents in the composition is 20% to 90% by mass, more preferably an amount such that the concentration is 30% to 85% by mass, and even more preferably an amount such that the concentration is 40% to 85% by mass.

[Method for Producing Compositions]

A method for producing the composition is not particularly limited, known methods can be adopted, and for example, the composition can be produced by mixing the aforementioned various components. In a case of mixing, the various components may be mixed at a time or mixed sequentially.

A method for mixing the components is not particularly limited, and known methods can be used. A mixing device used for the mixing is preferably a submerged disperser, and examples thereof include a rotating and revolving mixer, a stiffer such as a high-speed rotating shear-type stiffer, a colloid mill, a roll mill, a high-pressure injection-type disperser, an ultrasonic disperser, a beads mill, and a homogenizer. One kind of the mixing devices may be used singly, or two or more kinds thereof may be used. A deaeration treatment may be performed before and after the mixing and/or simultaneously with the mixing.

[Method for Curing Composition]

The composition according to the embodiment of the present invention is preferably a composition for forming a thermally conductive material.

The composition according to the embodiment of the present invention is subjected to a curing treatment to obtain a thermally conductive material.

A method for curing the composition is not particularly limited, but a thermal curing reaction is preferable.

A heating temperature during the thermal curing reaction is not particularly limited. For example, the heating temperature may be appropriately selected within the range of 50° C. to 250° C. Moreover, in a case where the thermal curing reaction is performed, a heating treatment at different temperatures may be performed a plurality of times.

The curing treatment is preferably performed on the composition which is formed in a film shape or a sheet shape. Specifically, for example, the composition may be applied to form a film, and a curing reaction may be performed.

In a case where the curing treatment is performed, it is preferable to apply the composition onto a substrate to form a coating film, and then cure the coating film. In this case, after further bringing the coating film formed on the substrate into contact with another substrate, the curing treatment may be performed. A cured substance (thermally conductive material) obtained after the curing may or may not be separated from one or both of the substrates.

Furthermore, in a case where the curing treatment is performed, after applying the composition onto different substrates to form respective coating films, the curing treatment may be performed in a state where the obtained coating films are in contact with each other. A cured substance (thermally conductive material) obtained after the curing may or may not be separated from one or both of the substrates.

During the curing treatment, press working may be performed. A press used for the press working is not limited, and for example, a flat plate press may be used, or a roll press may be used.

In a case where the roll press is used, for example, it is preferable that a substrate with a coating film, which is obtained by forming a coating film on a substrate, is sandwiched between a pair of rolls in which two rolls face each other, and while rotating the pair of rolls to cause the substrate with a coating film to be passed, a pressure is applied in a film thickness direction of the substrate with a coating film. In the substrate with a coating film, a substrate may be present on only one surface of a coating film, or a substrate may be present on both surfaces of a coating film. The substrate with a coating film may be passed through the roll press only once or a plurality of times.

Only one of the treatment with the flat plate press and the treatment with the roll press may be performed, or both the treatments may be performed.

In addition, the curing treatment may be completed when the composition is in a semi-cured state. The semi-cured thermally conductive material of the present invention may be disposed so as to be in contact with a device to be used or the like, and then further cured by heating or the like to be finally cured. It is also preferable that the device and the thermally conductive material of the present invention adhere to each other by heating or the like during the final curing.

Regarding the preparation of the thermally conductive material including a curing reaction, "Highly Thermally Conductive Composite Material" (CMC Publishing CO., LTD., written by Yoshitaka TAKEZAWA) can be referred to.

A shape of the thermally conductive material is not particularly limited, and the thermally conductive material can be molded into various shapes according to the use. Examples of a typical shape of the molded thermally conductive material include a sheet shape.

That is, it is also preferable that the thermally conductive material formed of the composition according to the embodiment of the present invention is a thermally conductive sheet.

Furthermore, the thermally conductive properties of the thermally conductive material formed of the composition according to the embodiment of the present invention are preferably isotropic rather than anisotropic.

The thermally conductive material preferably has insulating properties (electrical insulating properties). In other words, the composition according to the embodiment of the present invention is preferably a thermally conductive insulating composition.

For example, a volume resistivity of the thermally conductive material at 23° C. and a relative humidity of 65% is preferably $10^{10}$ Ω·cm or greater, more preferably $10^{12}$ Ω·cm or greater, and even more preferably $10^{14}$ Ω·cm or greater. The upper limit thereof is not particularly limited, but is generally $10^{18}$ Ω·cm or less.

[Use of Thermally Conductive Material]

The thermally conductive material formed of the composition according to the embodiment of the present invention can be used as a heat dissipation material such as a heat dissipation sheet, and can be used for dissipating heat from various devices. More specifically, a device with a thermally conductive layer is prepared by disposing a thermally conductive layer, which contains the thermally conductive material of the present invention, on a device, and thus the heat generated from the device can be efficiently dissipated by the thermally conductive layer. The thermally conductive layer may be a thermally conductive layer including a thermally conductive multilayer sheet which will be described later.

The thermally conductive material formed of the composition according to the embodiment of the present invention has sufficient thermally conductive properties and high heat resistance, and thus is suitable for dissipating heat from a power semiconductor device used in various electrical machines such as a personal computer, a general household electric appliance, and an automobile.

Furthermore, the thermally conductive material formed of the composition according to the embodiment of the present invention has sufficient thermally conductive properties even in a semi-cured state, and thus can also be used as a heat dissipation material which is disposed in a portion where light for photocuring is hardly reached, such as a gap between members of various devices. Moreover, the thermally conductive material also has excellent adhesiveness, and thus can also be used as an adhesive having thermally conductive properties.

The thermally conductive material formed of the composition according to the embodiment of the present invention may be used in combination with members other than the members formed of the present composition.

For example, a sheet-shaped thermally conductive material (thermally conductive sheet) may be combined with a sheet-shaped support in addition to the layer formed of the present composition.

Examples of the sheet-shaped support include a plastic film, a metal film, and a glass plate. Examples of a material for the plastic film include polyester such as polyethylene terephthalate (PET), polycarbonate, an acrylic resin, an epoxy resin, polyurethane, polyamide, polyolefin, a cellulose derivative, and silicone. Examples of the metal film include a copper film.

A film thickness of the sheet-shaped thermally conductive material (thermally conductive sheet) is preferably 100 to 300 μm and more preferably 150 to 250 μm.

Moreover, an adhesive layer and/or a pressure sensitive adhesive layer may be combined with the thermally conductive material (preferably thermally conductive sheet).

By bonding the thermally conductive material to an object to which heat is to be transferred, such as a device, via such an adhesive layer and/or a pressure sensitive adhesive layer, firmer bonding between the thermally conductive material and the object can be achieved.

For example, as the thermally conductive multilayer sheet, a thermally conductive multilayer sheet may be prepared which has a thermally conductive sheet, and an adhesive layer or a pressure sensitive adhesive layer which is provided on one surface or both surfaces of the thermally conductive sheet.

Furthermore, on one surface or both surfaces of the thermally conductive sheet, one of the adhesive layer and the pressure sensitive adhesive layer may be provided, or the both layers may be provided. The adhesive layer may be provided on one surface of the thermally conductive sheet, and the pressure sensitive adhesive layer may be provided on the other surface thereof. Moreover, on one surface or both surfaces of the thermally conductive sheet, the adhesive layer and/or the pressure sensitive adhesive layer may be partially provided, or may be provided over the entire surface.

As described above, the thermally conductive material such as the thermally conductive sheet in the present invention may be in a semi-cured state (semi-cured film), and the thermally conductive sheet in the thermally conductive multilayer sheet may be in a semi-cured state. The adhesive layer in the thermally conductive multilayer sheet may be cured, may be in a semi-cured state, or may be in an uncured state.

<Adhesive Layer>

The adhesive layer preferably contains at least one kind of compound (a resin and/or a low-molecular-weight body) having adhesiveness.

The adhesive layer may further contain other components such as a filler, as needed.

As the compound having adhesiveness, a compound having insulating properties, adhesiveness, and/or flexibility, during adhesion, is preferable.

In particular, from the viewpoints of the adhesiveness and the insulating properties, it is preferable to contain at least one kind selected from the group consisting of a polyimide resin, a modified polyimide resin, a polyamide imide resin, a modified polyamide imide resin, and an epoxy compound.

The epoxy compound may be an epoxy resin containing an acryl-modified rubber.

Examples of the polyimide resin and the modified polyimide resin include products represented by UPICOAT FS-IDOL (produced by UBE INDUSTRIES, LTD.), SEMICOFINE SP-300, SP-400, and SP-800 (produced by TORAY INDUSTRIES, INC.). U-IMIDE SERIES (produced by UNITIKA LTD.), and the like.

Examples of the polyamide imide resin or the modified polyamide imide resin include KS SERIES (produced by Hitachi Chemical Company, Ltd.), VYLOMAX SERIES (produced by TOYOBO CO., LTD.), and TORLON (produced by Solvay Advanced Polymers, LLC).

Among them, from the viewpoints of high heat resistance and high adhesiveness, it is preferable to use a modified polyamide imide resin represented by KS SERIES (produced by Hitachi Chemical Company, Ltd.).

One kind of the polyimide resin, the polyamide imide resin, and the modified polyamide imide resin, which are used for the adhesive layer, may be used singly, or two or more kinds thereof may be used.

Moreover, these resins are generally in a varnish state where the resin is dissolved in a solvent, and can also be used as an adhesive layer by applying the resin directly to a support such as a PET film and drying the solvent to form a film.

Furthermore, an epoxy compound may be used as the compound having adhesiveness. Specifically, for example, an epoxy composition containing an epoxy compound, a curing agent therefor, and a curing accelerator may be used as the adhesive layer. It is also preferable that glycidyl acrylate is added to the epoxy composition.

For details of the epoxy composition, for example, the descriptions of JP2002-134531A, JP2002-226796A, JP2003-221573A, and the like can also be referred to.

The epoxy compound used for the adhesive layer is not particularly limited as long as the epoxy compound is cured to exhibit an adhesive action. For example, in a case where a bisphenol A-type or bisphenol F-type liquid epoxy compound having a molecular weight of 500 or less is used, fluidity during lamination can be improved. A polyfunctional epoxy compound may be added for the purpose of increasing a glass transition temperature (Tg), and examples of the polyfunctional epoxy compound include a phenol novolac-type epoxy compound and a cresol novolac-type epoxy compound.

As the epoxy compound used for the adhesive layer, the epoxy compounds described as the epoxy compound, which can be used in the composition according to the embodiment of the present invention, may be used.

Examples of the curing agent for the epoxy compound include polyamide, polyamine, an acid anhydride, polysulfide, boron trifluoride, and a phenolic compound (a phenol novolac resin, and bisphenol A, bisphenol F, bisphenol S. or the like, which is a compound having two or more phenolic hydroxyl groups in one molecule). From the viewpoint of excellent electrolytic corrosion resistance during moisture absorption, it is also preferable to use a phenol novolac resin, a bisphenol novolac resin, a cresol novolac resin, or the like, which is a phenolic compound.

Moreover, as the curing agent, the phenolic compounds described as the phenolic compound, which can be used in the composition according to the embodiment of the present invention, may be used.

In a case where the curing agent is used, it is preferable to use a curing accelerator together with the curing agent. It is also preferable to use imidazole as the curing accelerator. Examples of the imidazole include 2-methylimidazole, 2-ethyl-4-methylimidazole, 1-cyanoethyl-2-phenylimidazole, and 1-cyanoethyl-2-phenylimidazolium trimellitate. The imidazoles are commercially available, for example, from SHIKOKU CHEMICALS CORPORATION under the trade names of 2E4MZ, 2PZ-CN, and 2PZ-CNS.

As the curing accelerator, the curing accelerators described as the effect promoter (triphenylphosphine or the like), which can be used in the composition according to the embodiment of the present invention, may be used.

It is also preferable that the epoxy compound used for the adhesive layer is used in combination with a high-molecular-weight resin compatible with the epoxy compound.

Examples of the high-molecular-weight resin compatible with the epoxy compound include a high-molecular-weight epoxy compound, a highly polar functional group-containing rubber, and a highly polar functional group-containing reactive rubber.

Examples of the highly polar functional group-containing reactive rubber include an acryl-modified rubber obtained by adding a highly polar functional group such as a carboxyl group to an acrylic rubber.

Here, being compatible with the epoxy compound means a property of forming a homogeneous mixture without being divided into two or more phases by being separated from the epoxy compound after curing.

A weight-average molecular weight of the high-molecular-weight resin is not particularly limited. From the viewpoints that tackiness of the adhesive in a B stage is reduced, or flexibility during curing is improved, the weight-average molecular weight is preferably 30,000 or greater.

The high-molecular-weight epoxy compound includes a high-molecular-weight epoxy compound having a molecular weight of 30,000 to 80,000, and an ultra-high-molecular-weight epoxy compound having a molecular weight of greater than 80,000 (see JP 1995-059617B (JP-H07-059617B), JP 1995-059618B (JP-H07-059618B), JP 1995-059619B (JP-H07-059619B), JP1995-05%20B (JP-H07-059620B), JP 1995-064911B (JP-H07-00491 IB), and JP1995-0683278 (JP-H07-068327B)), both of which are produced by Hitachi Chemical Company, Ltd. As a carboxyl group-containing acrylic rubber, which is the highly polar functional group-containing reactive rubber, HTR-860P (trade name) is sold, for example, by Nagase ChemteX Corporation.

In a case where the high-molecular-weight resin which is compatible with the epoxy compound and has a weight-average molecular weight of 30,000 or greater is used, and the resin constituting the adhesive layer is 100 parts by mass, the addition amount thereof is preferably 10 parts by mass or greater or preferably 40 parts by mass or less.

In a case where the addition amount is 10 parts by mass or greater, improvement in flexibility of a phase (hereinafter, referred to as an epoxy compound phase) containing the epoxy compound as a main component, improvement in tackiness, and/or suppression of cracks is likely to be achieved, and insulating properties are less likely to deteriorate. In a case where the addition amount is 40 parts by mass or less, a Tg of the epoxy compound phase can be improved.

A weight-average molecular weight of the high-molecular-weight epoxy compound is preferably 20,000 to 501,000. Within this range, the strength and/or flexibility in a sheet state and/or a film state is improved, and tackiness is also likely to be suppressed.

One kind of the polyamide imide resin, the modified polyamide imide resin, and the epoxy compound, which are suitably used for the adhesive layer, may be used singly, or two or more kinds thereof may be used.

Moreover, these compounds may be a mixture in a varnish state where the compounds are dissolved in a solvent. By applying such a mixture directly to a support such as a PET film and drying the solvent, the compounds are formed into a film, and can be used as an adhesive layer.

(Silane Coupling Agent)

A silane coupling agent may be formulated in the adhesive layer in order to improve an interfacial bond between different kinds of materials.

Examples of the silane coupling agent include 7-glycidoxypropyltrimethoxysilane, γ-mercaptopropyltrimethoxysilane, γ-aminopropyltriethoxysilane, γ-ureidopropyltriethoxysilane, and N-β-aminoethyl-γ-aminopropyltrimethoxysilane.

Among them, from the viewpoint of adhesive strength, γ-mercaptopropyltrimethoxysilane or γ-aminopropyltriethoxysilane is preferable.

In a case where the adhesive layer contains the silane coupling agent, a formulation amount thereof is preferably 0.1 to 10 parts by mass with respect to 100 parts by mass of the compound having adhesiveness, from the viewpoint of an effect of addition and/or an influence on heat resistance.

(Filler)

The adhesive layer may contain a filler (preferably an inorganic filler).

In a case where the adhesive layer contains the filler, the handleability or thermally conductive properties of the adhesive layer are improved. Moreover, it is possible to impart flame retardance, adjust a melt viscosity, impart thixotropic properties, and/or improve surface hardness.

In a case where the adhesive layer contains the filler, a content thereof is not particularly limited. In particular, the content is preferably 20 to 50 parts by volume with respect to 100 parts by volume of the compound having adhesiveness, which is contained in the adhesive layer.

From the viewpoint of an effect of the formulation, the content is more preferably 30 parts by volume or greater. Moreover, from the viewpoints that deterioration in insulating properties or the like is suppressed by achieving optimization of a storage elastic modulus of the adhesive, improvement in adhesiveness, and/or suppression of voids, it is also preferable that the content is 50 parts by volume or less.

Examples of the inorganic filler include aluminum hydroxide, magnesium hydroxide, calcium carbonate, magnesium carbonate, calcium silicate, magnesium silicate, calcium oxide, magnesium oxide, alumina (aluminum oxide), aluminum nitride, aluminum borate whisker, boron nitride, crystalline silica, amorphous silica, silicon nitride, talc, mica, and barium sulfate.

Among them, from the viewpoints that heat dissipating properties are favorable due to high thermal conductivity, impurities are likely to be controlled, and heat resistance and insulating properties are favorable, alumina, boron nitride, or aluminum nitride is preferable.

One kind of the fillers may be used singly, or two or more kinds thereof may be used.

An average particle diameter of the filler contained in the adhesive layer is not particularly limited. For example, from the viewpoint of thermally conductive properties, the average particle diameter is preferably 0.1 to 10 μm and more preferably 0.2 to 5 μm.

From the viewpoint of balancing adhesiveness and thermally conductive properties, it is also preferable that a content of the filler in the adhesive layer is 50% by volume or less (for example, 20% by volume to 50% by volume) with respect to the total volume of the adhesive layer.

From the viewpoints of adhesive strength and thermal conductivity, it is particularly preferable that the adhesive layer contains, as the compound having adhesiveness, at least one kind selected from the group consisting of the epoxy compound and the modified polyamide imide resin, and contains, as the filler, at least one kind selected from the group consisting of alumina and silicon oxide, the content of the filler is 25 parts by volume to 100 parts by volume with respect to 100 parts by volume of the compound having adhesiveness, and the average particle diameter of the filler is 0.2 to 5 μm.

The film thickness of the adhesive layer is preferably 1 to 16 μm, more preferably 2 to 15 μm, even more preferably 3 to 14 μm, and particularly preferably 4 to 12 μm, from the viewpoints of thermal conductivity and adhesiveness.

The film thickness of the adhesive layer can be measured using a micrometer, a stylus-type film thickness meter, a needle-type film thickness meter, or the like.

<Pressure Sensitive Adhesive Layer>

As a material for the pressure sensitive adhesive layer, various pressure sensitive adhesives and/or thermosetting materials can be used without particular limitation as long as these materials have the required heat resistance performance and thermally conductive performance. Moreover, a pressure sensitive adhesive of which the thermally conductive properties are improved by mixing various thermally conductive fillers in the pressure sensitive adhesive layer may be used.

Examples of the pressure sensitive adhesive, which forms the pressure sensitive adhesive layer, include an acrylic pressure sensitive adhesive, an olefin-based pressure sensitive adhesive, a silicone-based pressure sensitive adhesive, a natural rubber-based pressure sensitive adhesive, and a synthetic rubber-based pressure sensitive adhesive.

From the viewpoint that outgas is less likely to be generated in the use near a semiconductor in an electronic machine, an acrylic pressure sensitive adhesive or an olefin-based pressure sensitive adhesive is preferable. Moreover, from the viewpoint of heat resistance, a silicone-based pressure sensitive adhesive containing a silicone resin as a main raw material is preferable.

Furthermore, the "pressure sensitive adhesive containing a silicone resin as a main raw material" is a pressure sensitive adhesive containing 60% by mass or greater (preferably 80% by mass or greater) of the silicone resin.

Examples of the pressure sensitive adhesive containing a silicone resin as a main raw material include a peroxide crosslinking (curing)-type silicone-based pressure sensitive adhesive and an addition reaction-type silicone-based pressure sensitive adhesive. Among them, from the viewpoints that the thickness accuracy is high in a case of being formed into a thin layer, and the pressure sensitive adhesive layer can be easily formed by a transfer method, an addition reaction-type silicone-based pressure sensitive adhesive is preferable.

Examples of the addition reaction-type silicone-based pressure sensitive adhesive include pressure sensitive adhesives which contain a silicone rubber and a silicone resin, and further contain, as needed, an additive such as a crosslinking agent, a filling agent, a plasticizer, an antiaging agent, an antistatic agent, and/or a colorant (a pigment, a dye, or the like).

The silicone rubber is not particularly limited as long as the silicone rubber is a silicone-based rubber component, but a silicone rubber, which contains an organopolysiloxane (in particular, organopolysiloxane having methylphenylsiloxane as a main constitutional unit) having a phenyl group, is preferable. Various functional groups such as a vinyl group may be introduced into organopolysiloxane in such a silicone rubber, as needed.

The silicone resin is not particularly limited as long as the silicone resin is a silicone-based resin used for a silicone-based pressure sensitive adhesive, and examples thereof include a silicone resin which contains organopolysiloxane consisting of a (co)polymer having at least one kind of unit selected from the group consisting of a unit consisting of a constitutional unit "$R_3SiO_{1/2}$", a unit consisting of a constitutional unit "$SiO_2$", a unit consisting of a constitutional unit "$RSiO_{3/2}$", and a unit consisting of a constitutional unit "$R_2SiO$". Furthermore, R in the constitutional unit represents a hydrocarbon group or a hydroxyl group.

Examples of the acrylic pressure sensitive adhesive include a homopolymer and a copolymer of (meth)acrylic acid and/or (meth)acrylic acid ester.

Among them, from the viewpoint of flexibility, chemical stability, workability, and/or controllability of pressure sensitive adhesive properties is excellent, the acrylic pressure sensitive adhesive is preferably a poly(meth)acrylic acid ester-based high-molecular-weight compound containing butyl acrylate, 2-ethylhexyl acrylate, or the like as a main raw material component.

The high-molecular-weight compound is preferably a copolymer having a structure in which a polar group such as a —COOH group, a —CN group, and an —OH group is introduced by copolymerizing one or more monomers selected from butyl acrylate, ethyl acrylate, 2-ethylhexyl acrylate, and the like with acrylic acid, acylonitrile, and/or hydroxyethyl acrylate.

In addition, a crosslinked structure may be introduced into the acrylic pressure sensitive adhesive as long as flexibility is not impaired.

By introducing the crosslinked structure, long-term close adhesion retaining properties and film hardness are likely to be improved. For example, the crosslinked structure can be introduced to a polymer having a polar group such as an —OH group by reacting, with the polar group, a compound having a functional group, such as a plurality of isocyanate groups or epoxy groups, which is bonded to the polar group.

EXAMPLES

Hereinafter, the present invention will be described in more detail based on Examples. The materials, the amount and proportion of the materials used, the details of treatments, the procedure of treatments, and the like shown in the following Examples can be appropriately changed within a range that does not depart from the gist of the present invention. Accordingly, the scope of the present invention is not limitedly interpreted by the following Examples.

[Preparation and Evaluation of Composition]

[Various Components]

Various components used in Examples and Comparative Examples will be shown below.

<Phenolic Compound>

Phenolic compounds used in Examples and Comparative Examples will be shown below.

Moreover, the phenolic compound A-1 used in Examples was synthesized with reference to US49925% GA.

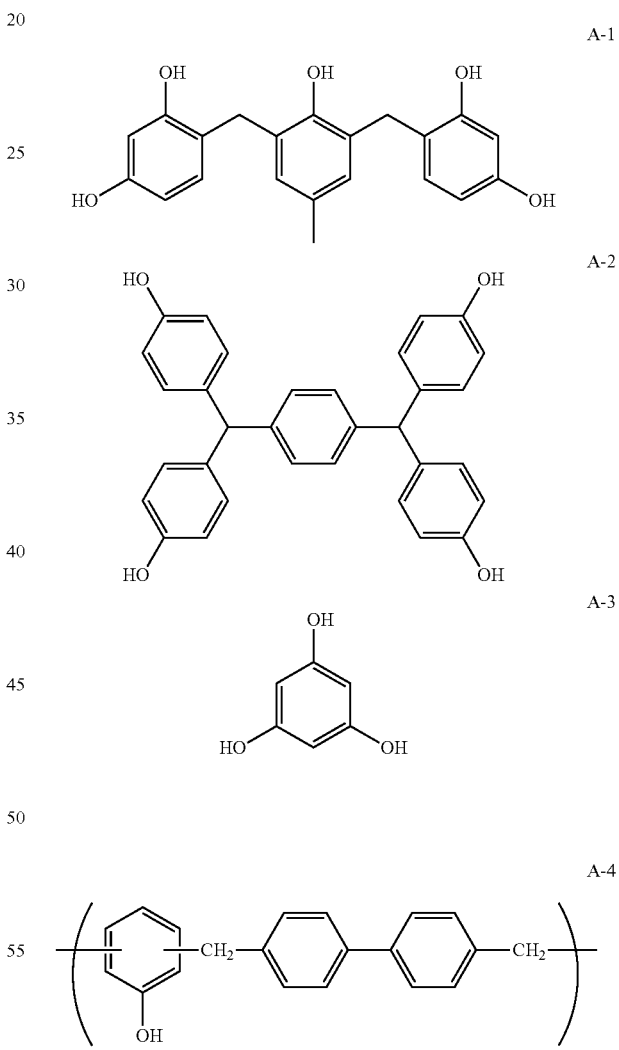

<Epoxy Compound>

Epoxy compounds used in Examples and Comparative Examples will be shown below.

Moreover, the following B-2 is a mixture of two kinds of epoxy compounds (trade name: EPOTOHTO ZX-1059, produced by Tohto Kasei Co., Ltd.).

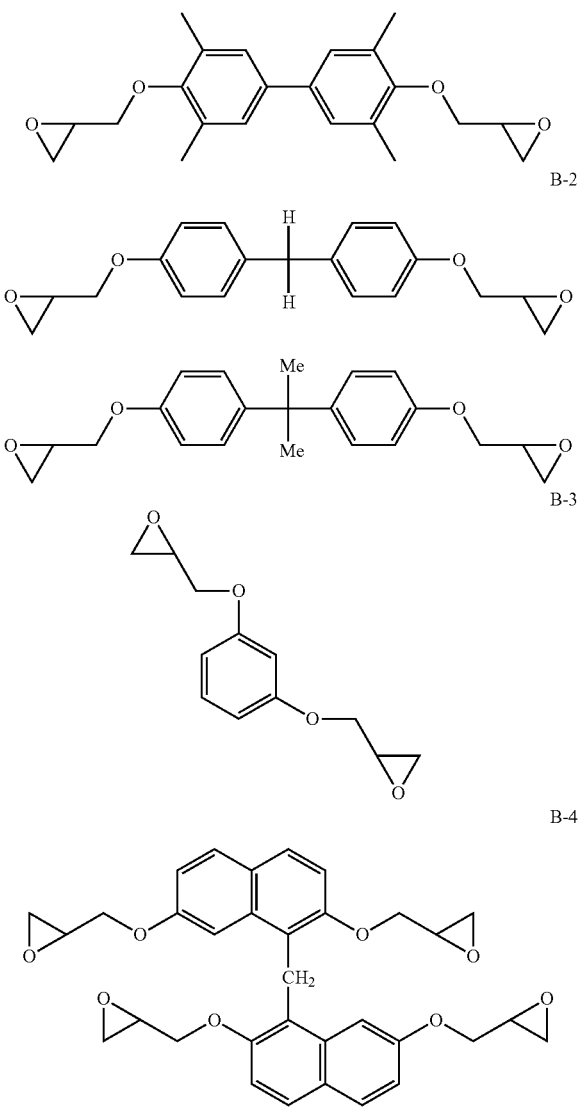

<Inorganic Substances (Inorganic Nitride and Other Inorganic Substances)>

Inorganic substances used in Examples and Comparative Examples will be shown below.

"AA-3": Aluminum oxide (average particle diameter: 3 μm, produced by Sumitomo Chemical Co., Ltd.)

"AA-04": Aluminum oxide (average particle diameter: 0.4 μm, produced by Sumitomo Chemical Co., Ltd.)

"PTX-60": Aggregation-shaped boron nitride (average particle diameter: 60 μm, produced by Momentive)

"HP40 MF 100": Aggregation-shaped boron nitride (average particle diameter: 40 μm, produced by MIZUSHIMA FERROALLOY CO., LTD.)

"SP-3": Scale-shaped boron nitride (average particle diameter: 4 μm, produced by Denka Company Limited)

<Curing Accelerator>

Triphenylphosphine ($PPh_3$) was used as the curing accelerator.

<Solvent>

Cyclopentanone was used as the solvent.

<Dispersant>

DISPERBYK-106 (polymer salt having an acidic group) was used as the dispersant.

<Surface Modifier for Aluminum Oxide (Organic Silane Molecule)>

The following compound was used as the surface modifier for aluminum oxide.

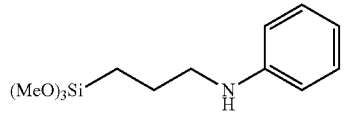

<Surface Modifier for Inorganic Nitride>

Surface modifiers (specific compounds, or compounds for comparison) for an inorganic nitride used in Examples and Comparative Examples will be shown below. The following C-1 to C-25 are specific compounds, and D-1 to D-5 are compounds (compounds for comparison) which do not correspond to the specific compounds.

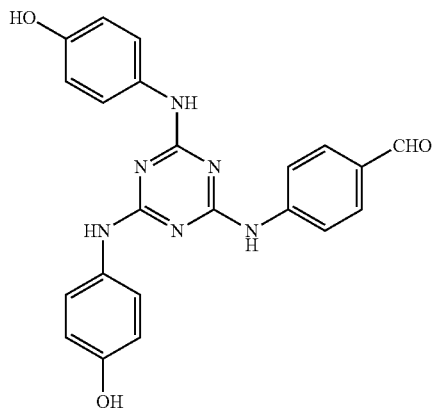

C-1

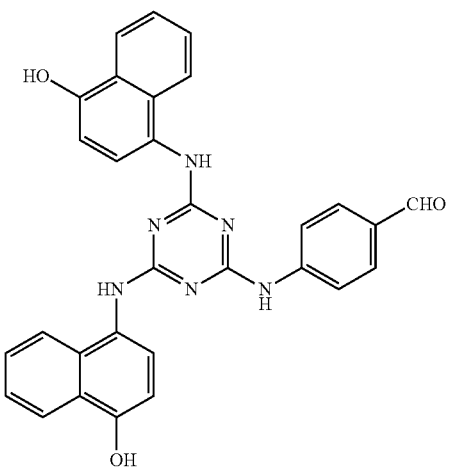

C-2

C-3
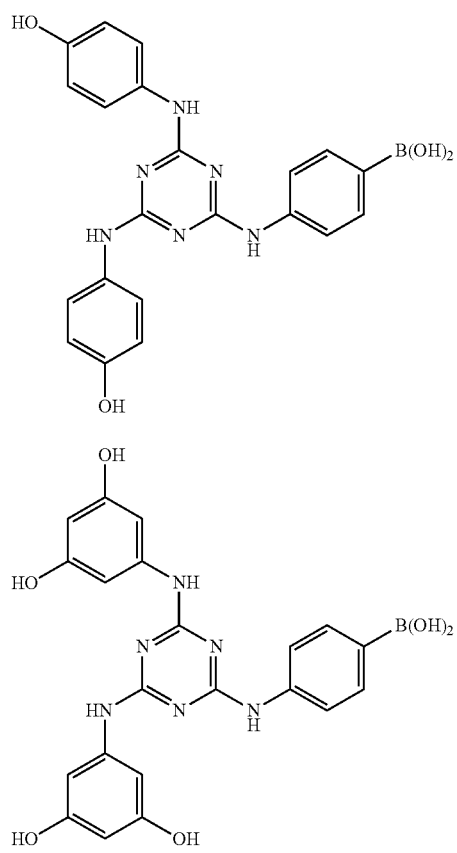
C-5
C-7
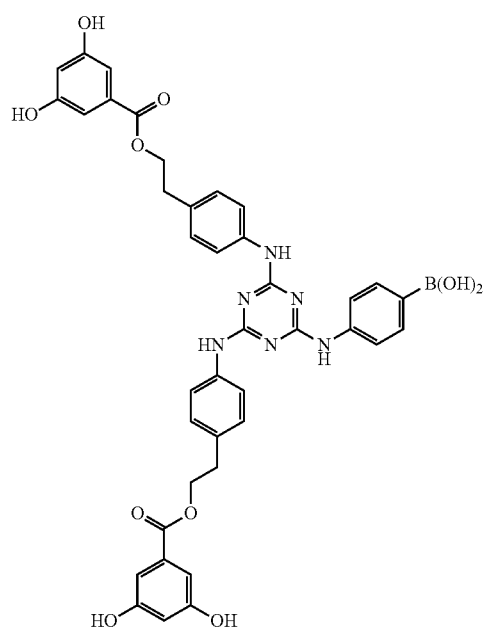
C-4
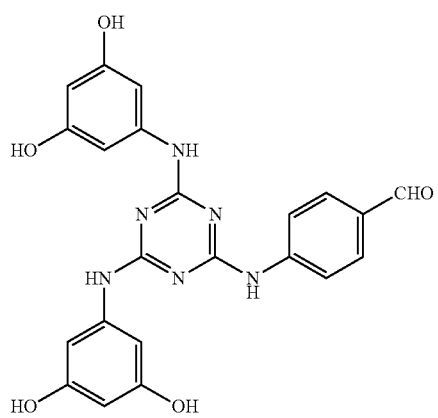
C-6
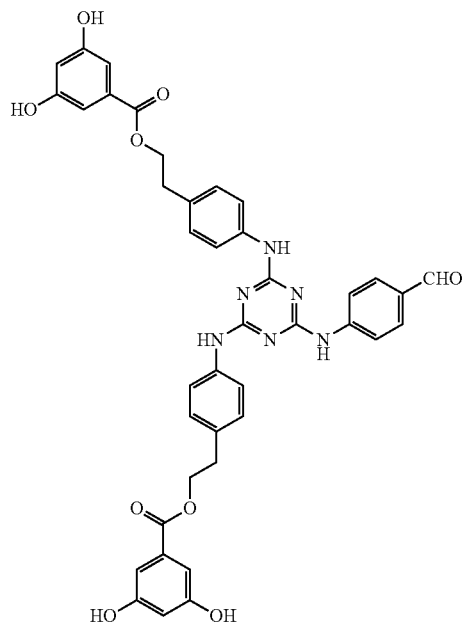
C-8
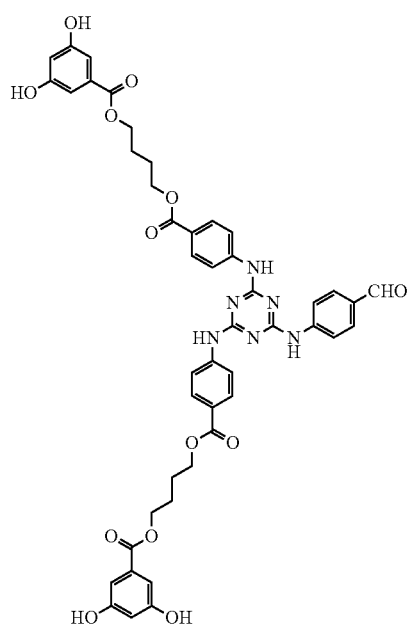

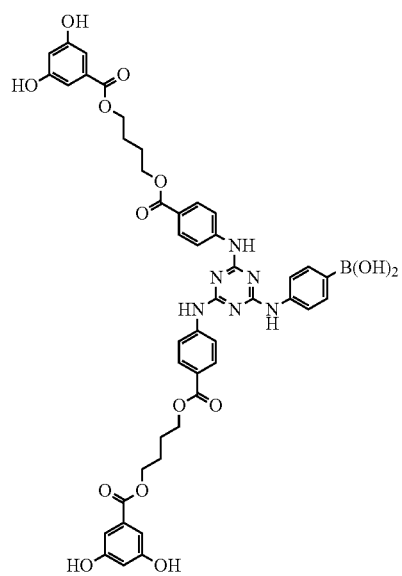
C-9
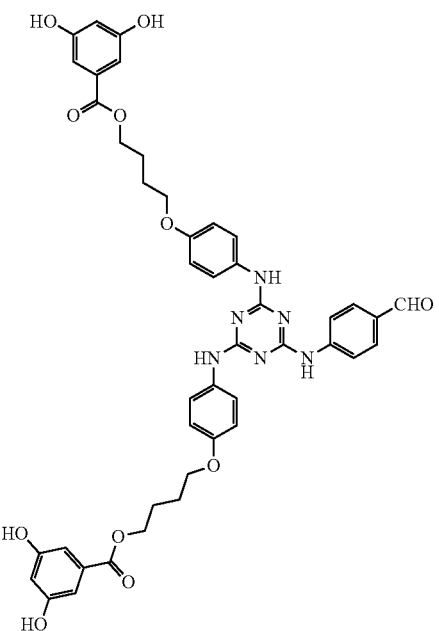
C-10
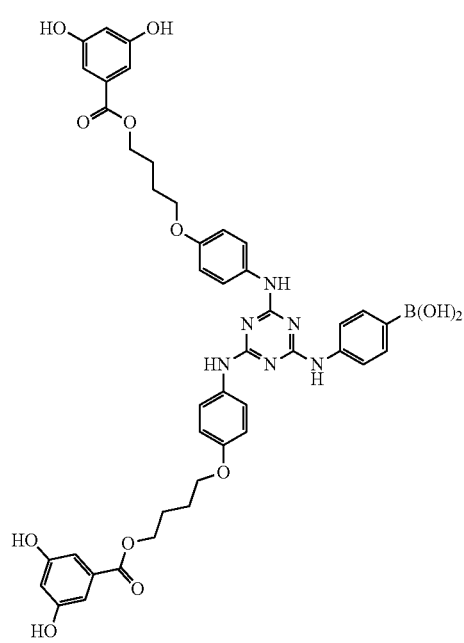
C-11

-continued
C-12
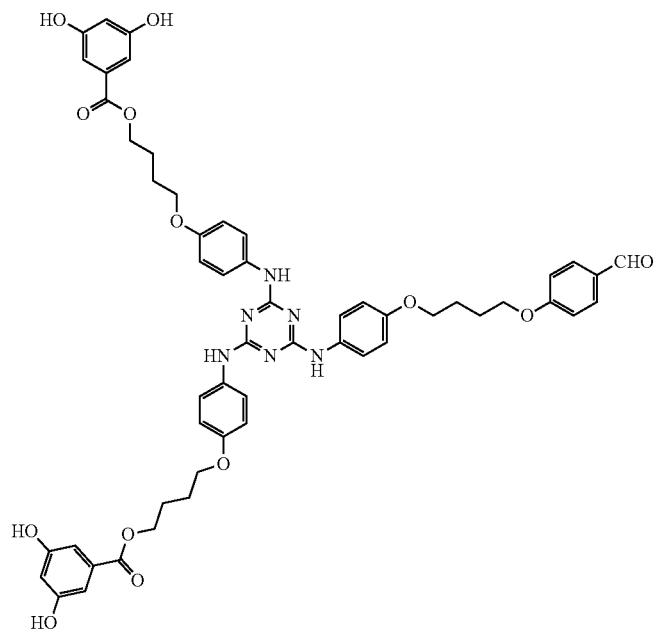
C-13
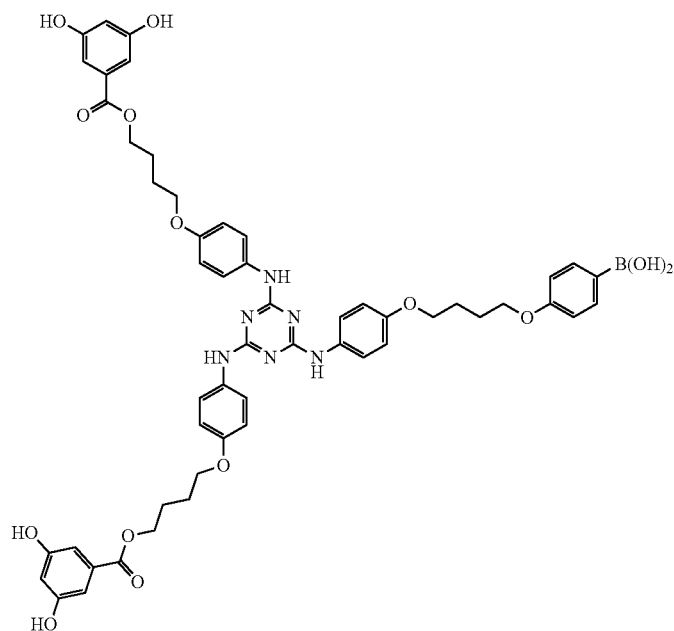
C-14
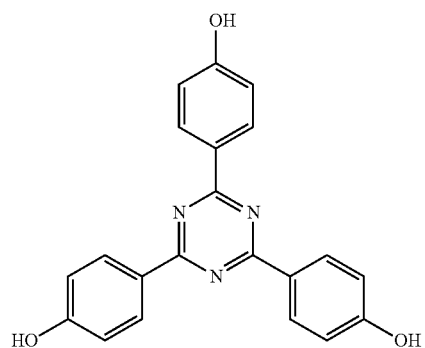
C-15
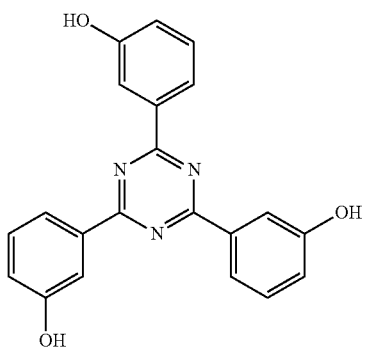

-continued
C-16
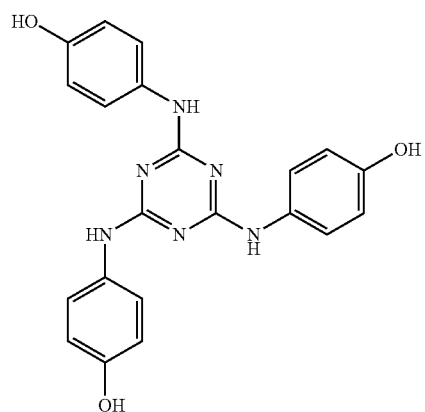
C-17
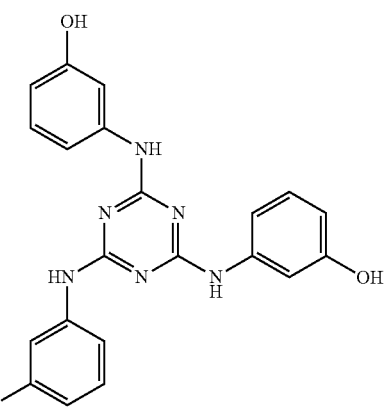
C-18
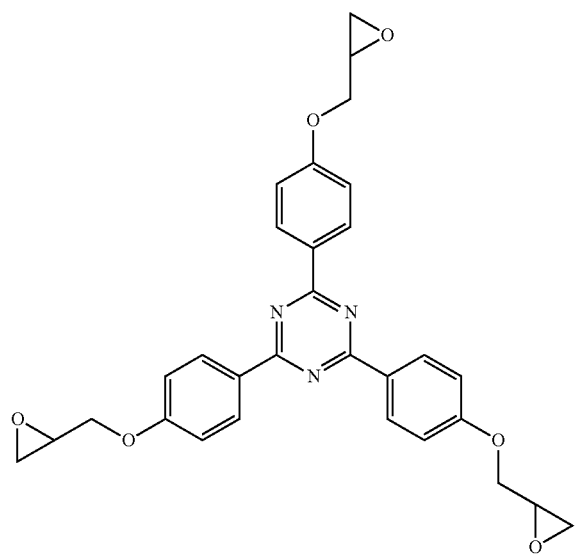
C-19
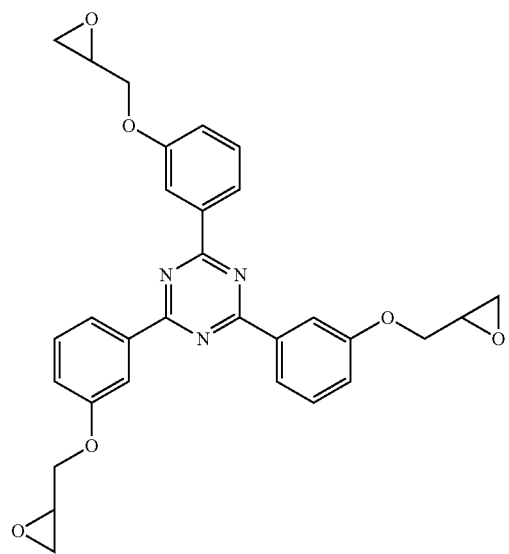
C-20
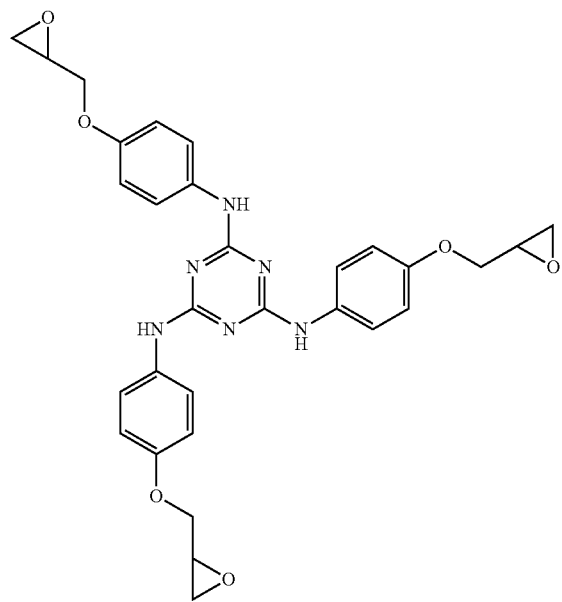
C-21
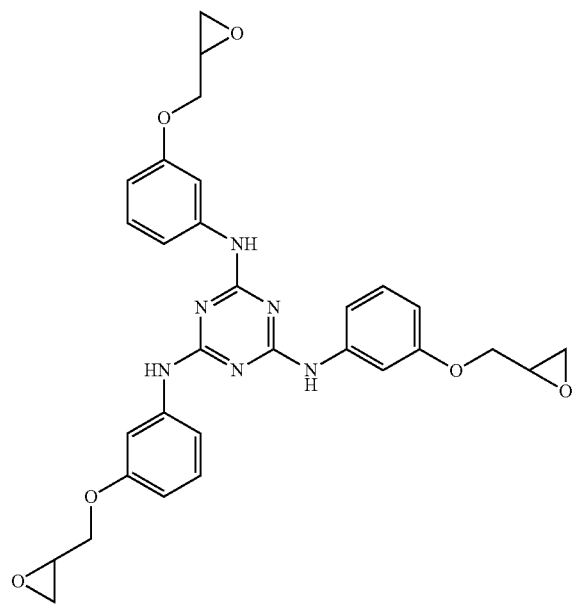

-continued
C-22
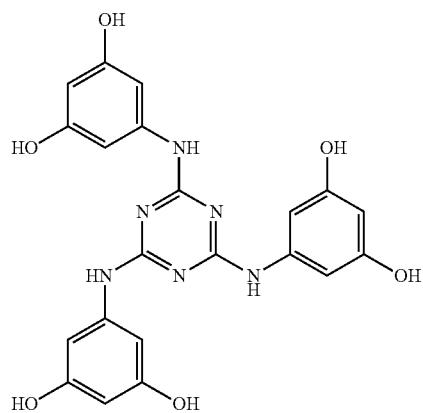
C-23
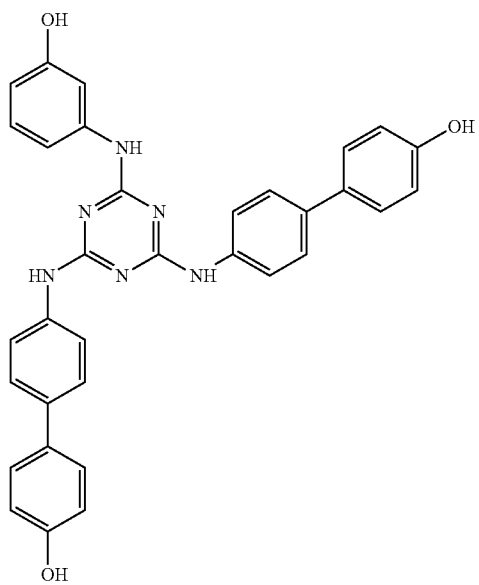
C-24
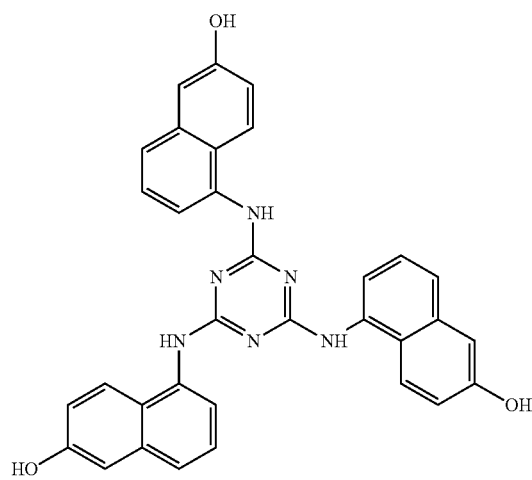
C-25
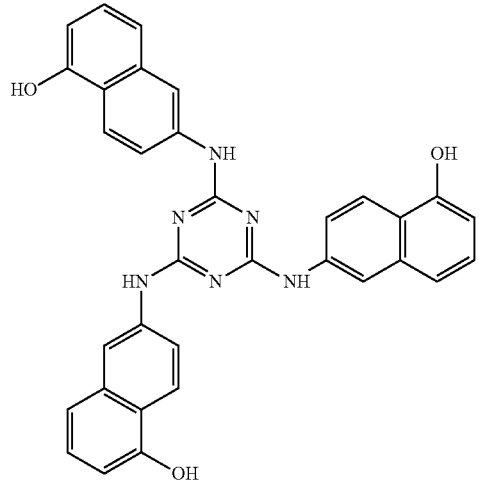
D-1
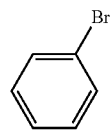
D-2
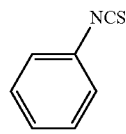
D-3
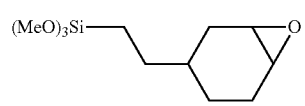
D-4
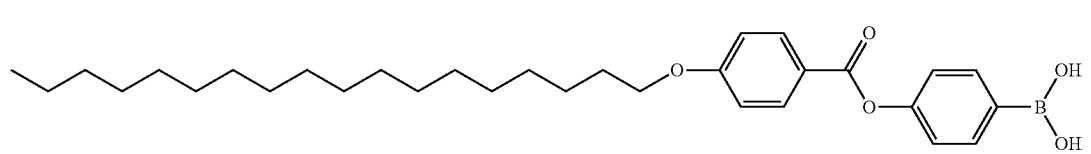

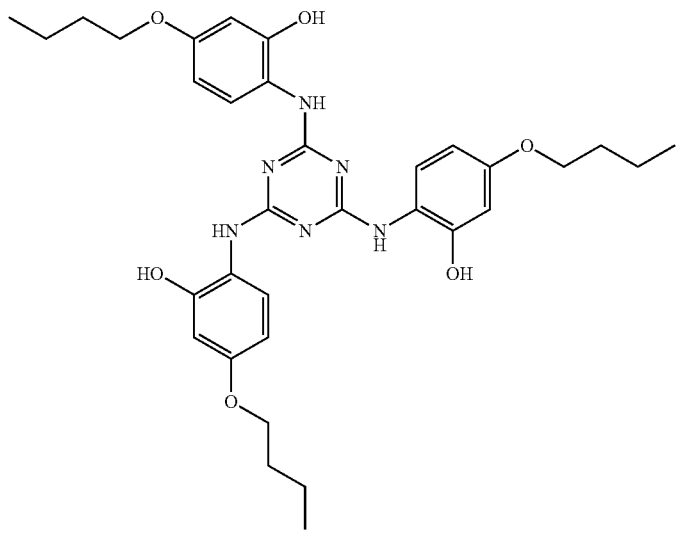

D-5

[Preparation of Composition]

A curing liquid was prepared by formulating the epoxy compound and the phenolic compound of each combination shown in Table 1 below in the addition amount (g) listed in Table 1.

The total amount of the obtained curing liquid, the solvent, the dispersant, the surface modifier (the surface modifier for aluminum oxide and the surface modifier for an inorganic nitride), and the curing accelerator were mixed in this order, and then the inorganic substances (the inorganic nitride and the inorganic oxide) were added thereto. The obtained mixture was treated for 5 minutes with a rotating and revolving mixer (manufactured by THINKY CORPORATION, AWATORI RENTARO ARE-310) to obtain a composition (composition for forming a thermally conductive material) of each Example or Comparative Example.

Here, the addition amount of the solvent was set such that the concentration of the solid contents in the composition was 50% to 80% by mass.

Furthermore, the concentration of the solid contents in the composition was adjusted for each composition within the above range so that the viscosities of the compositions were about the same.

The addition amount of the curing accelerator was set such that the content of the curing accelerator in the composition was 1% by mass with respect to the total content of the epoxy compound and the specific compound having an epoxy group.

The addition amount (the total addition amount of the inorganic nitride and the other inorganic substances) of the inorganic substances was set to the addition amount (g) shown in Table 1.

Moreover, the inorganic substances were used after being mixed so that a ratio (mass ratio) between contents of the respective inorganic substances satisfied a relationship shown in Table 1.

The addition amount of the dispersant was set such that the content of the dispersant in the composition was 0.2% by mass with respect to the content of the inorganic substance.

The addition amount of the surface modifier for aluminum oxide was set such that the content of the surface modifier for aluminum oxide in the composition was 0.2% by mass with respect to the content (total content of AA-3 and AA-04) of the aluminum oxide. Moreover, in a case where the composition did not contain aluminum oxide, the surface modifier for aluminum oxide was not used.

The addition amount of the surface modifier for an inorganic nitride (the specific compound, or the compound for comparison) was set to the addition amount (g) shown in Table 1.

[Evaluation]

<Thermally Conductive Properties> (Preparation of Thermally Conductive Sheet)

The prepared composition was uniformly applied onto a release surface of a release-treated polyester film (NP-100A, manufactured by PANAC CO., LTD., film thickness of 100 μm) by using an applicator, and left to stand at 120° C. for 5 minutes to obtain a coating film.

Two polyester films with such a coating film were prepared, and after laminating the coating film surfaces with each other, two polyester films with a coating film were hot-pressed (treated for 1 minute at a hot plate temperature of 65° C. and a pressure of 12 MPa) in the air to obtain a semi-cured film. The obtained semi-cured film was treated with a hot press (treated for 20 minutes at a hot plate temperature of 160° C. and a pressure of 12 MPa, and then for 90 minutes at 180° C. and a normal pressure) in the air to cure the coating film, thereby obtaining a resin sheet. The polyester films on both surfaces of the resin sheet were peeled off to obtain a thermally conductive sheet having an average film thickness of 200 μm.

(Preparation of Thermally Conductive Multilayer Sheet)
Preparation of Adhesive Layer Film 1: Epoxy-Based Adhesive Layer, and without Filler A coating liquid for an adhesive layer was obtained by mixing 21.6 parts by mass of B-3 as the epoxy compound, 13.3 parts by mass of A-1 as the phenolic compound, 0.21 parts by mass of triphenylphosphine ($PPh_3$) as the curing accelerator, and 64.9 parts by mass of cyclopentanone.

The prepared coating liquid for an adhesive layer was uniformly applied onto a release surface of a release-treated polyester film (NP-100A, manufactured by PANAC CO., LTD., film thickness of 100 μm) by using an applicator, and left to stand at 120° C. for 5 minutes to obtain a coating film. Moreover, the final adhesive layer was formed so that the film thickness was 5 μm.

Preparation of Adhesive Layer Film 2: Epoxy-Based Adhesive Layer, and with Filler A coating liquid for an adhesive layer was obtained by mixing 21.6 parts by mass of B-3 as the epoxy compound, 13.3 parts by mass of A-1 as the phenolic compound, 0.21 parts by mass of $PPh_3$ as the curing accelerator, 35 parts by mass of alumina AA-04, and 100 parts by mass of cyclopentanone.

The prepared coating liquid for an adhesive layer was uniformly applied onto a release surface of a release-treated polyester film (NP-100A, manufactured by PANAC CO., LTD., film thickness of 100 μm) by using an applicator, and left to stand at 120° C. for 5 minutes to obtain a coating film. Moreover, the final adhesive layer was formed so that the film thickness was 5 μm.

Preparation of Adhesive Layer Film 3: Acrylic Acid Ester Copolymer Resin, and without Filler A coating liquid for an adhesive layer was obtained by diluting an acrylic acid ester copolymer resin (HTR-280DF, produced by Nagase ChemteX Corporation, copolymer of butyl acrylate/acrylonitrile/acrylic acid, Mw: 900,000, Tg: −30.9° C. volume resistivity>$10^{13}$ Ω·m, and 15% by mass toluene solution) with a mixed solvent of methyl ethyl ketone and toluene.

The prepared coating liquid for an adhesive layer was uniformly applied onto a release surface of a release-treated polyester film (NP-100A, manufactured by PANAC CO., LTD., film thickness of 100 μm) by using an applicator, and left to stand at 120° C. for 5 minutes to obtain a coating film. Moreover, the final adhesive layer was formed so that the film thickness was 5 μm.

Furthermore, the layer formed of the acrylic acid ester copolymer resin is the pressure sensitive adhesive layer, but is referred to as an adhesive layer for convenience in Examples of the present specification.

Preparation of Multilayer Sheet

A semi-cured film (semi-cured film having polyester films on both surfaces thereof) was obtained by the same procedure as shown in the section of (Preparation of thermally conductive sheet).

The polyester films provided on the both surfaces of the semi-cured film were peeled off, the adhesive layer films were stacked so that the adhesive layer faced the semi-cured film, and the adhesive layers were attached using a laminator under conditions where a temperature was 120° C., a pressure was 0.7 MPa, a degree of vacuum ≤1 kPa was satisfied, and a time was 15 seconds, to obtain a multilayer sheet having adhesive coating films on the both surfaces of the semi-cured film.

Preparation of Multilayer Sheet-Cured Substance

The obtained multilayer sheet was treated with a hot press (treated for 20 minutes at a hot plate temperature of 160° C. and a pressure of 12 MPa, and then for 90 minutes at 180° C. and a normal pressure) in the air to cure the coating film and the semi-cured film, thereby obtaining a resin sheet. The polyester films on both surfaces of the resin sheet were peeled off to obtain a multilayer sheet-cured substance (thermally conductive multilayer sheet) having an average film thickness of 200 μm.

The evaluation of thermally conductive properties was performed using each thermally conductive sheet or thermally conductive multilayer sheet which was formed of each composition. The thermal conductivity was measured by the following method, and the thermally conductive properties were evaluated according to the following standards.

(Measurement of thermal conductivity (W/m·k)) (1) By using "LFA 467" manufactured by NETZSCH, the thermal diffusivity of the thermally conductive sheet in a thickness direction was measured through a laser flash method.

(2) By using a balance "XS204" manufactured by METTLER TOLEDO, the specific gravity of the thermally conductive sheet or thermally conductive multilayer sheet was measured through an Archimedes method ("solid specific gravity measuring kit" was used).

(3) By using "DSC320/6200" manufactured by Seiko Instruments Inc., the specific heat of the thermally conductive sheet or thermally conductive multilayer sheet at 25° C. was determined under a temperature rising condition of 10° C./min.

(4) The thermal conductivity of the thermally conductive sheet or thermally conductive multilayer sheet was calculated by multiplying the obtained thermal diffusivity by the specific gravity and the specific heat.

(Evaluation Standard)

The measured thermal conductivity was classified according to the following standards, and used as the evaluation of the thermally conductive properties.

"A+": 15 W/m·K or greater
"A": 10 W/m·K or greater and less than 15 W/m·K
"B": 8 W/m·K or greater and less than 10 W/m·K
"C": 5 W/m·K or greater and less than 8 W/m·K
"D": Less than 5 W/m·K The results are shown in Table 1.

<Surface State (Smoothness) of Sheet>

A thermally conductive sheet or thermally conductive multilayer sheet was prepared in the same manner as those produced in the tests of the section of <Thermally conductive properties>, and a surface state (smoothness) of the sheet was evaluated.

Specifically, the film thickness of the thermally conductive sheet or thermally conductive multilayer sheet was measured at any five positions, a standard deviation was determined for the measurement variation thereof, and the evaluation was performed according to the following standards. In a case where the standard deviation is small (in other words, in a case where the variation in the film thickness is small), the surface state (smoothness) of the sheet can be evaluated to be favorable.

Furthermore, the expression in which the surface state (smoothness) of the sheet is favorable also indicates that the inorganic substances (in particular, the inorganic nitride) are favorably dispersed. On the other hand, in a case where the standard deviation is large (in other words, in a case where the variation in the film thickness is large), this means that aggregation or the like occurs in the cured substance to cause surface roughness, that is, indicates that the dispersibility of the inorganic substances (in particular, the inorganic nitride) is degraded.

The film thickness was measured using "AI-PHASE MOBILE 1u" manufactured by al-Phase Co., Ltd.

(Evaluation Standard)

The determined standard deviation was classified according to the following standards, and used as the evaluation of the surface state (smoothness) of the sheet.

"A": The standard deviation was smaller than 5 μm
"B": The standard deviation was 5 μm or larger and smaller than 10 μm
"C": The standard deviation was 10 μm or larger and smaller than 30 μm
"D": The standard deviation was 30 μm or larger The results are shown in Table 1.

[Results]

Table 1 below shows the kinds and addition amounts (g) of the phenolic compound, epoxy compound, inorganic substances, and surface modifier for an inorganic nitride, which are used in each composition, and the evaluation results.

In Table 1, a column of "Hydroxyl group content" indicates the hydroxyl group content (mmol/g) of the used phenolic compound.

A column of "Specific functional group" indicates the kind of the specific functional group included in the used specific compound. Moreover, in the column of "Specific functional group", the description of "Epoxy group" means the "monovalent group having an epoxy group".

In Table 1, a column of "Adhesive layer" indicates whether a test specimen (the thermally conductive sheet or the thermally conductive multilayer sheet) has an adhesive layer. The description of "None" indicates that the test specimen is a thermally conductive sheet which does not have the adhesive layer. The description of "1" indicates that the test specimen is a thermally conductive multilayer sheet having the adhesive layer formed of the adhesive layer film 1. The description of "2" indicates that the test specimen is a thermally conductive multilayer sheet having the adhesive layer formed of the adhesive layer film 2. The description of "3" indicates that the test specimen is a thermally conductive multilayer sheet having the adhesive layer formed of the adhesive layer film 3.

TABLE 1

| Table 1-1 | Characteristics of composition ||||||||||| Evaluation |||
|---|---|---|---|---|---|---|---|---|---|---|---|---|---|
| | Phenolic compound ||| Epoxy compound || Inorganic substance || Surface modifier for inorganic nitride (specific compound, or compound for comparison) ||| Adhesive layer | Thermal conductivity | Surface state |
| | Kind | Addition amount (g) | Hydroxyl group content (mmol/g) | Kind | Addition amount (g) | Mass ratio in inorganic substance | Addition amount (g) | Kind | Specific functional group | Addition amount (g) | | | |
| Example 1 | A-1 | 6.26 | 14.2 | B-1 | 16.74 | PTX-60/AA-3/AA-04 = 47/40/13 | 77 | C-1 | Hydroxyl group/Aldehyde group | 0.23 | None | A+ | A |
| Example 2 | A-1 | 4.9 | 14.2 | B-1 | 13.1 | PTX-60/AA-3/AA-04 = 47/40/13 | 82 | C-1 | Hydroxyl group/Aldehyde group | 0.25 | None | A+ | A |
| Example 3 | A-1 | 3.54 | 14.2 | B-1 | 9.46 | PTX-60/AA-3/AA-04 = 47/40/13 | 87 | C-1 | Hydroxyl group/Aldehyde group | 0.26 | None | A+ | B |
| Example 4 | A-1 | 6.26 | 14.2 | B-1 | 16.74 | PTX-60/AA-3/AA-04 = 47/40/13 | 77 | C-1 | Hydroxyl group/Aldehyde group | 0.023 | None | A+ | A |
| Example 5 | A-1 | 6.26 | 14.2 | B-1 | 6.74 | PTX-60/AA-3/AA-04 = 47/40/13 | 77 | C-1 | Hydroxyl group/Aldehyde group | 0.077 | None | A | A |
| Example 6 | A-1 | 6.26 | 14.2 | B-1 | 16.74 | PTX-60/AA-3/AA-04 = 47/40/13 | 77 | C-1 | Hydroxyl group/Aldehyde group | 0.46 | None | A+ | A |
| Example 7 | A-1 | 6.26 | 14.2 | B-1 | 16.74 | Only HP-40 MF100 | 77 | C-1 | Hydroxyl group/Aldehyde group | 0.23 | None | A+ | A |
| Example 8 | A-1 | 4.9 | 14.2 | B-1 | 13.1 | Only HP-40 MF100 | 82 | C-1 | Hydroxyl group/Aldehyde group | 0.25 | None | A+ | A |
| Example 9 | A-1 | 3.54 | 14.2 | B-1 | 9.46 | Only HP-40 MF100 | 87 | C-1 | Hydroxyl group/Aldehyde group | 0.26 | None | A+ | B |
| Example 10 | A-1 | 6.26 | 14.2 | B-1 | 16.74 | Only HP-40 MF100 | 77 | C-1 | Hydroxyl group/Aldehyde group | 0.023 | None | A+ | A |
| Example 11 | A-1 | 6.26 | 14.2 | B-1 | 16.74 | Only HP-40 MF100 | 77 | C-1 | Hydroxyl group/Aldehyde group | 0.077 | None | A | A |
| Example 12 | A-1 | 6.26 | 14.2 | B-1 | 16.74 | Only HP-40 MF100 | 77 | C-1 | Hydroxyl group/Aldehyde group | 0.46 | None | A+ | A |
| Example 13 | A-1 | 6.26 | 14.2 | B-1 | 16.74 | Only HP-40 MF100 | 77 | C-2 | Hydroxyl group/Aldehyde group | 0.23 | None | A+ | A |
| Example 14 | A-1 | 6.26 | 14.2 | B-1 | 16.74 | Only HP-40 MF100 | 77 | C-3 | Hydroxyl group/Boronic acid group | 0.23 | None | A+ | A |
| Example 15 | A-1 | 6.26 | 14.2 | B-1 | 16.74 | Only HP-40 MF100 | 77 | C-4 | Hydroxyl group/Aldehyde group | 0.23 | None | A+ | A |
| Example 16 | A-1 | 6.26 | 14.2 | B-1 | 16.74 | Only HP-40 MF100 | 77 | C-5 | Hydroxyl group/Boronic acid group | 0.23 | None | A+ | A |
| Example 17 | A-1 | 6.26 | 14.2 | B-1 | 16.74 | Only HP-40 MF100 | 77 | C-6 | Hydroxyl group/Aldehyde group | 0.23 | None | A+ | A |
| Example 18 | A-1 | 6.26 | 14.2 | B-1 | 16.74 | Only HP-40 MF100 | 77 | C-7 | Hydroxyl group/Aldehyde group | 0.23 | None | A+ | A |
| Example 19 | A-1 | 6.26 | 14.2 | B-1 | 16.74 | Only HP-40 MF100 | 77 | C-8 | Hydroxyl group/Aldehyde group | 0.23 | None | A+ | A |
| Example 20 | A-1 | 6.26 | 14.2 | B-1 | 16.74 | Only HP-40 MF100 | 77 | C-9 | Hydroxyl group/Boronic acid group | 0.23 | None | A+ | A |
| Example 21 | A-1 | 6.26 | 14.2 | B-1 | 16.74 | Only HP-40 MF100 | 77 | C-10 | Hydroxyl group/Aldehyde group | 0.23 | None | A+ | A |
| Example 22 | A-1 | 6.26 | 14.2 | B-1 | 16.74 | Only HP-40 MF100 | 77 | C-11 | Hydroxyl group/Aldehyde group | 0.23 | None | A+ | A |
| Example 23 | A-1 | 6.26 | 14.2 | B-1 | 16.74 | Only HP-40 MF100 | 77 | C-12 | Hydroxyl group/Aldehyde group | 0.23 | None | A+ | A |
| Example 24 | A-1 | 6.26 | 14.2 | B-1 | 16.74 | Only HP-40 MF100 | 77 | C-13 | Hydroxyl group/Boronic acid group | 0.23 | None | A | A |
| Example 25 | A-1 | 6.26 | 14.2 | B-1 | 16.74 | Only HP-40 MF100 | 77 | C-14 | Hydroxyl group | 0.23 | None | A | A |
| Example 26 | A-1 | 6.26 | 14.2 | B-1 | 16.74 | Only HP-40 MF100 | 77 | C-15 | Hydroxyl group | 0.23 | None | A | A |
| Example 27 | A-1 | 6.26 | 14.2 | B-1 | 16.74 | Only HP-40 MF100 | 77 | C-16 | Hydroxyl group | 0.23 | None | A | A |
| Example 28 | A-1 | 6.26 | 14.2 | B-1 | 16.74 | Only HP-40 MF100 | 77 | C-17 | Hydroxyl group | 0.23 | None | A | A |
| Example 29 | A-1 | 6.26 | 14.2 | B-1 | 16.74 | Only HP-40 MF100 | 77 | C-18 | Epoxy group | 0.23 | None | A | A |
| Example 30 | A-1 | 6.26 | 14.2 | B-1 | 16.74 | Only HP-40 MF100 | 77 | C-19 | Epoxy group | 0.23 | None | A | A |
| Example 31 | A-1 | 6.26 | 14.2 | B-1 | 16.74 | Only HP-40 MF100 | 77 | C-20 | Epoxy group | 0.23 | None | A | A |
| Example 32 | A-1 | 6.26 | 14.2 | B-1 | 16.74 | Only HP-40 MF100 | 77 | C-21 | Epoxy group | 0.23 | None | A | A |
| Example 33 | A-1 | 6.26 | 14.2 | B-1 | 16.74 | Only HP-40 MF100 | 77 | C-22 | Hydroxyl group | 0.23 | None | A | A |
| Example 34 | A-1 | 3.95 | 14.2 | B-1 | 16.74 | Only HP-40 MF100 | 77 | C-14 | Hydroxyl group | 2.31 | None | A+ | A |
| Example 35 | A-1 | 3.95 | 14.2 | B-1 | 16.74 | Only HP-40 MF100 | 77 | C-15 | Hydroxyl group | 2.31 | None | A+ | A |

TABLE 1-continued

| | Characteristics of composition | | | | | | | | Surface modifier for inorganic nitride (specific compound, or compound for comparison) | | | | Evaluation | |
|---|---|---|---|---|---|---|---|---|---|---|---|---|---|---|
| | Phenolic compound | | | Epoxy compound | | Inorganic substance | | | | | | | | |
| Table 1-1 | Kind | Addition amount (g) | Hydroxyl group content (mmol/g) | Kind | Addition amount (g) | Mass ratio in inorganic substance | Addition amount (g) | Kind | Specific functional group | Addition amount (g) | Adhesive layer | Thermal conductivity | Surface state |
| Example 36 | A-1 | 3.95 | 14.2 | B-1 | 16.74 | Only HP-40 MF100 | 77 | C-16 | Hydroxyl group | 2.31 | None | A+ | A |
| Example 37 | A-1 | 3.95 | 14.2 | B-1 | 16.74 | Only HP-40 MF100 | 77 | C-17 | Hydroxyl group | 2.31 | None | A+ | A |
| Example 38 | A-1 | 6.26 | 14.2 | B-1 | 14.43 | Only HP-40 MF100 | 77 | C-18 | Epoxy group | 2.31 | None | A+ | A |
| Example 39 | A-1 | 6.26 | 14.2 | B-1 | 14.43 | Only HP-40 MF100 | 77 | C-19 | Epoxy group | 2.31 | None | A+ | A |
| Example 40 | A-1 | 6.26 | 14.2 | B-1 | 14.43 | Only HP-40 MF100 | 77 | C-20 | Epoxy group | 2.31 | None | A+ | A |
| Example 41 | A-1 | 3.95 | 14.2 | B-1 | 16.74 | Only HP-40 MF100 | 77 | C-21 | Hydroxyl group | 2.31 | None | A+ | A |
| Example 42 | — | — | — | B-1 | 14.14 | Only HP-40 MF100 | 77 | C-22 | Hydroxyl group | 8.85 | None | A+ | A |
| Example 43 | — | — | — | B-1 | 14.14 | Only HP-40 MF100 | 77 | C-14 | Hydroxyl group | 8.85 | None | A+ | A |
| Example 44 | — | — | — | B-1 | 13.48 | Only HP-40 MF100 | 77 | C-15 | Hydroxyl group | 9.51 | None | A+ | A |
| Example 45 | — | — | — | B-1 | 13.48 | Only HP-40 MF100 | 77 | C-16 | Hydroxyl group | 9.51 | None | A+ | A |
| Example 46 | — | — | — | B-1 | 16.49 | Only HP-40 MF100 | 77 | C-17 | Hydroxyl group | 6.51 | None | A+ | A |
| Example 47 | — | — | — | B-1 | 12.69 | Only HP-40 MF100 | 77 | C-22 | Hydroxyl group | 10.31 | None | A+ | A |
| Example 48 | — | — | — | B-2 | 16.49 | Only HP-40 MF100 | 77 | C-16 | Hydroxyl group | 6.51 | None | A+ | A |
| Example 49 | — | — | — | B-2 | 15.81 | Only HP-40 MF100 | 77 | C-22 | Hydroxyl group | 7.19 | None | A+ | A |
| Example 50 | — | — | — | B-3 | 10.72 | Only HP-40 MF100 | 77 | C-16 | Hydroxyl group | 12.28 | None | A+ | A |

TABLE 2

| | Characteristics of composition | | | | | | | | | | | Evaluation | |
|---|---|---|---|---|---|---|---|---|---|---|---|---|---|
| | Phenolic compound | | | Epoxy compound | | Inorganic substance | | Surface modifier for inorganic nitride (specific compound, or compound for comparison) | | | | | |
| Table 1-2 | Kind | Addition amount (g) | Hydroxyl group content (mmol/g) | Kind | Addition amount (g) | Mass ratio in inorganic substance | Addition amount (g) | Kind | Specific functional group | Addition amount (g) | Adhesive layer | Thermal conductivity | Surface state |
| Example 51 | — | — | — | B-3 | 14.02 | Only HP-40 MF100 | 77 | C-22 | Hydroxyl group | 8.98 | None | A+ | A |
| Example 52 | — | — | — | B-4 | 11.71 | Only HP-40 MF100 | 77 | C-16 | Hydroxyl group | 11.29 | None | A+ | A |
| Example 53 | — | — | — | B-4 | 14.94 | Only HP-40 MF100 | 77 | C-22 | Hydroxyl group | 8.06 | None | A+ | A |
| Example 54 | A-1 | 6.63 | 14.2 | — | — | Only HP-40 MF100 | 77 | C-18 | Epoxy group | 16.36 | None | A+ | A |
| Example 55 | A-1 | 6.63 | 14.2 | — | — | Only HP-40 MF100 | 77 | C-19 | Epoxy group | 16.36 | None | A+ | A |
| Example 56 | A-1 | 6.26 | 14.2 | — | — | Only HP-40 MF100 | 77 | C-20 | Epoxy group | 16.74 | None | A+ | A |
| Example 57 | A-1 | 6.26 | 14.2 | — | — | Only HP-40 MF100 | 77 | C-21 | Epoxy group | 16.74 | None | A+ | A |
| Example 58 | A-2 | 8.86 | 8.4 | — | — | Only HP-40 MF100 | 77 | C-20 | Epoxy group | 14.14 | None | A+ | A |
| Example 59 | A-3 | 4.16 | 23.8 | — | — | Only HP-40 MF100 | 77 | C-20 | Epoxy group | 18.84 | None | A+ | A |
| Example 60 | A-1 | 6.92 | 14.2 | B-2 | 16.08 | Only HP-40 MF100 | 77 | C-1 | Hydroxyl group/ Aldehyde group | 0.23 | None | A+ | A |
| Example 61 | A-1 | 6.92 | 14.2 | B-2 | 16.08 | Only HP-40 MF100 | 77 | C-10 | Hydroxyl group/ Aldehyde group | 0.23 | None | A+ | A |
| Example 62 | A-1 | 6.92 | 14.2 | B-2 | 13.77 | Only HP-40 MF100 | 77 | C-20 | Epoxy group | 2.31 | None | A+ | A |
| Example 63 | A-1 | 8.69 | 14.2 | B-3 | 14.31 | Only HP-40 MF100 | 77 | C-1 | Hydroxyl group/ Aldehyde group | 0.23 | None | A+ | A |
| Example 64 | A-1 | 8.69 | 14.2 | B-3 | 14.31 | Only HP-40 MF100 | 77 | C-10 | Hydroxyl group/ Aldehyde group | 0.23 | None | A+ | A |
| Example 65 | A-1 | 8.69 | 14.2 | B-3 | 9.09 | Only HP-40 MF100 | 77 | C-20 | Epoxy group | 2.31 | None | A+ | A |
| Example 66 | A-1 | 7.78 | 14.2 | B-4 | 15.22 | Only HP-40 MF100 | 77 | C-1 | Hydroxyl group/ Aldehyde group | 0.23 | None | A+ | A |
| Example 67 | A-1 | 7.78 | 14.2 | B-4 | 15.22 | Only HP-40 MF100 | 77 | C-10 | Hydroxyl group/ Aldehyde group | 0.23 | None | A+ | A |
| Example 68 | A-1 | 7.78 | 14.2 | B-4 | 12.91 | Only HP-40 MF100 | 77 | C-20 | Epoxy group | 2.31 | None | A+ | A |
| Example 69 | A-2 | 8.86 | 8.4 | B-1 | 14.14 | Only HP-40 MF100 | 77 | C-1 | Hydroxyl group/ Aldehyde group | 0.23 | None | A+ | A |
| Example 70 | A-2 | 8.86 | 8.4 | B-1 | 14.14 | Only HP-40 MF100 | 77 | C-10 | Hydroxyl group/ Aldehyde group | 0.23 | None | A+ | A |
| Example 71 | A-2 | 8.86 | 8.4 | B-1 | 11.83 | Only HP-40 MF100 | 77 | C-20 | Epoxy group | 2.31 | None | A+ | A |
| Example 72 | A-2 | 9.64 | 8.4 | B-2 | 13.36 | Only HP-40 MF100 | 77 | C-1 | Hydroxyl group/ Aldehyde group | 0.23 | None | A+ | A |
| Example 73 | A-2 | 9.64 | 8.4 | B-2 | 13.36 | Only HP-40 MF100 | 77 | C-10 | Hydroxyl group/ Aldehyde group | 0.23 | None | A+ | A |
| Example 74 | A-2 | 9.64 | 8.4 | B-2 | 11.05 | Only HP-40 MF100 | 77 | C-20 | Epoxy group | 2.31 | None | A+ | A |
| Example 75 | A-2 | 11.6 | 8.4 | B-3 | 11.4 | Only HP-40 MF100 | 77 | C-1 | Hydroxyl group/ Aldehyde group | 0.23 | None | A+ | A |
| Example 76 | A-2 | 11.6 | 8.4 | B-3 | 11.4 | Only HP-40 MF100 | 77 | C-10 | Hydroxyl group/ Aldehyde group | 0.23 | None | A+ | A |
| Example 77 | A-2 | 11.6 | 8.4 | B-3 | 9.09 | Only HP-40 MF100 | 77 | C-20 | Epoxy group | 2.31 | None | A+ | A |
| Example 78 | A-2 | 10.61 | 8.4 | B-4 | 12.39 | Only HP-40 MF100 | 77 | C-1 | Hydroxyl group/ Aldehyde group | 0.23 | None | A+ | A |
| Example 79 | A-2 | 10.61 | 8.4 | B-4 | 12.39 | Only HP-40 MF100 | 77 | C-10 | Hydroxyl group/ Aldehyde group | 0.23 | None | A+ | A |
| Example 80 | A-2 | 10.61 | 8.4 | B-4 | 10.08 | Only HP-40 MF100 | 77 | C-20 | Epoxy group | 2.31 | None | A+ | A |
| Example 81 | A-3 | 4.16 | 23.8 | B-1 | 18.84 | Only HP-40 MF100 | 77 | C-1 | Hydroxyl group/ Aldehyde group | 0.23 | None | A+ | A |
| Example 82 | A-3 | 4.16 | 23.8 | B-1 | 18.84 | Only HP-40 MF100 | 77 | C-10 | Hydroxyl group/ Aldehyde group | 0.23 | None | A+ | A |
| Example 83 | A-3 | 4.16 | 23.8 | B-1 | 16.53 | Only HP-40 MF100 | 77 | C-20 | Epoxy group | 2.31 | None | A+ | A |
| Example 84 | A-3 | 4.67 | 23.8 | B-2 | 18.33 | Only HP-40 MF100 | 77 | C-1 | Hydroxyl group/ Aldehyde group | 0.23 | None | A+ | A |
| Example 85 | A-3 | 4.67 | 23.8 | B-2 | 18.33 | Only HP-40 MF100 | 77 | C-10 | Hydroxyl group/ Aldehyde group | 0.23 | None | A+ | A |
| Example 36 | A-3 | 4.67 | 23.8 | B-2 | 16.02 | Only HP-40 MF100 | 77 | C-20 | Epoxy group | 2.31 | None | A+ | A |
| Example 87 | A-3 | 6.08 | 23.8 | B-3 | 16.92 | Only HP-40 MF100 | 77 | C-1 | Hydroxyl group/ Aldehyde group | 0.23 | None | A+ | A |
| Example 88 | A-3 | 6.08 | 23.8 | B-3 | 16.92 | Only HP-40 MF100 | 77 | C-10 | Hydroxyl group/ Aldehyde group | 0.23 | None | A+ | A |
| Example 89 | A-3 | 6.08 | 23.8 | B-3 | 14.61 | Only HP-40 MF100 | 77 | C-20 | Epoxy group | 2.31 | None | A+ | A |
| Example 90 | A-3 | 5.34 | 23.8 | B-4 | 17.66 | Only HP-40 MF100 | 77 | C-1 | Hydroxyl group/ Aldehyde group | 0.23 | None | A+ | A |
| Example 91 | A-3 | 5.34 | 23.8 | B-4 | 17.66 | Only HP-40 MF100 | 77 | C-10 | Hydroxyl group/ Aldehyde group | 0.23 | None | A+ | A |
| Example 92 | A-3 | 5.34 | 23.8 | B-4 | 15.35 | Only HP-40 MF100 | 77 | C-20 | Epoxy group | 2.31 | None | A+ | A |
| Example 93 | A-4 | 13.85 | 3.7 | B-1 | 9.14 | Only HP-40 MF100 | 77 | C-1 | Hydroxyl group/ Aldehyde group | 0.23 | None | A | A |
| Example 94 | A-4 | 13.85 | 3.7 | B-1 | 9.14 | Only HP-40 MF100 | 77 | C-10 | Hydroxyl group/ Aldehyde group | 0.23 | None | A | A |
| Example 95 | A-4 | 13.85 | 3.7 | B-1 | 6.83 | Only HP-40 MF100 | 77 | C-20 | Epoxy group | 2.31 | None | A | A |

TABLE 2-continued

<table>
<tr><th rowspan="3">Table 1-2</th><th colspan="12">Characteristics of composition</th><th colspan="2" rowspan="2">Evaluation</th></tr>
<tr><th colspan="3">Phenolic compound</th><th colspan="2">Epoxy compound</th><th colspan="2">Inorganic substance</th><th colspan="3">Surface modifier for inorganic nitride (specific compound, or compound for comparison)</th><th rowspan="2">Adhesive layer</th></tr>
<tr><th>Kind</th><th>Addition amount (g)</th><th>Hydroxyl group content (mmol/g)</th><th>Kind</th><th>Addition amount (g)</th><th>Mass ratio in inorganic substance</th><th>Addition amount (g)</th><th>Kind</th><th>Specific functional group</th><th>Addition amount (g)</th><th>Thermal conductivity</th><th>Surface state</th></tr>
<tr><td>Example 96</td><td>A-4</td><td>14.62</td><td>3.7</td><td>B-2</td><td>8.37</td><td>Only HP-40 MF100</td><td>77</td><td>C-1</td><td>Hydroxyl group/ Aldehyde group</td><td>0.23</td><td>None</td><td>A</td><td>A</td></tr>
<tr><td>Example 97</td><td>A-4</td><td>14.62</td><td>3.7</td><td>B-2</td><td>8.37</td><td>Only HP-40 MF100</td><td>77</td><td>C-10</td><td>Hydroxyl group/ Aldehyde group</td><td>0.23</td><td>None</td><td>A</td><td>A</td></tr>
<tr><td>Example 98</td><td>A-4</td><td>14.62</td><td>3.7</td><td>B-2</td><td>6.06</td><td>Only HP-40 MF100</td><td>77</td><td>C-20</td><td>Epoxy group</td><td>2.31</td><td>None</td><td>A</td><td>A</td></tr>
<tr><td>Example 99</td><td>A-4</td><td>16.35</td><td>3.7</td><td>B-3</td><td>6.64</td><td>Only HP-40 MF100</td><td>77</td><td>C-1</td><td>Hydroxyl group/ Aldehyde group</td><td>0.23</td><td>None</td><td>A</td><td>A</td></tr>
<tr><td>Example 100</td><td>A-4</td><td>16.35</td><td>3.7</td><td>B-3</td><td>6.64</td><td>Only HP-40 MF100</td><td>77</td><td>C-10</td><td>Hydroxyl group/ Aldehyde group</td><td>0.23</td><td>None</td><td>A</td><td>A</td></tr>
</table>

TABLE 3

<table>
<tr><th rowspan="3">Table 1-3</th><th colspan="12">Characteristics of composition</th><th colspan="2" rowspan="2">Evaluation</th></tr>
<tr><th colspan="3">Phenolic compound</th><th colspan="2">Epoxy compound</th><th colspan="2">Inorganic substance</th><th colspan="3">Surface modifier for inorganic nitride (specific compound, or compound for comparison)</th><th rowspan="2">Adhesive layer</th></tr>
<tr><th>Kind</th><th>Addition amount (g)</th><th>Hydroxyl group content (mmol/g)</th><th>Kind</th><th>Addition amount (g)</th><th>Mass ratio in inorganic substance</th><th>Addition amount (g)</th><th>Kind</th><th>Specific functional group</th><th>Addition amount (g)</th><th>Thermal conductivity</th><th>Surface state</th></tr>
<tr><td>Example 101</td><td>A-4</td><td>16.35</td><td>3.7</td><td>B-3</td><td>4.33</td><td>Only HP-40 MF100</td><td>77</td><td>C-20</td><td>Epoxy group</td><td>2.31</td><td>None</td><td>A</td><td>A</td></tr>
<tr><td>Example 102</td><td>A-4</td><td>15.51</td><td>3.7</td><td>B-4</td><td>7.49</td><td>Only HP-40 MF100</td><td>77</td><td>C-1</td><td>Hydroxyl group/ Aldehyde group</td><td>0.23</td><td>None</td><td>A</td><td>A</td></tr>
<tr><td>Example 103</td><td>A-4</td><td>15.51</td><td>3.7</td><td>B-4</td><td>7.49</td><td>Only HP-40 MF100</td><td>77</td><td>C-10</td><td>Hydroxyl group/ Aldehyde group</td><td>0.23</td><td>None</td><td>A</td><td>A</td></tr>
<tr><td>Example 104</td><td>A-4</td><td>15.51</td><td>3.7</td><td>B-4</td><td>5.18</td><td>Only HP-40 MF100</td><td>77</td><td>C-20</td><td>Epoxy group</td><td>2.31</td><td>None</td><td>A</td><td>A</td></tr>
<tr><td>Example 105</td><td>—</td><td>—</td><td>—</td><td>B-3</td><td>10.72</td><td>Only HP-40 MF100</td><td>77</td><td>C-17</td><td>Hydroxyl group</td><td>12.28</td><td>None</td><td>A+</td><td>A</td></tr>
<tr><td>Example 106</td><td>—</td><td>—</td><td>—</td><td>B-3</td><td>10.72</td><td>Only HP-40 MF100</td><td>77</td><td>C-17</td><td>Hydroxyl group</td><td>12.28</td><td>1</td><td>A</td><td>A</td></tr>
<tr><td>Example 107</td><td>—</td><td>—</td><td>—</td><td>B-3</td><td>10.72</td><td>Only HP-40 MF100</td><td>77</td><td>C-17</td><td>Hydroxyl group</td><td>12.28</td><td>2</td><td>A</td><td>A</td></tr>
<tr><td>Example 108</td><td>—</td><td>—</td><td>—</td><td>B-3</td><td>10.72</td><td>Only HP-40 MF100</td><td>77</td><td>C-17</td><td>Hydroxyl group</td><td>12.28</td><td>3</td><td>A</td><td>A</td></tr>
<tr><td>Example 109</td><td>—</td><td>—</td><td>—</td><td>B-3</td><td>10.72</td><td>HP-40 MF100/AA-3/ AA-04 = 84/11/5</td><td>77</td><td>C-17</td><td>Hydroxyl group</td><td>12.28</td><td>None</td><td>A+</td><td>A</td></tr>
<tr><td>Example 110</td><td>—</td><td>—</td><td>—</td><td>B-3</td><td>10.72</td><td>HP-40 MF100/AA-3/ AA-04 = 77/16/7</td><td>77</td><td>C-17</td><td>Hydroxyl group</td><td>12.28</td><td>None</td><td>A+</td><td>A</td></tr>
<tr><td>Example 111</td><td>—</td><td>—</td><td>—</td><td>B-3</td><td>10.72</td><td>HP-40 MF100/AA-3/ AA-04 = 77/16/7</td><td>77</td><td>C-17</td><td>Hydroxyl group</td><td>12.28</td><td>2</td><td>A</td><td>A</td></tr>
<tr><td>Example 112</td><td>—</td><td>—</td><td>—</td><td>B-3</td><td>10.72</td><td>HP-40 MF100/AA-3/ AA-04 = 77/16/7</td><td>77</td><td>C-17</td><td>Hydroxyl group</td><td>12.28</td><td>3</td><td>A</td><td>A</td></tr>
<tr><td>Example 113</td><td>—</td><td>—</td><td>—</td><td>B-3</td><td>10.72</td><td>HP-40 MF100/AA-3/ AA-04 = 70/21/9</td><td>77</td><td>C-17</td><td>Hydroxyl group</td><td>12.28</td><td>None</td><td>A+</td><td>A</td></tr>
<tr><td>Example 114</td><td>—</td><td>—</td><td>—</td><td>B-3</td><td>10.72</td><td>HP-40 MF100/AA-3/ AA-04 = 58/29/13</td><td>77</td><td>C-17</td><td>Hydroxyl group</td><td>12.28</td><td>None</td><td>A+</td><td>A</td></tr>
<tr><td>Example 115</td><td>—</td><td>—</td><td>—</td><td>B-3</td><td>10.72</td><td>HP-40 MF100/ SP-3 = 99/1</td><td>77</td><td>C-17</td><td>Hydroxyl group</td><td>12.28</td><td>None</td><td>A+</td><td>A</td></tr>
<tr><td>Example 116</td><td>—</td><td>—</td><td>—</td><td>B-3</td><td>10.72</td><td>HP-40 MF100/ SP-3 = 95/5</td><td>77</td><td>C-17</td><td>Hydroxyl group</td><td>12.28</td><td>None</td><td>A+</td><td>A</td></tr>
<tr><td>Example 117</td><td>—</td><td>—</td><td>—</td><td>B-3</td><td>10.72</td><td>HP-40 MF100/ SP-3 = 95/5</td><td>77</td><td>C-17</td><td>Hydroxyl group</td><td>12.28</td><td>2</td><td>A</td><td>A</td></tr>
<tr><td>Example 118</td><td>—</td><td>—</td><td>—</td><td>B-3</td><td>10.72</td><td>HP-40 MF100/ SP-3 = 95/5</td><td>77</td><td>C-17</td><td>Hydroxyl group</td><td>12.28</td><td>3</td><td>A</td><td>A</td></tr>
<tr><td>Example 119</td><td>—</td><td>—</td><td>—</td><td>B-3</td><td>10.72</td><td>HP-40 MF100/ SP-3 = 90/10</td><td>77</td><td>C-17</td><td>Hydroxyl group</td><td>12.28</td><td>None</td><td>A+</td><td>A</td></tr>
<tr><td>Example 120</td><td>—</td><td>—</td><td>—</td><td>B-3</td><td>10.72</td><td>HP-40 MF100/ SP-3 = 85/15</td><td>77</td><td>C-17</td><td>Hydroxyl group</td><td>12.28</td><td>None</td><td>A+</td><td>A</td></tr>
<tr><td>Example 121</td><td>—</td><td>—</td><td>—</td><td>B-3</td><td>8.91</td><td>Only HP-40 MF100</td><td>77</td><td>C-23</td><td>Hydroxyl group</td><td>14.09</td><td>None</td><td>A+</td><td>A</td></tr>
<tr><td>Example 122</td><td>—</td><td>—</td><td>—</td><td>B-3</td><td>8.94</td><td>Only HP-40 MF100</td><td>77</td><td>C-24</td><td>Hydroxyl group</td><td>14.06</td><td>None</td><td>A+</td><td>A</td></tr>
<tr><td>Example 123</td><td>—</td><td>—</td><td>—</td><td>B-3</td><td>8.94</td><td>Only HP-40 MF100</td><td>77</td><td>C-25</td><td>Hydroxyl group</td><td>14.06</td><td>None</td><td>A+</td><td>A</td></tr>
<tr><td>Example 124</td><td>—</td><td>—</td><td>—</td><td>B-2</td><td>12.69</td><td>Only HP-40 MF100</td><td>77</td><td>C-17</td><td>Hydroxyl group</td><td>10.31</td><td>None</td><td>A+</td><td>A</td></tr>
<tr><td>Example 125</td><td>—</td><td>—</td><td>—</td><td>B-3</td><td>8.91</td><td>HP-40 MF100/AA-3/ AA-04 = 77/16/7</td><td>77</td><td>C-23</td><td>Hydroxyl group</td><td>14.09</td><td>None</td><td>A+</td><td>A</td></tr>
<tr><td>Example 126</td><td>—</td><td>—</td><td>—</td><td>B-3</td><td>8.94</td><td>HP-40 MF100/AA-3/ AA-04 = 77/16/7</td><td>77</td><td>C-24</td><td>Hydroxyl group</td><td>14.06</td><td>None</td><td>A+</td><td>A</td></tr>
</table>

TABLE 3-continued

| Table 1-3 | Phenolic compound Kind | Phenolic compound Addition amount (g) | Phenolic compound Hydroxyl group content (mmol/g) | Epoxy compound Kind | Epoxy compound Addition amount (g) | Inorganic substance Mass ratio in inorganic substance | Inorganic substance Addition amount (g) | Surface modifier Kind | Surface modifier Specific functional group | Surface modifier Addition amount (g) | Adhesive layer | Thermal conductivity | Surface state |
|---|---|---|---|---|---|---|---|---|---|---|---|---|---|
| Example 127 | — | — | — | B-3 | 8.94 | HP-40 MF100/AA-3/AA-04 = 77/16/7 | 77 | C-25 | Hydroxyl group | 14.06 | None | A+ | A |
| Example 128 | — | — | — | B-1 | 13.48 | HP-40 MF100/AA-3/AA-04 = 77/16/7 | 77 | C-17 | Hydroxyl group | 9.51 | None | A+ | A |
| Example 129 | — | — | — | B-2 | 12.69 | HP-40 MF100/AA-3/AA-04 = 77/16/7 | 77 | C-17 | Hydroxyl group | 10.31 | None | A+ | A |
| Comparative Example 1 | A-4 | 14.62 | 3.7 | B-2 | 8.37 | Only HP-40 MF100 | 77 | None | — | 0 | None | D | D |
| Comparative Example 2 | A-4 | 14.62 | 3.7 | B-2 | 8.37 | Only HP-40 MF100 | 77 | D-1 | — | 0.23 | None | D | D |
| Comparative Example 3 | A-4 | 14.62 | 3.7 | B-2 | 8.37 | Only HP-40 MF100 | 77 | D-2 | — | 0.23 | None | D | D |
| Comparative Example 4 | A-4 | 14.62 | 3.7 | B-2 | 8.37 | Only HP-40 MF100 | 77 | D-3 | — | 0.23 | None | D | D |
| Comparative Example 5 | A-4 | 14.62 | 3.7 | B-2 | 8.37 | Only HP-40 MF100 | 77 | D-4 | — | 0.23 | None | C | B |
| Comparative Example 6 | A-4 | 14.62 | 3.7 | B-2 | 8.37 | Only HP-40 MF100 | 77 | D-5 | — | 0.23 | None | C | B |

From the results shown in the tables, it was confirmed that a thermally conductive material having excellent thermally conductive properties can be obtained by using the composition according to the embodiment of the present invention. Moreover, it was confirmed that the surface state of the thermally conductive sheet formed of the composition is also favorable.

It was confirmed that in a case where the composition contains a phenolic compound having a hydroxyl group content of 8.0 mmol/g or greater, the thermally conductive properties of the obtained thermally conductive material are superior (comparison between Examples 93 to 104 and Examples 69 to 80, and the like).

It was confirmed that in a case where the content of the inorganic substance contained in the composition is 85% by mass or less with respect to the solid content of the composition, the surface state of the obtained thermally conductive sheet is superior (comparison between Example 3 and Example 2, comparison between Example 9 and Example 8, and the like).

It was confirmed that in a case where the specific compound contains at least one of an aldehyde group or a boronic acid group, and a hydroxyl group under a condition where the composition contains both the phenolic compound and the epoxy compound, the thermally conductive properties of the obtained thermally conductive material are superior (comparison between Examples 25 to 32 and Examples 7 and 13 to 24, and the like).

It was confirmed that in a case where the content of the specific compound is 0.05% by mass or greater with respect to total solid content, the thermally conductive properties of the obtained thermally conductive material are superior (comparison between Example 4 and Example 5, comparison between Example 10 and Example 11, and the like).

It was confirmed that in a case where the content of the specific compound is 0.5% by mass or greater with respect to the content of the inorganic nitride under a condition where the specific compound is the "compound having only a monovalent group having an epoxy group as the specific functional group" or the "compound having only a hydroxyl group as the specific functional group", the thermally conductive properties of the obtained thermally conductive material are superior (comparison between Examples 25 to 33 and Examples 34 to 41, and the like).

What is claimed is:

1. A composition comprising:
an inorganic nitride,
a compound represented by General Formula (I),
an epoxy compound, and
a phenolic compound,
wherein a hydroxyl group content of the phenolic compound is 8.0 mmol/g or greater, the hydroxyl group content being the number of hydroxyl groups contained in 1 g of the phenolic compound, and
the phenolic compound is one or more kinds selected from the group consisting of compounds represented by General Formula (P1) or compounds represented by General Formula (P2),

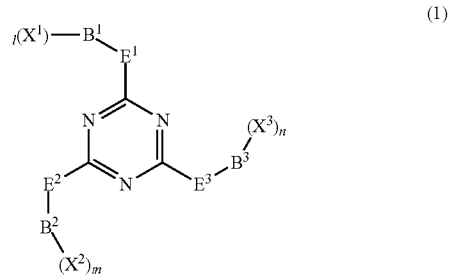

(1)

in General Formula (1),
$E^1$ to $E^3$ each independently represents a single bond, —NH—, or —NR—, R represents a substituent,
$B^1$ to $B^3$ each independently represents an aromatic ring group which may have a substituent and has 6 or more carbon atoms as ring member atoms, l, m, and n each independently represents an integer of U or greater, in a case where l is 2 or greater, l pieces of $X^1$'s may be the same as or different from each other, in a case where m is 2 or greater, m pieces of $X^2$'s may be the none as or different from each other, in a case where n is 2 or greater, n pieces of $X^3$'s may be the same as or different from each other, a total of l, m, and n is 2 or greater, and $X^1$ to $X^3$ each independently represents a group represented by General Formula (2);

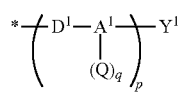
(2)

in General Formula (2), * represents a bonding position, $D^1$ represents a single bond or a divalent linking group, $A^1$ represents an aromatic ring group which may have a substituent and has 6 or more carbon atoms as ring member atoms, or a cycloalkane ring group which may have a substituent and has 6 or more carbon atoms as ring member atoms, Q and $Y^1$ each independently represents a specific functional group selected from the group consisting of an aldehyde group, a boronic acid group, a hydroxyl group, a monovalent group having an epoxy group, an amino group, a thiol group, a carboxylic acid group, a monovalent group having a carboxylic acid anhydride group, an isocyanate group, and a monovalent group having an oxetanyl group, p represents an integer of 0 or greater, and q represents an integer 0 to 2; and in General Formula (2), in a case where there are a plurality of $D^1$'s, the plurality of $D^1$'s may be the same as or different from each other, in a case where there are a plurality of $A^1$'s, the plurality of $A^1$'s may be the same as or different from each other, in a case where there are a plurality of Q's, the plurality of Q's may be the same as or different from each other, in a case where there are a plurality of $Y^1$'s, the plurality of $Y^1$'s may be the same as or different from each other, in a case where there are a plurality of p's, the plurality of p's may be the same as or different from each other, and in a case where there are a plurality of q's, the plurality of q's may be the same as or different from each other, here, in a case where l is 1 or greater and at least one $X^1$ is a hydroxyl group, an atom in $B^1$ to which $X^1$, which is a hydroxyl group, is directly bonded and an atom in $B^1$ to which $E^1$ is directly bonded are not adjacent to each other, in a case where m is 1 or greater and at least one $X^2$ is a hydroxyl group, an atom in B to which $X^2$, which is a hydroxyl group, is directly bonded and an atom in $B^2$ to which E is directly bonded are not adjacent to each other, and in a case where n is 1 or greater and at least one $X^3$ is a hydroxyl group, an atom in $B^3$ to which $X^3$, which is a hydroxyl group, is directly bonded and an atom in $B^3$ to which $E^3$ is directly bonded are not adjacent to each other,

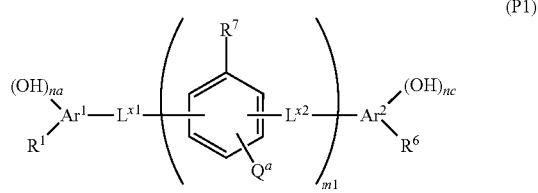
(P1)

in General Formula (P1), m1 represents an integer of 0 or greater, na and ne each independently represent an integer of 1 or greater, $R^1$ and $R^6$ each independently represent a hydrogen atom, a halogen atom, a carboxylic acid group, a boronic acid group, an aldehyde group, an alkyl group, an alkoxy group, or an alkoxycarbonyl group, $R^7$ represents a hydrogen atom or a hydroxyl group, in a case where there are a plurality of $R^7$'s, the plurality of $R^7$'s may be the same as or different from each other, $L^{x1}$ represents a single bond, —C($R^2$)($R^3$), or —CO—, $L^{x2}$ represents a single bond, —C($R^4$)($R^5$)—, or —CO—, in a case where there are a plurality of $L^{x2}$'s, the plurality of $L^{x2}$'s may be the sane as or different from each outer, $R^2$ to $R^5$ each independently represent a hydrogen atom or a substituent, in a case where there are a plurality of $R^4$'s, the plurality of $R^4$'s may be the same as or different from each other, and in a case where there area plurality of $R^5$'s, the plurality of $R^5$'s may be the same as or different from each other, $Ar^1$ and $Ar^2$ each independently represent a benzene ring group or a naphthalene ring group, and $Q^a$ represents a hydrogen atom, an alkyl group, a phenyl group, a halogen atom, a carboxylic acid group, a boronic acid group, an aldehyde group, an alkoxy group, or an alkoxycarbonyl group, in a case where there are a plurality of $Q^a$'s, the plurality of $Q^a$'s may be the same as or different from each other,

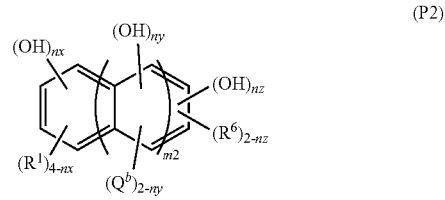
(P2)

in General Formula (P2), m2 represents an integer of 0 or greater, nx represents an integer of 0 to 4, ny represents an integer of 0 to 2, in a case where there are a plurality of ny's, the plurality of ny's may be the same as or different from each other, nz represents an integer of 0 to 2, the sum of the integers represented by nx, the ny's which can be present, and nz is at least 1, $R^1$ and $R^6$ each independently represent a hydrogen atom, a halogen atone, a carboxylic acted group, a boronic acid group, an aldehyde group, an alkyl group, an alkoxy group, or an alkoxycarbonyl group, in a case where there are a plurality of $R^1$'s, the plurality of $R^1$'s may be the same as or different from each other, and in a case where there are a plurality of $R^6$'s, the plurality of $R^6$'s may be the same as or different from each other, and $Q^b$ represents a hydrogen atom, an alkyl group, a phenyl group, a halogen atom, a carboxylic acid group, a boronic acid group, an aldehyde group, an alkoxy group, or an alkoxycarbonyl group, in a case where there are a plurality of $Q^b$'s, the plurality of $Q^b$'s may be the same as or different from each other.

2. The composition according to claim 1,
wherein Q and $Y^1$ each independently represents a group selected from the group consisting of an aldehyde group, a boronic acid group, a hydroxyl group, and a monovalent group having an epoxy group.

3. The composition according to claim 1,
wherein $E^1$ to $E^3$ each represent —NH—.

4. The composition according to claim 1,
wherein an epoxy group content of the epoxy compound is 4.0 mmol/g or greater,
the epoxy group content being the number of epoxy groups contained in 1 g of the epoxy compound.

5. The composition according to claim 1, further comprising a curing accelerator.

6. The composition according to claim 1,
wherein the inorganic nitride is boron nitride.

7. The composition according to claim 1,
wherein the composition further comprises other inorganic substances other than the inorganic nitride, and a total content of the inorganic nitride and the other inorganic substances is 70% to 85% by mass with respect to a total solid content of the composition, or
the composition does not comprise the other inorganic substances, and a content of the inorganic nitride is 70% to 85% by mass with respect to the total solid content of the composition.

8. The composition according to claim 1,
wherein $X^1$ to $X^3$ in General Formula (1) each independently has at least one of the specific functional group selected from the group consisting of an aldehyde group, a boronic acid group, and a monovalent group having an epoxy group.

9. The composition according to claim 1,
wherein the composition is a composition for forming a thermally conductive material.

10. A composition comprising:
an inorganic nitride; and
a compound represented by General Formula (1),
wherein the composition contains a phenolic compound is substantially free of an epoxy compound, and a content of the compound represented by General Formula (1) is 5% by mass or more with respect to the total solids content of the composition, and
the phenolic compound is one or more kinds selected from the group consisting of compounds represented by General Formula (P1) or compounds represented by General Formula (P2),

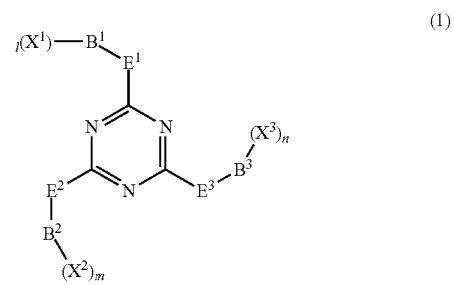

in General Formula (1),
$E^1$ to $E^3$ each independently represents a single bond, —NH—, or —NR—, R represents a substituent,
$B^1$ to $B^3$ each independently represents an aromatic ring group which may have a substituent and has 6 or more carbon atoms as ring member atoms,
l, m, and n each independently represents an integer of 0 or greater,
in a case where l is 2 or greater, l pieces of $X^1$'s may be the same as or different from each other,
in a case where m is 2 or greater, m pieces of $X^2$'s may be the same as or different from each other,
in a case where n is 2 or greater, n pieces of $X^3$'s may be the same as or different from each other,
a total of l, m, and n is 2 or greater, and
$X^1$ to $X^3$ each independently represents a group represented by General Formula (2):

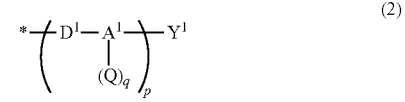

in General Formula (2), * represent, a bonding position,
$D^1$ represents a single bond or a divalent linking group,
$A^1$ represents an aromatic ring group which may have a substituent and has 6 or more carbon atoms as ring member atoms, or a cycloalkane ring group which may have a substituent and has 6 or more carbon atoms as ring member atoms,
Q and $Y^1$ each independently represents a specific functional group selected from the group consisting of an aldehyde group, a boronic acid group, a hydroxyl group, a monovalent group having an epoxy group, an amino group, a thiol group, a carboxylic acid group, a monovalent group having a carboxylic acid anhydride group, an isocyanate group, and a monovalent group having an oxetanyl group,
p represents an integer of U or greater, and
q represents an integer 0 to 2; and
in General Formula (2), in a case where there are a plurality of $D^1$'s, the plurality of $D^1$'s may be the same as or different from each other, in a case where there are a plurality of $A^1$'s, the plurality of $A^1$'s may be the same as or different from each other, in a case where there are a plurality of Q's, the plurality of Q's may be the same as or different from each other, in a case where there are a plurality of $Y^1$'s, the plurality of $Y^1$'s may be the same as or different from each other, in a case where there are a plurality of p's, the plurality of p's may be the same as or different from each other, and in a case where there are a plurality of q's, the plurality of q's may be the same as or different from each other, here, in a case where l is 1 or greater and at least one $X^1$ is a hydroxyl group, an atom in $B^1$ to which $X^1$, which is a hydroxyl group, is directly bonded and an atom in $B^1$ to which $E^1$ is directly bonded are not adjacent to each other, in a case where m is 1 or greater and at least one $X^2$ is a hydroxyl group, an atom in $B^2$ to which $X^2$, which is a hydroxyl group, is directly bonded and an atom in $B^2$ to which $E^2$ is directly bonded are not adjacent to each other, and in a case where n is 1 or greater and at least one $X^3$ is a hydroxyl group, an atom in $B^3$ to which $X^3$, which is a hydroxyl group, is directly bonded and an atom in $B^3$ to which $E^3$ is directly bonded are not adjacent to each other,

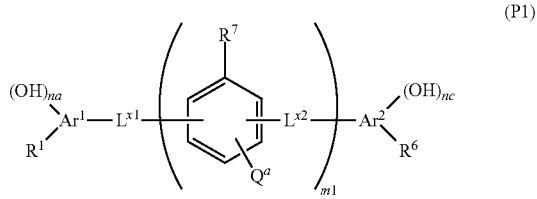

(P1)

in General Formula (P1), m1 represents an integer of 0 or greater, na and nc each independently represent an integer of 1 or greater, $R^1$ and $R^6$ each independently represent a hydrogen atom, a halogen atom, a carboxylic acid group, a boronic acid group, an aldehyde pup, an alkyl group, an alkoxy group, or an alkoxycarbonyl pup, $R^7$ represents a hydrogen atom or a hydroxyl group, in a rasp where there are a plurality of $R^7$'s, the plurality of $R^7$'s may be the same as or different from each other, $L^{x1}$ represents a single bond, $-C(R^2)(R^3)-$, or $-CO-$, $L^{x2}$ represents a single bond, $-C(R^4)(R^5)-$, or $-CO-$, in a case where there are a plurality of $L^{x2}$'s, the plurality of $L^{x2}$'s may be the same as or different from each other, $R^2$ to $R^5$ each independently represent a hydrogen atom or a substituent, in a case where there are a plurality of $R^4$'s, the plurality of $R^4$'s may be the same as or different from each other, and in a case where there are a plurality of $R^5$'s, the plurality of $R^5$'s may be the same as or different from each other, $Ar^1$ and $Ar^2$ each independently represent a benzene ring group or a naphthalene ring group, and $Q^a$ represents a hydrogen atom, an alkyl group, a phenyl group, a halogen atom, a carboxylic acid group, a boronic acid group, an aldehyde group, an alkoxy group, or an alkoxycarbonyl group, in a case where there are a plurality of $Q^a$'s, the plurality of $Q^a$'s may be the same as or different from each other,

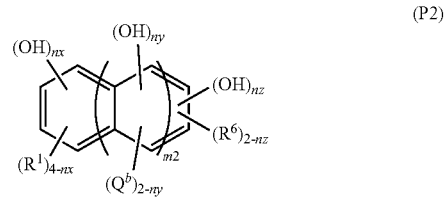

(P2)

in General Formula (P2), m2 represents an integer of 0 or greater, nx represents an integer of 0 to 4, ny represents an integer of 0 to 2, in a case where there are a plurality of ny's, the plurality of ny's may be the same as or different from each other, nz represents an integer of 0 to 2, the sum of the integers represented by nx, the ny's which can be present, and nx is at least 1, $R^1$ and $R^6$ each independently represent a hydrogen atom, a halogen atom, a carboxylic acid group, a boronic acid group, an aldehyde group, an alkyl group, an alkoxy group, or an alkoxycarbonyl group, in a case where there are a plurality of $R^1$'s, the plurality of $R^1$'s may be the same as or different from each other, and in a case where theme are a plurality of $R^6$'s, the plurality of $R^6$'s may be the same as or different from each other, and $Q^b$ represents a hydrogen atom, an alkyl group, a phenyl group, a halogen atom, a carboxylic acid group, a boronic acid group, an aldehyde group, an alkoxy group, or an alkoxycarbonyl group, in a case where there are a plurality of $Q^b$'s, the plurality of $Q^b$'s may be the same as or different from each other.

11. A thermally conductive sheet which is formed by curing the composition according to claim 1.

12. A thermally conductive multilayer sheet comprising: the thermally conductive sheet according to claim 11; and an adhesive layer or a pressure sensitive adhesive layer which is provided on one surface or both surfaces of the thermally conductive sheet.

* * * * *